US012791616B2

(12) United States Patent
Osada et al.

(10) Patent No.: US 12,791,616 B2
(45) Date of Patent: Nov. 10, 2026

(54) POWER STORAGE DEVICE MANAGEMENT SYSTEM AND ELECTRONIC DEVICE

(71) Applicant: SEMICONDUCTOR ENERGY LABORATORY CO., LTD., Atsugi (JP)

(72) Inventors: Takeshi Osada, Isehara (JP); Yosuke Tsukamoto, Atsugi (JP); Ryota Tajima, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 439 days.

(21) Appl. No.: 18/550,314

(22) PCT Filed: Mar. 8, 2022

(86) PCT No.: PCT/IB2022/052018

§ 371 (c)(1),
(2) Date: Sep. 13, 2023

(87) PCT Pub. No.: WO2022/195402

PCT Pub. Date: Sep. 22, 2022

(65) Prior Publication Data

US 2024/0151774 A1 May 9, 2024

(30) Foreign Application Priority Data

Mar. 19, 2021 (JP) ................................ 2021-046222

(51) Int. Cl.
*G01R 31/367* (2019.01)
*G01R 31/382* (2019.01)
(Continued)

(52) U.S. Cl.
CPC ....... *G01R 31/367* (2019.01); *G01R 31/3835* (2019.01); *H01M 10/425* (2013.01);
(Continued)

(58) Field of Classification Search
CPC ............ G01R 31/367; G01R 31/3835; G01R 31/382; G01R 31/385; H01M 10/425;
(Continued)

(56) References Cited

U.S. PATENT DOCUMENTS 10,162,010 B2 12/2018 Zhang
10,741,834 B2 8/2020 Zhang et al.
(Continued)

FOREIGN PATENT DOCUMENTS

CN 105655554 A 6/2016
CN 107003357 A 8/2017
(Continued)

OTHER PUBLICATIONS

International Search Report (Application No. PCT/IB2022/052018) Dated May 31, 2022.
(Continued)

*Primary Examiner* — Christian T Bryant
(74) *Attorney, Agent, or Firm* — Fish & Richardson P.C.

(57) ABSTRACT

A power storage device management system, a management method, and a computer program that use AI are provided. The power storage device management system includes an electronic device including a power storage device and a server device. The power storage device includes a control portion and a storage battery; the control portion has a first function of creating second data utilizing first data at a first point in time and a second function of transmitting the second data to the server device; the server device has a third function of creating first data at a second point in time utilizing the second data and a fourth function of transmitting the first data at the second point in time to the control portion; and the first function, the second function, the third function, and the fourth function are repeatedly performed.

10 Claims, 26 Drawing Sheets

(51) Int. Cl.

| | |
|---|---|
| ***G01R 31/3835*** | (2019.01) |
| ***G01R 31/385*** | (2019.01) |
| ***H01M 10/42*** | (2006.01) |
| ***H01M 10/48*** | (2006.01) |
| ***H02J 7/00*** | (2026.01) |
| ***H02J 7/40*** | (2026.01) |
| ***H02J 7/80*** | (2026.01) |

(52) U.S. Cl.
CPC ................. *H02J 7/40* (2026.01); *H02J 7/80* (2026.01); *G01R 31/382* (2019.01); *G01R 31/385* (2019.01); *H01M 2010/4271* (2013.01); *H01M 10/48* (2013.01); *H02J 7/00* (2013.01); *Y02E 60/10* (2013.01)

(58) Field of Classification Search
CPC ........... H01M 2010/4271; H01M 10/48; H02J 7/00032; H02J 7/0047; H02J 7/00; H02J 7/40; H02J 7/80; Y02E 60/10
See application file for complete search history.

(56) References Cited

U.S. PATENT DOCUMENTS

| | | | |
|---|---|---|---|
| 11,065,978 | B2 | 7/2021 | Aykol et al. |
| 2002/0110736 | A1 | 8/2002 | Kweon et al. |
| 2003/0104279 | A1 | 6/2003 | Miyazaki et al. |
| 2004/0142241 | A1 | 7/2004 | Nagayama |
| 2006/0263690 | A1 | 11/2006 | Suhara et al. |
| 2007/0117014 | A1 | 5/2007 | Saito et al. |
| 2008/0241693 | A1 | 10/2008 | Fukuchi et al. |
| 2009/0087362 | A1 | 4/2009 | Sun et al. |
| 2009/0104532 | A1 | 4/2009 | Hosoya |
| 2010/0086854 | A1 | 4/2010 | Kumar et al. |
| 2010/0247986 | A1 | 9/2010 | Toyama et al. |
| 2013/0052534 | A1 | 2/2013 | Fujiki et al. |
| 2013/0323596 | A1 | 12/2013 | Morita et al. |
| 2014/0212759 | A1 | 7/2014 | Blangero et al. |
| 2015/0008364 | A1 | 1/2015 | Endo |
| 2016/0006032 | A1 | 1/2016 | Paulsen et al. |
| 2016/0013478 | A1 | 1/2016 | Satow et al. |
| 2016/0156032 | A1 | 6/2016 | Lee et al. |
| 2016/0268601 | A1 | 9/2016 | Paulsen et al. |
| 2016/0276659 | A1 | 9/2016 | Choi et al. |
| 2017/0328956 | A1 | 11/2017 | Zhang |
| 2018/0013130 | A1 | 1/2018 | Ochiai et al. |
| 2018/0145317 | A1 | 5/2018 | Momma et al. |
| 2018/0145368 | A1 | 5/2018 | Ochiai et al. |
| 2019/0245199 | A1 | 8/2019 | Zeng et al. |
| 2020/0176770 | A1 | 6/2020 | Takahashi et al. |
| 2020/0220173 | A1 | 7/2020 | Jo et al. |
| 2020/0269722 | A1* | 8/2020 | Aykol ................ G05B 13/0265 |
| 2020/0386815 | A1* | 12/2020 | Imoto ................. G01R 31/367 |
| 2021/0083281 | A1 | 3/2021 | Mikami et al. |
| 2021/0255251 | A1 | 8/2021 | Ukumori |
| 2021/0313571 | A1 | 10/2021 | Momma et al. |
| 2022/0003822 | A1* | 1/2022 | Naito .................. G01R 31/392 |
| 2022/0131146 | A1 | 4/2022 | Saito et al. |
| 2022/0359870 | A1 | 11/2022 | Mikami et al. |
| 2025/0105282 | A1 | 3/2025 | Liu et al. |

FOREIGN PATENT DOCUMENTS

| | | | | |
|---|---|---|---|---|
| CN | 103389466 | B * | 12/2017 | ........ H02J 7/007184 |
| CN | 111612204 | A | 9/2020 | |
| CN | 112368904 | A | 2/2021 | |
| CN | 112969929 | A | 6/2021 | |
| CN | 113140726 | A | 7/2021 | |
| EP | 3224632 | A | 10/2017 | |
| EP | 3872506 | A | 9/2021 | |
| JP | 09-243716 | A | 9/1997 | |
| JP | 2000-203842 | A | 7/2000 | |
| JP | 2002-216760 | A | 8/2002 | |
| JP | 2010-080407 | A | 4/2010 | |
| JP | 2015-099722 | A | 5/2015 | |
| JP | 2017-538935 | | 12/2017 | |
| JP | 2019-216552 | A | 12/2019 | |
| JP | 2020-145186 | A | 9/2020 | |
| KR | 2017-0092552 | A | 8/2017 | |
| WO | WO-2016/082208 | | 6/2016 | |
| WO | WO-2019/193471 | | 10/2019 | |
| WO | WO-2019/240182 | | 12/2019 | |
| WO | WO-2020026058 | A1 * | 2/2020 | ........... H01M 10/48 |
| WO | WO-2020/085011 | | 4/2020 | |

OTHER PUBLICATIONS

Written Opinion (Application No. PCT/IB2022/052018) Dated May 31, 2022.

Zhang.J et al., "Trace doping of multiple elements enables stable battery cycling of LiCoO2 at 4.6 V", Nature Energy, Jun. 17, 2019, vol. 4, pp. 594-603.

Hirooka.M et al., "Improvement of float charge durability for LiCoO2 electrodes under high voltage and storage temperature by suppressing O1-Phase transition", Journal of Power Sources, Jul. 1, 2020, vol. 463, pp. 228127-1-228127-8, Elsevier.

Wang.L et al., "A Novel Bifunctional Self-Stabilized Strategy Enabling 4.6 V LiCoO2 with Excellent Long-Term Cyclability and High-Rate Capability", Adv. Sci. (Advanced Science), Apr. 24, 2019, vol. 6, No. 12, pp. 1900355-1-1900355-11.

Okumura. T et al., "Correlation of lithium ion distribution and X-ray absorption near-edge structure in O3- and O2-lithium cobalt oxides from first-principle calculation", J. Mater. Chem. (Journal of Materials Chemistry), 2012, vol. 22, pp. 17340-17348.

Yano.A et al., "LiCoO2 Degradation Behavior in the High-Voltage Phase Transition Region and Improved Reversibility with Surface Coating", J. Electrochem. Soc. (Journal of the Electrochemical Society), Nov. 12, 2016, vol. 164, No. 1, pp. A6116-A6122.

Wang.Z et al., "EELS analysis of cation valence states and oxygen vacancies in magnetic oxides", Micron, Oct. 1, 2000, vol. 31, No. 5, pp. 571-580, Elsevier.

Chung.K et al., "Structural Studies on the Effects of ZrO2 Coating on LiCoO2 during Cycling Using In Situ X-Ray Diffraction Technique", J. Electrochem. Soc. (Journal of the Electrochemical Society), Sep. 20, 2006, vol. 153, No. 11, pp. A2152-A2157.

Chen.Z et al., "Staging Phase Transitions in LixCoO2", J. Electrochem. Soc. (Journal of the Electrochemical Society), Oct. 29, 2002, vol. 149, No. 12, pp. A1604-A1609.

Ohzuku.T et al., "Solid-State Redox Reactions of LiCoO2 (R-3m) for 4 Volt Secondary Lithium Cells", J. Electrochem. Soc. (Journal of the Electrochemical Society), Nov. 1, 1994, vol. 141, No. 11, pp. 2972-2977.

Zou.M et al., "Synthesis and Electrochemical Performance of High Voltage Cycling LiM0.05Co0.95O2 as Cathode Material for Lithium Rechargeable Cells", Electrochemical and Solid-State Letters, Apr. 26, 2004, vol. 7, No. 7, pp. A176-A179.

Kim.Y et al., "Suppression of Cobalt Dissolution from the LiCoO2 Cathodes with Various Metal-Oxide Coatings", J. Electrochem. Soc. (Journal of the Electrochemical Society), Nov. 5, 2003, vol. 150, No. 12, pp. A1723-A1725.

Liu.A et al., "Synthesis of Mg and Mn Doped LiCoO2 and Effects on High Voltage Cycling", J. Electrochem. Soc. (Journal of the Electrochemical Society), Jun. 2, 2017, vol. 164, No. 7, pp. A1655-A1664.

Shim.J et al., "Effects of MgO Coating on the Structural and Electrochemical Characteristics of LiCoO2 as Cathode Materials for Lithium Ion Battery", Chem. Mater. (Chemistry of Materials), Mar. 24, 2014, vol. 26, No. 8, pp. 2537-2543.

Wang.Z et al., "Mg doping and zirconium oxyfluoride coating co-modification to enhance the high-voltage performance of LiCoO2 for lithium ion battery", Journal of Alloys and Compounds, Oct. 5, 2014, vol. 621, pp. 212-219.

Shim.J et al., "Synergistic effects of coating and doping for lithium ion battery cathode materials: synthesis and characterization of lithium titanate-coated LiCoO2 with Mg doping", Electrochimica Acta, Nov. 11, 2015, vol. 186, pp. 201-208, Elsevier.

(56) References Cited

OTHER PUBLICATIONS

Taguchi.N et al., "Characterization of MgO-coated-LiCoO2 particles by analytical transmission electron microscopy", Journal of Power Sources, Aug. 10, 2016, vol. 328, pp. 161-166, Elsevier.
Amatucci.G et al., "CoO2, The End Member of the LixCoO2 Solid Solution", J. Electrochem. Soc. (Journal of the Electrochemical Society), Mar. 1, 1996, vol. 143, No. 3, pp. 1114-1123.
Qian.J et al., "Electrochemical surface passivation of LiCoO2 particles at ultrahigh voltage and its applications in lithium-based batteries", Nature Communications, Nov. 21, 2018, vol. 9, pp. 4918-1-4918-11.
Yin.R et al., "In Situ XRD Investigation and Thermal Properties of Mg Doped LiCoO2 for Lithium Ion Batteries", J. Electrochem. Soc. (Journal of the Electrochemical Society), Jan. 3, 2012, vol. 159, No. 3, pp. A253-A258.
Shao-horn.Y et al., "Probing Lithium and Vacancy Ordering in O3 Layered Lix CoO2 (x=0.5) : An Electron Diffraction Study", J. Electrochem. Soc. (Journal of the Electrochemical Society), Feb. 6, 2003, vol. 150, No. 3, pp. A366-A373.
Kalluri.S et al., "Surface Engineering Strategies of Layered LiCoO2 Cathode Material to Realize High-Energy and High-Voltage Li-Ion Cells", Advanced Energy Materials, Oct. 12, 2016, vol. 7, No. 1, pp. 1601507-1-1601507-21.
Zhang.S et al., "Surface engineering of LiCoO2 by a multifunctional nanoshell for stable 4.6V electrochemical performance", Energy Storage Materials, Feb. 21, 2023, vol. 57, pp. 289-298.
Yano.A et al., "Capability and Reversibility of LiCoO2 during Charge/Discharge with O3/H1-3 Layered Structure Change", J. Electrochem. Soc. (Journal of the Electrochemical Society), May 11, 2021, vol. 168, No. 5, pp. 050517-1-050517-11.

* cited by examiner

| bit data | corresponding SOC [%] |
|---|---|
| 0000 | -10 % |
| 0001 | 0 % |
| 0010 | 20 % |
| 0011 | 40 % |
| 0100 | 60 % |
| 0101 | 80 % |
| 0110 | 90 % |
| 0111 | 95 % |
| 1000 | 97 % |
| 1001 | 98 % |
| 1010 | 99 % |
| 1011 | 100 % |
| 1100 | 101 % |
| 1101 | 102 % |
| 1110 | State A |
| 1111 | State B |

| bit data | corresponding voltage [V] |
|---|---|
| 0000 | 2.30 V |
| 0001 | 2.50 V |
| 0010 | 2.90 V |
| 0011 | 3.30 V |
| 0100 | 3.70 V |
| 0101 | 4.10 V |
| 0110 | 4.30 V |
| 0111 | 4.40 V |
| 1000 | 4.44 V |
| 1001 | 4.46 V |
| 1010 | 4.48 V |
| 1011 | 4.50 V |
| 1100 | 4.52 V |
| 1101 | 4.54 V |
| 1110 | State C |
| 1111 | State D |

62

POWER STORAGE DEVICE MANAGEMENT SYSTEM AND ELECTRONIC DEVICE

CROSS REFERENCE TO RELATED APPLICATIONS

This application is a U.S. National Phase Application under 35 U.S.C. § 371 of International Application PCT/IB2022/052018, filed on Mar. 8, 2022, which is incorporated by reference and claims the benefit of a foreign priority application filed in Japan on Mar. 19, 2021, as Application No. 2021-046222.

TECHNICAL FIELD

One embodiment of the present invention relates to a power storage device, an electronic device, a server device, a computer program, and a power storage device management system.

One embodiment of the present invention relates to a neural network and a power storage device management system using the neural network. Another embodiment of the present invention relates to a vehicle using a neural network. Another embodiment of the present invention relates to an electronic device using a neural network. One embodiment of the present invention is not limited to a vehicle, and relates to a power storage device management system that can also be applied to a power storage device for storing electric power obtained from power generation facilities such as a solar power generation panel provided in a structure body or the like.

Note that one embodiment of the present invention is not limited to the above technical field. The technical field of one embodiment of the invention disclosed in this specification and the like relates to an object, a method, or a manufacturing method. Alternatively, the present invention relates to a process, a machine, manufacture, or a composition (a composition of matter). In particular, one embodiment of the present invention relates to a semiconductor device, a display device, a light-emitting device, a power storage device, a memory device, a driving method thereof, or a manufacturing method thereof.

In this specification and the like, a semiconductor device means an element, a circuit, a device, or the like that can function by utilizing semiconductor characteristics. For example, a semiconductor element such as a transistor or a diode is a semiconductor device. For another example, a circuit including a semiconductor element is a semiconductor device. For another example, a device provided with a circuit including a semiconductor element is a semiconductor device.

Note that an electronic device in this specification means all devices including power storage devices, and electro-optical devices including power storage devices, information terminal devices including power storage devices, and the like are all electronic devices.

Note that in this specification, a power storage device refers to all elements and devices each having a function of storing power. For example, a power storage device (also referred to as a secondary battery) such as a lithium-ion secondary battery, a lithium-ion capacitor, and an electric double layer capacitor are included.

BACKGROUND ART

In recent years, a variety of power storage devices such as lithium-ion secondary batteries, lithium-ion capacitors, and air batteries have been actively developed. In particular, demands for lithium-ion secondary batteries with high output and high energy density have rapidly grown with the development of the semiconductor industry, for portable information terminals such as mobile phones, smartphones, and laptop computers, portable music players, digital cameras, medical equipment, next-generation clean energy vehicles such as hybrid electric vehicles (HVs), electric vehicles (EVs), and plug-in hybrid electric vehicles (PHVs), and the like, and the lithium-ion secondary batteries are essential as rechargeable energy supply sources for today's information society.

Lithium-ion batteries with high utility have high output and high energy density; on the other hand, the lithium-ion batteries are known to be highly risky in terms of safety against overdischarging and overcharging. Therefore, in the case of using lithium-ion secondary batteries in devices, it is required to accurately grasp and manage internal states such as the state of charge and the internal resistance. As a method for estimating the internal states of a lithium-ion battery, a coulomb counter method, an OCV (Open Circuit Voltage) method, a Kalman filter, and the like are known (Patent Document 1). In the state estimation methods such as the Kalman filter, having highly accurate data on SOC (State of Charge)-OCV (Open Circuit Voltage) characteristics and the FCC (Full Charge Capasity) of an estimation-target power storage device is important.

REFERENCE

Patent Document

[Patent Document 1] PCT International Publication No. WO2019/193471

SUMMARY OF THE INVENTION

Problems to be Solved by the Invention

When charging and discharging are repeated in long-time usage by a conventional method, the power storage device deteriorates and measurement errors are accumulated. This may significantly lower the accuracy of data such as SOC-OCV characteristics and the FCC. Managing the power storage device with low data accuracy may hasten the deterioration of the power storage device or lead the power storage device to a dangerous state.

The SOC-OCV characteristic data is preferably obtained from many data points so as to be highly accurate. However, such data, which is utilized by a control portion of the power storage device, might exceed the data capacity that can be handled by the control portion.

Furthermore, in creating new SOC-OCV characteristic data, the control portion of the power storage device sometimes lacks arithmetic operation capability for creating data.

If the capacity of a secondary battery can be estimated with high accuracy, an anomaly can also be detected in accordance with the value. Providing a novel method for detecting an anomaly of a secondary battery is also an object.

Note that the description of these objects does not preclude the existence of other objects. Note that one embodiment of the present invention does not have to achieve all these objects. Other objects can be derived from the description of the specification, the drawings, and the claims.

Means for Solving the Problems

One embodiment of the present invention is a power storage device management system including an electronic device including a power storage device and a server device. The power storage device includes a control portion and a storage battery; the control portion has a first function of creating second data utilizing first data at a first point in time and a second function of transmitting the second data to the server device; the server device has a third function of creating first data at a second point in time utilizing the second data and a fourth function of transmitting the first data at the second point in time to the control portion, and the first function, the second function, the third function, and the fourth function are repeatedly performed.

One embodiment of the present invention is the above-described power storage device management system, in which the third function of the server device includes a first algorithm; in which the first function of the control portion includes a second algorithm; in which the control portion includes a plurality of pieces of SOC-OCV characteristic data; in which the server device has a function of creating at least one of the plurality of pieces of SOC-OCV characteristic data utilizing the second data and the first algorithm; and in which the control portion has a function of selecting first SOC-OCV characteristic data that most closely shows a state of the storage battery from the plurality of pieces of SOC-OCV characteristic data utilizing the second algorithm.

One embodiment of the present invention is any one of the above-described power storage device management systems, in which the electronic device has a fifth function of creating second SOC-OCV characteristic data on the basis of the first SOC-OCV characteristic data and an estimated load on the electronic device and in which an OCV value at an SOC value of 0% in the second SOC-OCV characteristic data is higher than an OCV value at an SOC value of 0% in the first SOC-OCV characteristic data.

One embodiment of the present invention is any one of the above-described power storage device management systems, in which each of the plurality of pieces of SOC-OCV characteristic data is formed of a combination of first bit data corresponding to an SOC value and second bit data corresponding to an OCV value and in which the number of bits of the first bit data and the number of bits of the second bit data are equal to each other.

One embodiment of the present invention is any one of the above-described power storage device management systems, in which the third function of the server device includes a third algorithm; in which the first function of the control portion includes a fourth algorithm; in which the first data includes an FCC value; in which the second data includes an R (internal resistance) value; in which the server device has a function of estimating the FCC value utilizing the second data and the third algorithm; and in which the control portion has a function of calculating the R value utilizing the first data and the fourth algorithm.

One embodiment of the present invention is any one of the above-described power storage device management systems, in which the control portion includes a coulomb counter configured to measure an accumulated charge amount of the storage battery and in which every time the accumulated charge amount reaches the FCC value, the accumulated charge amount is reset and the second function is implemented.

One embodiment of the present invention is an electronic device including a power storage device, in which the power storage device includes a control portion and a storage battery; in which the control portion includes a plurality of pieces of SOC-OCV characteristic data; and in which the control portion has a function of selecting data that most closely shows a state of the storage battery from the plurality of pieces of SOC-OCV characteristic data.

One embodiment of the present invention is an electronic device including a power storage device, in which the power storage device includes a control portion and a storage battery; in which the control portion includes a plurality of pieces of SOC-OCV characteristic data; in which the control portion has a function of selecting data that most closely shows a state of the storage battery from the plurality of pieces of SOC-OCV characteristic data; in which each of the plurality of pieces of SOC-OCV characteristic data is formed of a combination of first bit data corresponding to an SOC value and second bit data corresponding to an OCV value; and in which the number of bits of the first bit data and the number of bits of the second bit data are equal to each other.

Effect of the Invention

SOC-OCV characteristic data and the FCC value showing the present state of a power storage device are estimated by a server device at intervals of a certain period and fed back to a control portion of the power storage device, whereby the power storage device can be managed with high accuracy. In the control portion of the power storage device, a method for selecting the SOC-OCV characteristic data that most closely shows the present state of the power storage device among the plurality of pieces of SOC-OCV characteristic data transmitted from the server device is employed, whereby management of the power storage device using highly accurate SOC-OCV characteristic data can be performed with a small amount of calculation.

A method for estimating the state of a secondary battery that has high estimation accuracy even when deterioration of the secondary battery progresses can be provided. Furthermore, a system for measuring the state of a secondary battery that estimates the SOC with high accuracy in a short time at low cost can be provided. A novel method for detecting an anomaly of a secondary battery can be provided.

MODE FOR CARRYING OUT THE INVENTION

Embodiments of the present invention will be described in detail below with reference to the drawings. However, the present invention is not limited to the description below and it is easily understood by those skilled in the art that the mode and details can be modified in various ways. In addition, the present invention should not be construed as being limited to the description of the embodiments below.

Embodiment 1

In this embodiment, an example of a power storage device management system of one embodiment of the present invention will be described with reference to FIG. 1 to FIG. 5.

Figure 1:
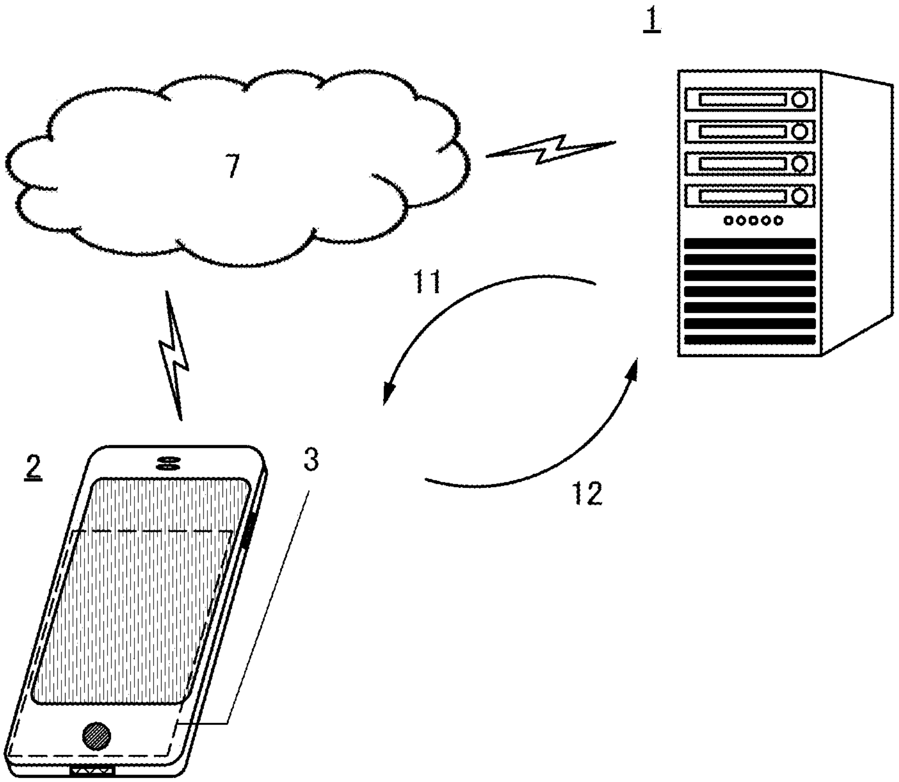
FIG. 1 is a conceptual diagram of a power storage device management system of one embodiment of the present invention.

FIG. 1 is a conceptual diagram of a power storage device management system. The power storage device management system includes a server device 1 and an electronic device 2 provided with a power storage device 3 as illustrated in FIG. 1. The power storage device management system includes an algorithm including a neural network and can be expressed as a power storage device management system including artificial intelligence (AI).

In this embodiment, an example of a system in which the server device 1 manages one electronic device 2 is described; however, without limitation thereto, the server device 1 can manage a plurality of the electronic devices 2. Since high-speed arithmetic processing is preferred, in the case where the server device 1 manages the plurality of electronic devices 2, the server device 1 preferably includes a CPU (Central Processing Unit) and a GPU (Graphics Processing Unit) as arithmetic processing devices. In the case where the server device 1 manages the plurality of electronic devices 2, each of the plurality of electronic devices 2 and the power storage devices 3 included in the plurality of electronic devices 2 preferably has its own unique identifier (also referred to as a unique ID). From the traceability point of view, the identifiers are preferably set by being linked with serial numbers of the electronic devices 2 and the power storage devices 3 included in the electronic devices 2.

Figure 5:
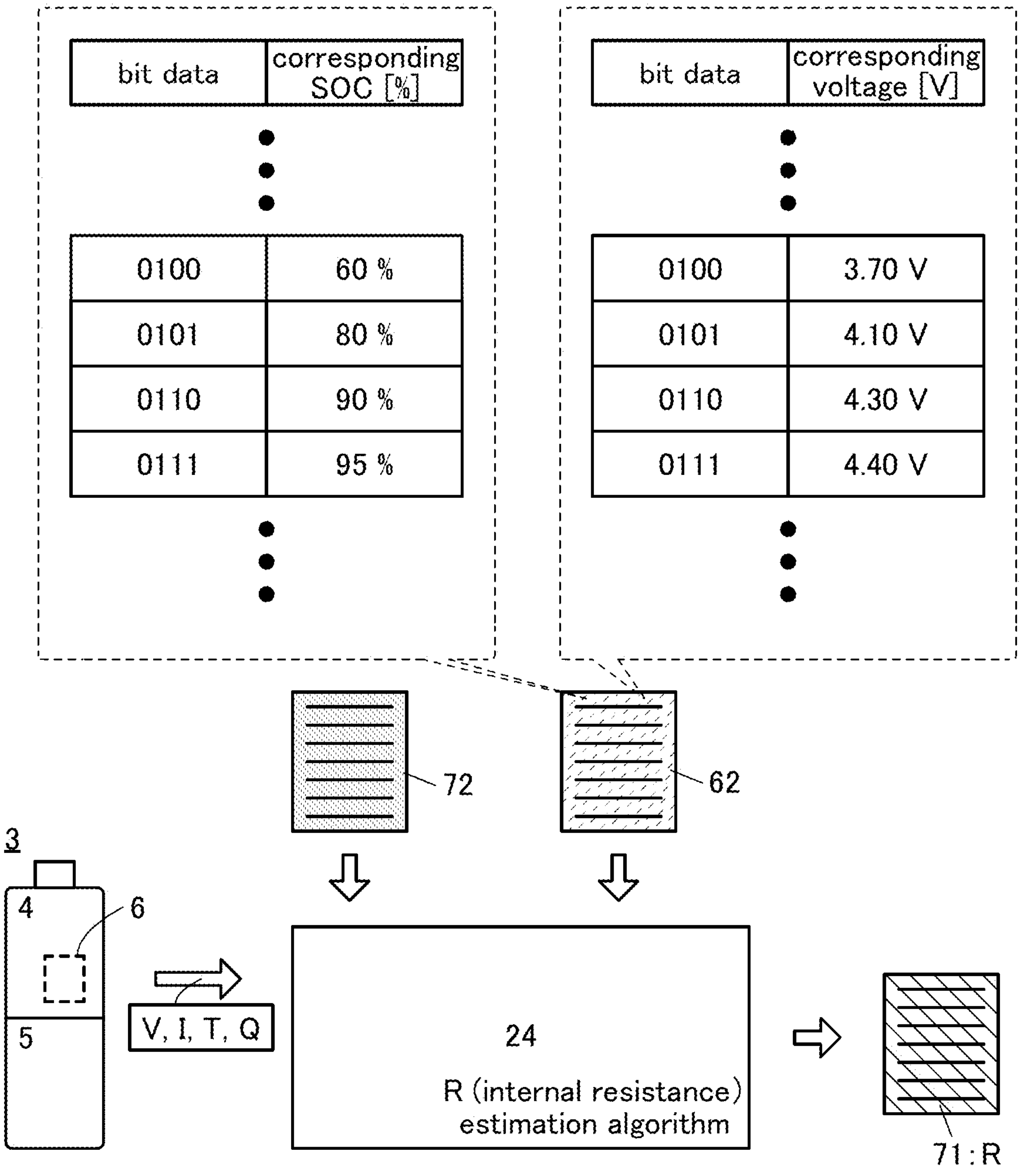
FIG. 5 is a diagram illustrating a method for estimating the R value.

Data transmission and reception can be performed between the server device 1 and the electronic device 2 through a communication network 7. The data includes first data 11 transmitted from the server device 1 to the electronic device 2 and second data 12 transmitted from the electronic device 2 to the server device 1. The power storage device 3 includes a control portion 4 and a storage battery 5 as illustrated in FIG. 5. The first data 11 includes the FCC value regarding the storage battery 5 and SOC-OCV characteristic data regarding the storage battery 5. The second data 12 includes SOC-OCV characteristic data that the control portion 4 of the power storage device 3 currently uses, the R value regarding the storage battery 5, and the accumulated charge amount of the storage battery 5. The accumulated charge amount of the storage battery 5 refers to either one or both of the charge amount accumulated since the power storage device 3 is mounted on the electronic device 2 and the charge amount accumulated since the last data transmission. In the case where the accumulated charge amount refers to both of them, two kinds of data show the accumulated charge amount of the storage battery 5. The second data 12 may include data of an error between the SOC-OCV characteristic data that the control portion 4 of the power storage device 3 currently uses and the actual SOC-OCV characteristics of the storage battery 5. The error data regarding the SOC-OCV characteristics can include an array of an open circuit voltage difference ($\Delta V$) at each SOC but may include one value obtained by adding up open circuit voltage differences ($\Delta V$) at all SOC.

The data communication between the server device 1 and the electronic device 2 through the communication network 7 may be performed at any time but is preferably performed during the charging of the power storage device 3, in which case external electric power can be used for the data communication. During the charging of the power storage device 3, the data communication can be performed, for example, when charging with an accumulated charge amount corresponding to the FCC value of the storage battery 5 included in the power storage device 3 is performed after the point in time when the last data communication is implemented. The server device 1 has a function of estimating the FCC value included in the first data on the basis of the accumulated charge amount of the storage battery 5 included in the second data and a capacity degradation table included in the server device 1. Here, it is preferable to perform data communication with the above-described timing, in which case the accumulated charge amount can be calculated on the basis of the number of communication times.

[Processing Function Regarding SOC-OCV Characteristic Data]

Figure 2:
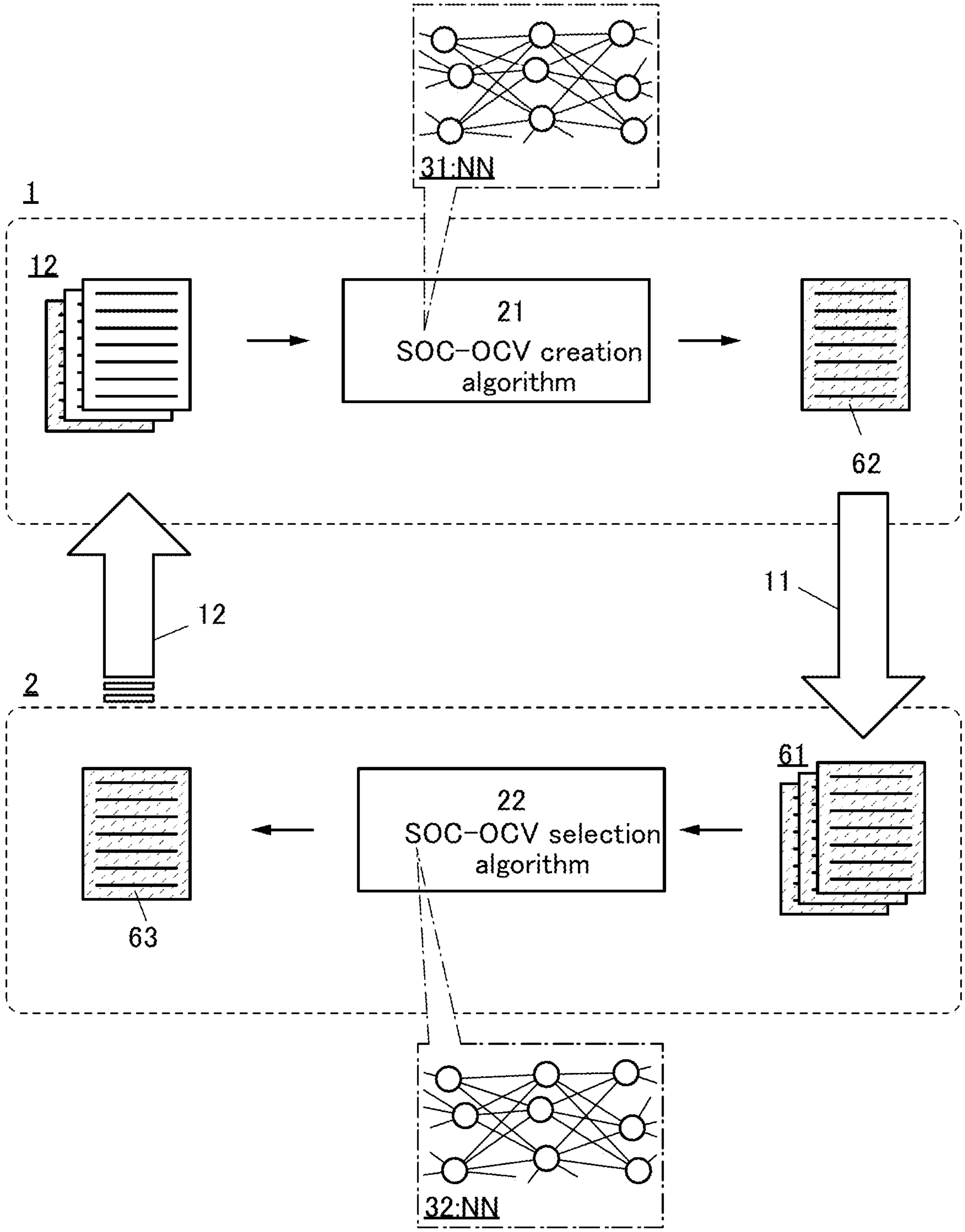
FIG. 2 is a diagram illustrating a processing function regarding SOC-OCV characteristic data of the power storage device management system.

FIG. 2 is a diagram regarding the SOC-OCV characteristic data included in the first data 11 and the second data 12, illustrating creation of the SOC-OCV characteristic data in the server device 1 and selection of the SOC-OCV characteristic data in the electronic device 2 or the control portion 4. Functional structures regarding the creation and selection of the SOC-OCV characteristic data in the power storage device management system are described with reference to FIG. 2. FIG. 2 schematically illustrates data communication (data transmission and reception) between the server device 1 and the electronic device 2; however, without limitation to one to one direct data communication, data communication through other electronic devices, an Internet line, a communication relay device, a communication base station, or the like may be performed in this embodiment. As a data communication system, wired communication or wireless communication may be used. In the case of using wireless communication, wireless communication conforming to the communication standard such as the fourth-generation mobile communication system (4G) or the fifth-generation mobile communication system (5G) can be used, for example. The signal frequency of the wireless communication can be any of the following frequencies, for example: 300 GHz to 3 THz of sub-millimeter waves; 30 GHz to 300 GHz of millimeter waves; 3 GHz to 30 GHz of microwaves; 300 MHz to 3 GHz of ultra high frequencies; 30 MHz to 300 MHz of very high frequencies; 3 MHz to 30 MHz of high frequencies; 300 kHz to 3 MHz of medium frequencies; 30 kHz to 300 kHz of low frequencies; and 3 kHz to 30 kHz of very low frequencies.

The server device 1 includes a first algorithm 21. The first algorithm 21 has a function of creating first SOC-OCV characteristic data 62 using the second data 12 as input data. The first algorithm 21 preferably includes a first neural network 31. The server device 1 has a function of transmitting the first SOC-OCV characteristic data 62 to the electronic device 2 as part of the first data 11. The first SOC-OCV characteristic data 62 transmitted to the electronic device 2 is added as part of an SOC-OCV characteristic data list 61 that the electronic device 2 or the control portion 4 has.

The electronic device 2 or the control portion 4 includes a second algorithm 22. The second algorithm 22 has a function of selecting second SOC-OCV characteristic data 63 using, as input data, the SOC-OCV characteristic data list 61 and the voltage value, current value, temperature, and capacity value of the storage battery 5 included in the control portion 4. The second SOC-OCV characteristic data 63 that most closely shows the state of the storage battery 5 at the time of selection is selected. "Most closely" means the smallest difference from the entire range of the SOC-OCV characteristics of the storage battery 5. Because actually measuring the entire range of the SOC-OCV characteristics of the storage battery 5 used and incorporated in the electronic device 2 is difficult, the second algorithm 22 needs to select the second SOC-OCV characteristic data 63 on the basis of the limited input data. Therefore, the second algorithm 22 preferably includes a second neural network 32. The second algorithm 22 including the second neural network 32 can select the second SOC-OCV characteristic data 63 that most closely shows the state of the storage battery 5 using the limited input data. Furthermore, the electronic device 2 or the control portion 4 has a function of transmitting, as part of the second data 12, the second SOC-OCV characteristic data 63 to the server apparatus 1.

As the first neural network 31, any one of FFNN (Feedforward Neural Network), CNN (Convolutional Neural Network), RNN (Recurrent Neural Network), and LSTM (Long Short-Term Memory) can be used, for example.

As the second neural network 32, any one of FFNN (Feedforward Neural Network), CNN (Convolutional Neural Network), RNN (Recurrent Neural Network), and LSTM (Long Short-Term Memory) can be used, for example. In the second neural network 32, a decision tree may be used to select the second SOC-OCV characteristic data 63 from the SOC-OCV characteristic data list 61 as a classification problem.

Figure 3:
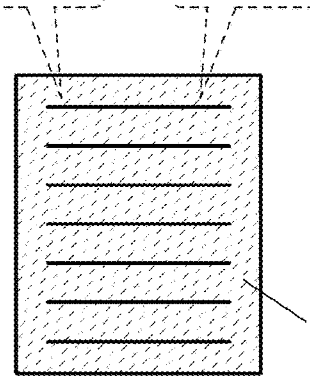
FIG. 3 is a diagram illustrating a data description method for SOC-OCV characteristic data.

Next, a data description method for the first SOC-OCV characteristic data 62 is described with reference to FIG. 3. In the power storage device management system of one embodiment of the present invention, a data description method in which SOC data and OCV data are assigned as specific bit data as illustrated in FIG. 3 can be used, for example. As the SOC data, a relation between the bit data and the corresponding SOC is illustrated in FIG. 3. FIG. 3 also illustrates a relation between the bit data and the corresponding voltage as the OCV data. When the specific bit data in the SOC data is 0011, for example, the corresponding SOC is 40% and the corresponding voltage in the OCV data is 3.30 V. In a normal usage situation of the power storage device 3, the SOC is higher than or equal to 0% and lower than or equal to 100%; however, in the case where the power storage device 3 is not used for a long time, the power storage device 3 can be brought into an overdischarged state with an SOC of lower than or equal to 0%. As for charging, overcharging to 100% or higher needs to be dealt with as a potential risk. Therefore, as illustrated in FIG. 3, it is preferable that the SOC data cover an SOC range lower than 0% and an SOC range higher than 100%. The OCV data and the SOC data are pair data, and the OCV values of the storage battery 5 corresponding to the SOC values are assigned as the OCV data.

As an example of the data description method for the first SOC-OCV characteristic data 62, FIG. 3 illustrates an example in which bit data is assigned more in an SOC range near 100%. For a lithium-ion battery, the overcharged state exceeding 100% SOC can decrease the safety and battery life of the storage battery 5; therefore, bit data is preferably assigned more in the SOC range near 100% SOC. The SOC range near 100% SOC is preferably between 90% and 110%, further preferably between 95% and 105%; in this range, bit data is preferably assigned more than or equal to double the bit data assigned in the other range. The bit data assignment can be performed by the server device 1. The bit data is assigned more in the SOC range near 100% in FIG. 3. In addition, bit data may be assigned more also in an SOC range near 0%. Assigning bit data more also in the SOC range near 0% is preferable because it easily prevents the electronic device 2 including the power storage device 3 from suddenly shutting down. As in the example described above, assigning bit data more in part of the SOC range even with a small number of bits can form necessary and sufficient SOC-OCV characteristic data, whereby effects of reducing the size of communication data between the server device 1 and the power storage device 3 and the size of accumulated data inside the power storage device 3 can be obtained.

Although an example with 4 bits is illustrated in FIG. 3 for explanation, without limitation thereto, data may be described with a larger number of bits such as 8 bits, 16 bits, 32 bits, and 64 bits, for example. In the case of using large bit data, assigning bit data more in part of the SOC range in the above-described manner is sometimes unnecessary. This is because, in the case where the number of bits assigned to the SOC-OCV characteristic data is large, the entire SOC range as well as part of the SOC range can be described in detail. Note that the number of bits of the SOC data and the number of bits of the OCV data need not necessarily be the same. However, it is preferable that the number of bits of the SOC data and the number of bits of the OCV data be the same because in that case arithmetic processing is facilitated in processing in the first neural network and/or the second neural network.

In the example illustrated in FIG. 3, as an example of the data description method for the first SOC-OCV characteristic data 62, State A to State D representing the states of the power storage device 3 are assigned to redundant bit data in addition to the assignments of the SOC data and the OCV data. As State A to State D representing the state of the power storage device 3, data showing danger such as an internal short circuit of the storage battery 5 can be assigned, for example.

As described above, the accuracy of estimating the remaining battery level of the storage battery 5 can be increased by the power storage device management system of one embodiment of the present invention having the data processing function regarding the SOC-OCV characteristic data. Furthermore, by the server device 1, the SOC-OCV characteristic data can be reduced in size (the data amount can be reduced) and can be made suitable for neural network processing, whereby power consumption of the control portion included in the power storage device 3 can be reduced.

[Processing Function Regarding FCC and Internal Resistance]

Figure 4:
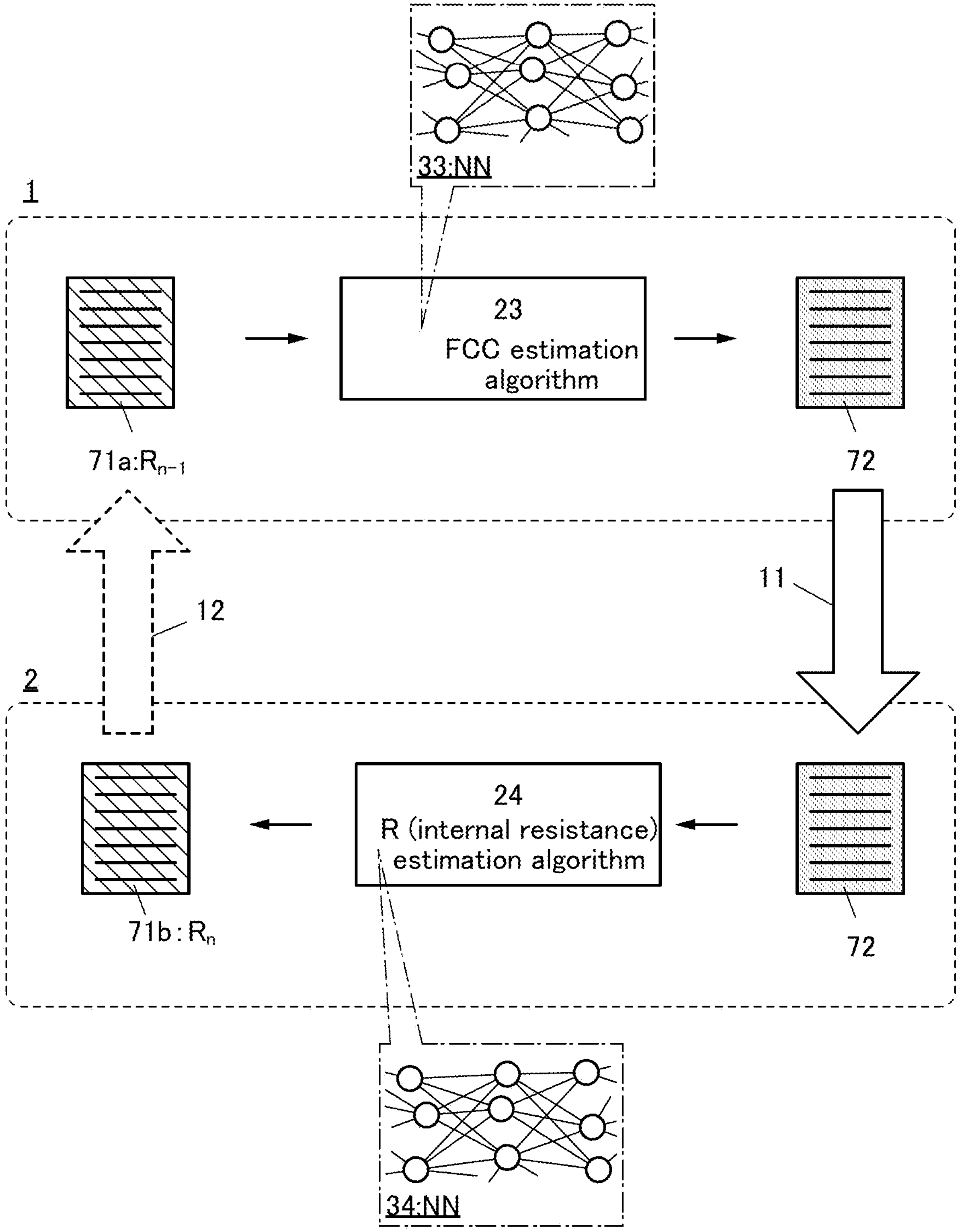
FIG. 4 is a diagram illustrating a processing function regarding the FCC and the internal resistance of the power storage device management system.

FIG. 4 is a diagram regarding the FCC value included in the first data 11 and the R value included in the second data, illustrating the estimation of the FCC value in the server device 1 and the estimation of the R value in the electronic device 2 or the control portion 4. Functional structures regarding the estimation of the FCC value and the R value in the power storage device management system are described with reference to FIG. 4. Note that the communication method described with reference to FIG. 2 can be used for the data communication (data transmission and reception) between the server device 1 and the electronic device 2.

The server device 1 includes a third algorithm 23. The third algorithm 23 has a function of estimating an FCC 72 using, as input data, an R value 71*a* calculated by the power storage device (R data estimated by the power storage device one point in time before: $R_{n-1}$). The third algorithm 23 preferably includes a third neural network 33. The server device 1 has a function of transmitting the FCC 72 to the electronic device 2 as part of the first data 11.

The electronic device 2 or the control portion 4 includes a fourth algorithm 24. The fourth algorithm 24 has a function of estimating an R value 71*b* (R data estimated by the power storage device: $R_n$) of the storage battery 5 using, as input data, the FCC 72, the second SOC-OCV characteristic data 63, and the voltage value, current value, temperature, and capacity value of the storage battery 5 included in the control portion 4. The fourth algorithm 24 preferably includes a fourth neural network 34. Furthermore, the electronic device 2 or the control portion 4 has a function of transmitting, as part of the second data 12, the R value 71 ($R_n$) to the server apparatus 1.

As the third neural network 33, any one of FFNN (Feedforward Neural Network), CNN (Convolutional Neural Network), RNN (Recurrent Neural Network), and LSTM (Long Short-Term Memory) can be used, for example.

As the fourth neural network 34, any one of FFNN (Feedforward Neural Network), CNN (Convolutional Neural Network), RNN (Recurrent Neural Network), and LSTM (Long Short-Term Memory) can be used, for example.

Next, a method for estimating the R value 71 is described with reference to FIG. 5. FIG. 5 illustrates a function of the fourth algorithm 24 included in the electronic device 2 or the control portion 4. By the input of the first SOC-OCV characteristic data 62, the FCC 72, and the internal measurement values of the power storage device 3 to the fourth algorithm 24, the R value 71 is estimated. The SOC-OCV characteristic data 62 is preferably in the data format described with reference to FIG. 3. The internal measurement values of the power storage device 3 include the voltage value V of the storage battery 5, the value I of current flowing through the storage battery 5, the temperature T of the storage battery 5, and the capacity value Q measured with a coulomb counter 6 included in the control portion 4.

As described above, the function of the power storage device management system of one embodiment of the present invention regarding the estimation of the FCC value and the R value can increase the accuracy of estimating the FCC value and the R value of the storage battery 5. The SOC-OCV characteristic data in a reduced size (in a reduced data amount) is used for the estimation of the R value; this is suitable for the neural network processing. Accordingly, power consumption of the control portion included in the power storage device 3 can be reduced.

The power storage device 3 included in the electronic device 2 may include not only the SOC-OCV characteristic data list 61 and the second SOC-OCV characteristic data 63 but also third SOC-OCV characteristic data. The third SOC-OCV characteristic data can be created on the basis of the second SOC-OCV characteristic data 63 and an estimated load on the electronic device 2. As the estimated load on the electronic device 2, an average current consumption value of the electronic device 2 can be used. In the third SOC-OCV characteristic data, the corresponding voltage in a low SOC range in the OCV data is set higher than that in the second SOC-OCV characteristic data 63 in consideration of the estimated load on the electronic device 2. For simplified example, data of SOC=10% in the second SOC-OCV characteristic data 63 is recorded as data of SOC=0% in the third SOC-OCV characteristic data. In this example, OCV at SOC=0% in the third SOC-OCV characteristic data is higher than OCV at SOC=0% in the second SOC-OCV characteristic data 63. Using the third SOC-OCV characteristic data as an indicator for the user of the electronic device 2 is sometimes preferable because it can prevent the electronic device 2 from suddenly shutting down.

This embodiment can be implemented in appropriate combination with the other embodiments.

Embodiment 2

In this embodiment, examples of a secondary battery of one embodiment of the present invention are described.

In this specification and the like, a theoretical capacity of a positive electrode active material refers to the amount of electricity obtained when all lithium that can be inserted and extracted and is contained in the positive electrode active material is extracted. For example, the theoretical capacity of $LiFePO_4$ is 170 mAh/g, the theoretical capacity of $LiCoO_2$ is 274 mAh/g, the theoretical capacity of $LiNiO_2$ is 275 mAh/g, and the theoretical capacity of $LiMn_2O_4$ is 148 mAh/g.

The remaining amount of lithium that can be inserted into and extracted from a positive electrode active material is represented by x in a compositional formula, e.g., $Li_xCoO_2$ or $Li_xMO_2$. In this specification, $Li_xCoO_2$ can be replaced with Li*M1$O_2$ as appropriate. It can be said that x is an occupancy rate, and in the case of a positive electrode active material in a secondary battery, x may be represented by (theoretical capacity−charge capacity)/theoretical capacity. For example, in the case where a secondary battery using $LiCoO_2$ as a positive electrode active material is charged to 219.2 mAh/g, it can be said that the positive electrode active material is represented by $Li_{0.2}CoO_2$ or x=0.2. Small x in $Li_xCoO_2$ means, for example, $0.1<x\leq 0.24$.

In the case where lithium cobalt oxide almost satisfies the stoichiometric ratio, lithium cobalt oxide is $LiCoO_2$ and the occupancy rate of Li in the lithium sites is x=1. For a secondary battery after its discharging ends, it can be said that lithium cobalt oxide is $LiCoO_2$ and x=1. Here, "discharging ends" means that a voltage becomes lower than or equal to 2.5 V (lithium counter electrode) at a current of 100 mA/g, for example. In a lithium-ion secondary battery, the voltage rapidly decreases when the occupancy rate of lithium in the lithium sites becomes x=1 and more lithium cannot enter the lithium-ion secondary battery. At this time, it can be said that discharging ends. In general, in a lithium-ion secondary battery using $LiCoO_2$, the discharge voltage rapidly decreases until discharge voltage reaches 2.5 V; thus, discharging ends under the above-described conditions.

In this specification and the like, the charge depth obtained when all the lithium that can be inserted into and extracted from a positive electrode material is inserted is 0, and the charge depth obtained when all the lithium that can be inserted into and extracted from the positive electrode active material is extracted is 1, in some cases. For example, when x in $Li_xMO_2$ is 1, the charge depth is 0; when x is 0, the charge depth is 1; and when x is 0.2, the charge depth is 0.8.

<Structure Example of Secondary Battery>

Hereinafter, a secondary battery in which a positive electrode, a negative electrode, and an electrolyte solution are wrapped in an exterior body is described as an example.

[Positive Electrode]

The positive electrode includes a positive electrode active material layer and a positive electrode current collector. The positive electrode active material layer contains a positive electrode active material, and may contain a conductive material described later and a binder.

[Negative Electrode]

The negative electrode includes a negative electrode active material layer and a negative electrode current collector. The negative electrode active material layer contains a negative electrode active material, and may contain the conductive material described later and the above-described binder.

[Current Collector]

For each of the positive electrode current collector and the negative electrode current collector, it is possible to use a material which has high conductivity and is not alloyed with carrier ions of lithium or the like, e.g., a metal such as stainless steel, gold, platinum, zinc, iron, copper, aluminum, or titanium, an alloy thereof, or the like. The current collector can have a sheet-like shape, a net-like shape, a punching-metal shape, an expanded-metal shape, or the like as appropriate. The current collector preferably has a thickness greater than or equal to 10 μm and less than or equal to 30 μm.

Note that a material that is not alloyed with carrier ions of lithium or the like is preferably used for the negative electrode current collector.

As the current collector, a titanium compound may be stacked over the above-described metal. As a titanium compound, for example, it is possible to use one selected from titanium nitride, titanium oxide, titanium nitride in which part of nitrogen is substituted by oxygen, titanium oxide in which part of oxygen is substituted by nitrogen, and titanium oxynitride ($TiO_xN_y$, where $0<x<2$ and $0<y<1$), or a mixture or a stack of two or more of them. Titanium nitride is particularly preferable because it has high conductivity and has a high capability of inhibiting oxidation. Forming a titanium compound over the surface of the current collector inhibits a reaction between a material contained in the active material layer formed over the current collector and the metal, for example. In the case where the active material layer contains a compound containing oxygen, an oxidation reaction between the metal and oxygen can be inhibited. In the case where aluminum is used for the current collector and the active material layer is formed using graphene oxide described later, for example, an oxidation reaction between oxygen contained in the graphene oxide and aluminum might occur. In such a case, forming a titanium compound over aluminum can inhibit an oxidation reaction between the current collector and the graphene oxide.

[Conductive Material]

A conductive material is also referred to as a conductivity-imparting agent or a conductive additive, and a carbon material is used. A conductive material is attached between a plurality of active materials, whereby the plurality of active materials are electrically connected to each other, and the conductivity increases. Note that the term "attach" refers not only to a state where an active material and a conductive material are physically in close contact with each other, and includes, for example, the following concepts: the case where covalent bonding occurs, the case where bonding with the Van der Waals force occurs, the case where a conductive material covers part of the surface of an active material, the case where a conductive material is embedded in surface roughness of an active material, and the case where an active material and a conductive material are electrically connected to each other without being in contact with each other.

An active material layer such as the positive electrode active material layer or the negative electrode active material layer preferably contains a conductive material.

For example, one kind or two or more kinds of carbon black such as acetylene black or furnace black, graphite such as artificial graphite or natural graphite, carbon fiber such as carbon nanofiber or carbon nanotube, and a graphene compound can be used as the conductive material.

Examples of the carbon fiber include mesophase pitch-based carbon fiber and isotropic pitch-based carbon fiber. Other examples of the carbon fiber include carbon nanofiber and carbon nanotube. Carbon nanotube can be formed by, for example, a vapor deposition method.

The active material layer may contain, as a conductive material, metal powder or metal fiber of copper, nickel, aluminum, silver, gold, or the like, a conductive ceramic material, or the like.

The content of the conductive additive to the total amount of the active material layer is preferably greater than or equal to 1 wt % and less than or equal to 10 wt %, further preferably greater than or equal to 1 wt % and less than or equal to 5 wt %.

Unlike a particulate conductive material such as carbon black, which makes point contact with an active material, the graphene compound is capable of making low-resistance surface contact; accordingly, the electrical conduction between the particulate active material and the graphene compound can be improved with a smaller amount of the graphene compound than that of a normal conductive material. This can increase the proportion of the active material in the active material layer. Thus, discharge capacity of the secondary battery can be increased.

A particulate carbon-containing compound such as carbon black or graphite and a fibrous carbon-containing compound such as carbon nanotube easily enter a microscopic space. A microscopic space means, for example, a region or the like between a plurality of active materials. When a carbon-containing compound that easily enters a microscopic space and a sheet-like carbon-containing compound, such as graphene, that can impart conductivity to a plurality of particles are used in combination, the density of the electrode is increased and an excellent conductive path can be formed.

[Binder]

The active material layer preferably includes a binder. The binder binds or fixes the electrolyte and the active material, for example. In addition, the binder can bind or fix the electrolyte and a carbon-based material, the active material and a carbon-based material, a plurality of active materials, a plurality of carbon-based materials, or the like.

As the binder, a material such as polystyrene, poly(methyl acrylate), poly(methyl methacrylate) (PMMA), sodium polyacrylate, polyvinyl alcohol (PVA), polyethylene oxide (PEO), polypropylene oxide, polyimide, polyvinyl chloride, polytetrafluoroethylene, polyethylene, polypropylene, polyisobutylene, polyethylene terephthalate, nylon, polyvinylidene fluoride (PVDF), polyacrylonitrile (PAN), ethylene-propylene-diene polymer, polyvinyl acetate, or nitrocellulose is preferably used.

Polyimide has extremely excellent thermal, mechanical, and chemical stability.

A fluorine polymer which is a high molecular material containing fluorine, specifically, polyvinylidene fluoride (PVDF) or the like can be used. PVDF is a resin having a melting point in the range of higher than or equal to 134° C. and lower than or equal to 169° C., and is a material with excellent thermal stability.

As the binder, a rubber material such as styrene-butadiene rubber (SBR), styrene-isoprene-styrene rubber, acrylonitrile-butadiene rubber, butadiene rubber, or an ethylene-propylene-diene copolymer is preferably used. Alternatively, fluororubber can be used as the binder.

As the binder, for example, water-soluble polymers are preferably used. As the water-soluble polymers, a polysaccharide can be used, for example. As the polysaccharide, starch, a cellulose derivative such as carboxymethyl cellulose (CMC), methyl cellulose, ethyl cellulose, hydroxypropyl cellulose, diacetyl cellulose, or regenerated cellulose, or the like can be used. It is further preferred that such water-soluble polymers be used in combination with any of the above rubber materials.

Two or more of the above materials may be used in combination for the binder.

<Graphene Compound>

A graphene compound in this specification and the like refers to graphene, multilayer graphene, multi graphene, graphene oxide, multilayer graphene oxide, multi graphene oxide, reduced graphene oxide, reduced multilayer graphene oxide, reduced multi graphene oxide, graphene quantum dots, and the like. A graphene compound contains carbon, has a plate-like shape, a sheet-like shape, or the like, and has a two-dimensional structure formed of a six-membered ring of carbon. The two-dimensional structure formed of the six-membered ring of carbon may be referred to as a carbon sheet. A graphene compound may include a functional group. The graphene compound is preferably bent. A graphene compound may be rounded like a carbon nanofiber.

In this specification and the like, for example, graphene oxide contains carbon and oxygen, has a sheet-like shape, and includes a functional group, in particular, an epoxy group, a carboxy group, or a hydroxy group.

In this specification and the like, reduced graphene oxide contains carbon and oxygen, has a sheet-like shape, and has a two-dimensional structure formed of a six-membered ring of carbon, for example. The reduced graphene oxide may also be referred to as a carbon sheet. Only one sheet of the reduced graphene oxide can function but may have a stacked structure of multiple sheets. The reduced graphene oxide preferably includes a portion where the carbon concentration is higher than 80 atomic % and the oxygen concentration is higher than or equal to 2 atomic % and lower than or equal to 15 atomic %. With such a carbon concentration and such an oxygen concentration, the reduced graphene oxide can function as a conductive material with high conductivity even with a small amount. In addition, the intensity ratio G/D of a G band to a D band of the Raman spectrum of the reduced graphene oxide is preferably 1 or more. The reduced graphene oxide with such an intensity ratio can function as a conductive material with high conductivity even with a small amount.

Reducing graphene oxide can form a vacancy in a graphene compound in some cases.

Furthermore, a material in which an end portion of graphene is terminated with fluorine may be used.

In the longitudinal cross section of the active material layer, the sheet-like graphene compounds are dispersed substantially uniformly in a region inside the active material layer. The plurality of graphene compounds are formed to partly cover the plurality of particulate active materials or adhere to the surfaces thereof, so that the graphene compounds make surface contact with the particulate active materials.

Here, the plurality of graphene compounds can be bonded to each other to form a net-like graphene compound sheet (hereinafter, referred to as a graphene compound net or a graphene net). A graphene net that covers the active material can function also as a binder for bonding the active materials. Accordingly, the amount of the binder can be reduced, or the binder does not have to be used. This can increase the proportion of the active material in the electrode volume and the electrode weight. That is to say, the charge and discharge capacity of the secondary battery can be increased.

Here, preferably, graphene oxide is used as the graphene compound and mixed with an active material to form a layer to be the active material layer, and then reduction is performed. In other words, the formed active material layer preferably contains reduced graphene oxide. When graphene oxide with extremely high dispersibility in a polar solvent is used to form the graphene compounds, the graphene compounds can be substantially uniformly dispersed in a region inside the active material layer. The solvent is removed by volatilization from a dispersion medium containing the uniformly dispersed graphene oxide to reduce the graphene oxide; hence, the graphene compounds remaining in the active material layer partly overlap with each other and are dispersed such that surface contact is made, thereby forming a three-dimensional conductive path. Note that graphene oxide can be reduced by heat treatment or with the use of a reducing agent, for example.

It is possible to form, with a spray dry apparatus, a graphene compound serving as a conductive material as a coating film to cover the entire surface of the active material in advance and to electrically connect the active materials by the graphene compound to form a conductive path.

A material used in formation of the graphene compound may be mixed with the graphene compound to be used for the active material layer. For example, particles used as a catalyst in formation of the graphene compound may be mixed with the graphene compound. As an example of the catalyst in formation of the graphene compound, particles containing any of silicon oxide ($SiO_2$ or $SiO_x$ ($x<2$)), aluminum oxide, iron, nickel, ruthenium, iridium, platinum, copper, germanium, and the like can be given. The average particle diameter (D50: also referred to as a median diameter) of the particles is preferably less than or equal to 1 μm, further preferably less than or equal to 100 nm.

[Separator]

A separator is positioned between the positive electrode and the negative electrode. The separator can be formed using, for example, a fiber containing cellulose, such as paper, nonwoven fabric, glass fiber, ceramics, or synthetic fiber containing nylon (polyamide), vinylon (polyvinyl alcohol-based fiber), polyester, acrylic, polyolefin, or polyurethane. The separator is preferably processed into a bag-like shape to enclose one of the positive electrode and the negative electrode.

The separator is a porous material having a pore with a diameter of approximately 20 nm, preferably a pore with a diameter of greater than or equal to 6.5 nm, further preferably a pore with a diameter of at least 2 nm.

The separator may have a multilayer structure. For example, an organic material film of polypropylene, polyethylene, or the like can be coated with a ceramic-based material, a fluorine-based material, a polyamide-based material, a mixture thereof, or the like. Examples of the ceramic-based material include aluminum oxide particles and silicon oxide particles. Examples of the fluorine-based material include PVDF and polytetrafluoroethylene. Examples of the polyamide-based material include nylon and aramid (meta-based aramid and para-based aramid).

When the separator is coated with the ceramic-based material, the oxidation resistance is improved; hence, deterioration of the separator in charging at high voltage and discharging can be suppressed and thus the reliability of the secondary battery can be improved. When the separator is coated with the fluorine-based material, the separator is easily brought into close contact with an electrode, resulting in high output characteristics. When the separator is coated with the polyamide-based material, in particular, aramid, the safety of the secondary battery is improved because heat resistance is improved.

For example, both surfaces of a polypropylene film may be coated with a mixed material of aluminum oxide and aramid. Alternatively, a surface of a polypropylene film that is in contact with the positive electrode may be coated with a mixed material of aluminum oxide and aramid, and a surface of the polypropylene film that is in contact with the negative electrode may be coated with the fluorine-based material.

With the use of a separator having a multilayer structure, the capacity per volume of the secondary battery can be increased because the safety of the secondary battery can be maintained even when the total thickness of the separator is small.

[Electrolyte]

In the case of using a liquid electrolyte for a secondary battery, one of ethylene carbonate (EC), propylene carbonate (PC), butylene carbonate, chloroethylene carbonate, vinylene carbonate, γ-butyrolactone, γ-valerolactone, dimethyl carbonate (DMC), diethyl carbonate (DEC), ethyl methyl carbonate (EMC), methyl formate, methyl acetate, ethyl acetate, methyl propionate, ethyl propionate, propyl propionate, methyl butyrate, 1,3-dioxane, 1,4-dioxane, dimethoxyethane (DME), dimethyl sulfoxide, diethyl ether, methyl diglyme, acetonitrile, benzonitrile, tetrahydrofuran, sulfolane, and sultone can be used, or two or more thereof can be used in an appropriate combination at an appropriate ratio as the electrolyte, for example.

Alternatively, the use of one or more ionic liquids (room temperature molten salts) that are less likely to burn and volatize as the solvent of the electrolyte can prevent a secondary battery from exploding or catching fire even when the secondary battery internally shorts out or the internal temperature increases owing to overcharging or the like. An ionic liquid contains a cation and an anion, specifically, an organic cation and an anion. Examples of the organic cation include aliphatic onium cations such as a quaternary ammonium cation, a tertiary sulfonium cation, and a quaternary phosphonium cation, and aromatic cations such as an imidazolium cation and a pyridinium cation. Examples of the anion include a monovalent amide-based anion, a monovalent methide-based anion, a fluorosulfonate anion, a perfluoroalkylsulfonate anion, a tetrafluoroborate anion, a perfluoroalkylborate anion, a hexafluorophosphate anion, and a perfluoroalkylphosphate anion.

In particular, in the case where silicon is used as the second active material included in the negative electrode in the secondary battery of one embodiment of the present invention, a liquid electrolyte containing an ionic liquid is preferably used.

The secondary battery of one embodiment of the present invention includes, as a carrier ion, an alkali metal ion such as a sodium ion or a potassium ion or an alkaline earth metal ion such as a calcium ion, a strontium ion, a barium ion, a beryllium ion, or a magnesium ion.

In the case where lithium ions are used as carrier ions, the electrolyte contains lithium salt, for example. As the lithium salt, $LiPF_6$, $LiClO_4$, $LiAsF_6$, $LiBF_4$, $LiAlCl_4$, LiSCN, LiBr, LiI, $Li_2SO_4$, $Li_2B_{10}Cl_{10}$, $Li_2B_{12}Cl_{12}$, $LiCF_3SO_3$, $LiC_4F_9SO_3$, $LiC(CF_3SO_2)_3$, $LiC(C_2F_5SO_2)_3$, $LiN(CF_3SO_2)_2$, $LiN(C_4F_9SO_2)(CF_3SO_2)$, $LiN(C_2F_5SO_2)_2$, or the like can be used, for example.

In addition, the electrolyte preferably contains fluorine. As the electrolyte containing fluorine, an electrolyte including one kind or two or more kinds of fluorinated cyclic carbonates and lithium ions can be used, for example. The fluorinated cyclic carbonate can improve the nonflammability and improve the safety of the lithium-ion secondary battery.

As the fluorinated cyclic carbonate, an ethylene fluoride carbonate such as monofluoroethylene carbonate (fluoroethylene carbonate, FEC or F1EC), difluoroethylene carbonate (DFEC or F2EC), trifluoroethylene carbonate (F3EC), or tetrafluoroethylene carbonate (F4EC) can be used. Note that DFEC includes an isomer such as cis-4,5 or trans-4,5. For operation at low temperatures, it is important that a lithium ion is solvated by using one kind or two or more kinds of fluorinated cyclic carbonates as the electrolyte and is transported in the electrolyte included in the electrode in charging and discharging. When the fluorinated cyclic carbonate is not used as a small amount of additive but is allowed to contribute to transportation of a lithium ion in charging and discharging, operation can be performed at low temperatures. In the secondary battery, a cluster of approximately several to several tens of lithium ions moves.

The use of the fluorinated cyclic carbonate for the electrolyte can reduce desolvation energy that is necessary for the solvated lithium ion in the electrolyte of the electrode to enter an active material particle. The reduction in the desolvation energy facilitates insertion or extraction of a lithium ion into/from the active material particle even in a low-temperature range. Although a lithium ion sometimes moves remaining in the solvated state, a hopping phenomenon in which coordinated solvent molecules are interchanged occurs in some cases. When desolvation of a lithium ion becomes easy, movement owing to the hopping phenomenon is facilitated and the lithium ion may easily move. A decomposition product of the electrolyte generated by charging and discharging of the secondary battery clings to the surface of the active material, which might cause deterioration of the secondary battery. However, since the electrolyte containing fluorine is smooth, the decomposition product of the electrolyte is less likely to attach to the surface of the active material. Therefore, the deterioration of the secondary battery can be suppressed.

In some cases, a plurality of solvated lithium ions form a cluster in the electrolyte and the cluster moves in the negative electrode, between the positive electrode and the negative electrode, or in the positive electrode, for example.

In this specification, an electrolyte is a general term of a solid material, a liquid material, a semi-solid-state material, and the like.

Deterioration is likely to occur at an interface existing in a secondary battery, e.g., an interface between an active material and an electrolyte. The secondary battery of one embodiment of the present invention includes the electrolyte containing fluorine, which can prevent deterioration that might occur at an interface between the active material and the electrolyte, typically, alteration of the electrolyte or a higher viscosity of the electrolyte. In addition, a structure may be employed in which a binder, a graphene compound, or the like clings to or is held by the electrolyte containing fluorine. This structure can maintain the state where the viscosity of the electrolyte is low, i.e., the state where the electrolyte is smooth, and can improve the reliability of the secondary battery. Note that DFEC to which two fluorine atoms are bonded and F4EC to which four fluorine atoms are bonded have lower viscosities, are smoother, and are coordinated to lithium more weakly than FEC to which one fluorine atom is bonded. Accordingly, it is possible to reduce attachment of a decomposition product with a high viscosity to an active material particle. When a decomposition product with a high viscosity is attached to or clings to an active material particle, a lithium ion is less likely to move at an interface between active material particles. The solvating fluorine-containing electrolyte reduces generation of a decomposition product that is to be attached to the surface of the active material (the positive electrode active material or the negative electrode active material). Moreover, the use of the electrolyte containing fluorine can prevent attachment of a decomposition product, which can prevent generation and growth of a dendrite.

The use of the electrolyte containing fluorine as a main component is also a feature, and the amount of the electrolyte containing fluorine is higher than or equal to 5 volume % or higher than or equal to 10 volume %, preferably higher than or equal to 30 volume % and lower than or equal to 100 volume %.

In this specification, a main component of an electrolyte occupies higher than or equal to 5 volume % of the whole electrolyte of a secondary battery. Here, "higher than or equal to 5 volume % of the whole electrolyte of a secondary battery" refers to the proportion in the whole electrolyte that is measured during manufacture of the secondary battery. In the case where a secondary battery is disassembled after manufactured, the proportions of a plurality of kinds of electrolytes are difficult to quantify, but it is possible to judge whether one kind of organic compound occupies higher than or equal to 5 volume % of the whole electrolyte.

With the use of the electrolyte containing fluorine, it is possible to provide a secondary battery that can operate in a wide temperature range, specifically, higher than or equal to −40° C. and lower than or equal to 150° C., preferably higher than or equal to −40° C. and lower than or equal to 85° C.

Furthermore, an additive such as vinylene carbonate, propane sultone (PS), tert-butylbenzene (TBB), lithium bis (oxalate)borate (LiBOB), or a dinitrile compound such as succinonitrile or adiponitrile may be added to the electrolyte. The concentration of the additive in the whole electrolyte is, for example, higher than or equal to 0.1 volume % and lower than 5 volume %.

The electrolyte may contain one or more of aprotic organic solvents such as γ-butyrolactone, acetonitrile, dimethoxyethane, and tetrahydrofuran, in addition to the above.

When a gelled high-molecular material is contained in the electrolyte, safety against liquid leakage and the like is improved. Typical examples of the gelled high-molecular material include a silicone gel, an acrylic gel, an acrylonitrile gel, a polyethylene oxide-based gel, a polypropylene oxide-based gel, and a gel of a fluorine-based polymer.

As the high-molecular material, for example, a polymer having a polyalkylene oxide structure, such as polyethylene oxide (PEO); PVDF; polyacrylonitrile; a copolymer containing any of them; and the like can be used. For example, PVDF-HFP, which is a copolymer of PVDF and hexafluoropropylene (HFP), can be used. The formed polymer may be porous.

Although the above structure is an example of a secondary battery using a liquid electrolyte, one embodiment of the present invention is not particularly limited thereto. For example, a semi-solid-state battery and an all-solid-state battery can be fabricated.

In this specification and the like, a layer provided between a positive electrode and a negative electrode is referred to as an electrolyte layer in both the case of a secondary battery using a liquid electrolyte and the case of a semi-solid-state battery. An electrolyte layer of a semi-solid-state battery is a layer formed by deposition, and can be distinguished from a liquid electrolyte layer.

In this specification and the like, a semi-solid-state battery refers to a battery in which at least one of an electrolyte layer, a positive electrode, and a negative electrode includes a semi-solid-state material. The semi-solid-state here does not mean that the proportion of a solid-state material is 50%. The semi-solid-state means having properties of a solid, such as a small volume change, and also having some of properties close to those of a liquid, such as flexibility. A single material or a plurality of materials can be used as long as the above properties are satisfied. For example, a porous solid-state material infiltrated with a liquid material may be used.

In this specification and the like, a polymer electrolyte secondary battery refers to a secondary battery in which an electrolyte layer between a positive electrode and a negative electrode contains a polymer. Polymer electrolyte secondary batteries include a dry (or intrinsic) polymer electrolyte battery and a polymer gel electrolyte battery.

The electrolyte contains a lithium-ion conductive polymer and a lithium salt.

In this specification and the like, the lithium-ion conductive polymer refers to a polymer having conductivity of cations such as lithium. More specifically, the lithium-ion conductive polymer is a high molecular compound containing a polar group to which cations can be coordinated. As the polar group, an ether group, an ester group, a nitrile group, a carbonyl group, siloxane, or the like is preferably included.

As the lithium-ion conductive polymer, for example, polyethylene oxide (PEO), a derivative containing polyethylene oxide as its main chain, polypropylene oxide, polyacrylic acid ester, polymethacrylic acid ester, polysiloxane, polyphosphazene, or the like can be used.

The lithium-ion conductive polymer may have a branched or cross-linking structure. Alternatively, the lithium-ion conductive polymer may be a copolymer. The molecular weight is preferably greater than or equal to ten thousand, further preferably greater than or equal to hundred thousand, for example.

In the lithium-ion conductive polymer, lithium ions move by changing polar groups to interact with, due to the local motion (also referred to as segmental motion) of polymer chains. In PEO, for example, lithium ions move by changing oxygen to interact with, due to the segmental motion of ether chains. When the temperature is close to or higher than the melting point or softening point of the lithium-ion conductive polymer, the crystal regions melt and amorphous regions increase, so that the motion of the ether chains becomes active and the ion conductivity increases. Thus, in the case where PEO is used as the lithium-ion conductive polymer, charging and discharging are preferably performed at higher than or equal to 60° C.

According to the ionic radius of Shannon (Shannon et al., Acta A 32 (1976) 751), the radius of a monovalent lithium ion is $0.590\times10^{-1}$ nm in the case of tetracoordination, $0.76\times10^{-1}$ nm in the case of hexacoordination, and $0.92\times10^{-1}$ nm in the case of octacoordination. The radius of a bivalent oxygen ion is $1.35\times10^{-1}$ nm in the case of bicoordination, $1.36\times10^{-1}$ nm in the case of tricoordination, $1.38\times10^{-1}$ nm in the case of tetracoordination, $1.40\times10^{-1}$ nm in the case of hexacoordination, and $1.42\times10^{-1}$ nm in the case of octacoordination. The distance between polar groups included in adjacent lithium-ion conductive polymer chains is preferably greater than or equal to the distance that allows lithium ions and anions contained in the polar groups to exist stably while the above ionic radius is maintained. Furthermore, the distance between the polar groups is preferably close enough to cause interaction between the lithium ions and the polar groups. Note that the distance is not necessarily always kept constant because the segmental motion occurs as described above. The distance needs to be appropriate only when lithium ions are transferred.

As the lithium salt, for example, it is possible to use a compound containing lithium and at least one of phosphorus, fluorine, nitrogen, sulfur, oxygen, chlorine, arsenic, boron, aluminum, bromine, and iodine. For example, one of lithium salts such as $LiPF_6$, $LiN(FSO_2)_2$ (lithiumbis(fluorosulfonyl)imide, LiFSI), $LiClO_4$, $LiAsF_6$, $LiBF_4$, $LiAlCl_4$, LiSCN, LiBr, LiI, $Li_2SO_4$, $Li_2B_{10}Cl_{10}$, $Li_2B_{12}Cl_{12}$, $LiCF_3SO_3$, $LiC_4F_9SO_3$, $LiC(CF_3SO_2)_3$, $LiC(C_2F_5SO_2)_3$, $LiN(CF_3SO_2)_2$, $LiN(C_4F_9SO_2)(CF_3SO_2)$, $LiN(C_2F_5SO_2)_2$, and lithium bis(oxalate)borate (LiBOB) can be used, or two or more of these lithium salts can be used in an appropriate combination at an appropriate ratio.

It is particularly preferable to use LiFSI because favorable characteristics at low temperatures can be obtained. Note that LiFSI and LiTFSA are less likely to react with water than LiPF6 or the like. This can relax the dew point control in fabricating an electrode and an electrolyte layer that use LiFSI. For example, the fabrication can be performed even in a normal air atmosphere, not only in an inert atmosphere of argon or the like in which moisture is excluded as much as possible or in a dry room in which a dew point is controlled. This is preferable because the productivity can be improved. When the segmental motion of ether chains is used for lithium conduction, it is particularly preferable to use a lithium salt that is highly dissociable and has a plasticizing effect, such as LiFSI and LiTFSA, in which case the operating temperature range can be wide.

When containing no or extremely little organic solvent, the secondary battery can be less likely to catch fire and ignite and thus can have higher level of safety, which is preferable. When the electrolyte is an electrolyte layer containing no or extremely little organic solvent, the electrolyte layer can have enough strength and thus can electrically insulate the positive electrode from the negative electrode without a separator. Since a separator is not necessary, the secondary battery can have high productivity. When an electrolyte layer contains the electrolyte and an inorganic filler, the secondary battery can have higher strength and higher level of safety.

[Exterior Body]

For an exterior body included in the secondary battery, a metal material such as aluminum and a resin material can be used, for example. A film-like exterior body can also be used. As the film, for example, it is possible to use a film having a three-layer structure in which a highly flexible metal thin film of aluminum, stainless steel, copper, nickel, or the like is provided over a film formed of a material such as polyethylene, polypropylene, polycarbonate, ionomer, or polyamide, and an insulating synthetic resin film of a polyamide-based resin, a polyester-based resin, or the like is provided over the metal thin film as the outer surface of the exterior body. As the film, a fluorine resin film is preferably used. The fluorine resin film has high stability to acid, alkali, an organic solvent, and the like and suppresses a side reaction, corrosion, or the like caused by a reaction of a secondary battery or the like, whereby an excellent secondary battery can be provided. Examples of the fluorine resin film include PTFE (polytetrafluoroethylene), PFA (perfluoroalkoxy alkane: a copolymer of tetrafluoroethylene and perfluoroalkyl vinyl ether), FEP (a perfluoroethylene-propene copolymer: a copolymer of tetrafluoroethylene and hexafluoropropylene), and ETFE (an ethylene-tetrafluoroethylene copolymer: a copolymer of tetrafluoroethylene and ethylene).

<Example of Negative Electrode Active Material>

As the negative electrode active material, it is preferable to use a material that can be reacted with a carrier ion of a secondary battery, a material into and from which a carrier ion can be inserted and extracted, a material capable of an alloying reaction with a metal that is to be a carrier ion, a material that can dissolve and precipitate a metal that is to be a carrier ion, or the like.

An example of the negative electrode active material is described below.

In addition, a metal or a compound containing one or more elements selected from silicon, tin, gallium, aluminum, germanium, lead, antimony, bismuth, silver, zinc, cadmium, and indium can be used as the negative electrode active material. Examples of an alloy-based compound using such elements include $Mg_2Si$, $Mg_2Ge$, $Mg_2Sn$, $SnS_2$, $V_2Sn_3$, $FeSn_2$, $CoSn_2$, $Ni_3Sn_2$, $Cu_6Sn_5$, $Ag_3Sn$, $Ag_3Sb$, $Ni_2MnSb$, $CeSb_3$, $LaSn_3$, $La_3Co_2Sn_7$, $CoSb_3$, InSb, and SbSn.

A material whose resistance is lowered by addition of an impurity element such as phosphorus, arsenic, boron, aluminum, or gallium to silicon may be used. A silicon material pre-doped with lithium may also be used. Examples of the pre-doping method include a method of annealing a mixture of silicon with lithium fluoride, lithium carbonate, or the like and a method of mechanical alloying a lithium metal and silicon. An electrode including silicon (a silicon electrode) is formed, and then lithium doping (pre-doping) can be performed through a charging and discharging reaction with a combination of the formed electrode and an electrode of a lithium metal or the like. After that, the silicon electrode subjected to doping is combined with a counter electrode (e.g., a positive electrode for a negative electrode subjected to the pre-doping), whereby a secondary battery may be fabricated.

Silicon nanoparticles can be used as the negative electrode active material, for example. The average particle diameter D50 of silicon nanoparticles is, for example, preferably greater than or equal to 5 nm and less than 1 μm, further preferably greater than or equal to 10 nm and less than or equal to 300 nm, still further preferably greater than or equal to 10 nm and less than or equal to 100 nm.

The silicon nanoparticles may have crystallinity. The silicon nanoparticles may include a region with crystallinity and an amorphous region.

As a material containing silicon, a material represented by $SiO_x$ (x is preferably less than 2, further preferably greater than or equal to 0.5 and less than or equal to 1.6) can be used, for example.

As the negative electrode active material, a carbon-based material such as graphite, graphitizing carbon, non-graphitizing carbon, carbon nanotube, carbon black, or a graphene compound can be used, for example.

Furthermore, as the negative electrode active material, an oxide including one or more elements selected from titanium, niobium, tungsten, and molybdenum can be used, for example.

As the negative electrode active material, a plurality of the above-described metals, materials, compounds, and the like can be combined to be used.

As the negative electrode active material, an oxide such as SnO, $SnO_2$, titanium dioxide ($TiO_2$), lithium titanium oxide ($Li_4Ti_5O_{12}$), a lithium-graphite intercalation compound ($Li_xC_6$), niobium pentoxide ($Nb_2O_5$), tungsten oxide ($WO_2$), or molybdenum oxide ($MoO_2$) can be used, for example.

Alternatively, as the negative electrode active material, $Li_{3-x}M_xN$ (M is Co, Ni, or Cu) with a $Li_3N$ structure, which is a composite nitride of lithium and a transition metal, can be used. For example, $Li_{2.6}Co_{0.4}N_3$ is preferable because of high charge and discharge capacity (900 mAh/g).

A composite nitride of lithium and a transition metal is preferably used as the negative electrode material, in which case the negative electrode material can be used in combination with a material for a positive electrode material that does not contain lithium ions, such as $V_2O_5$ or $Cr_3O_8$. Note that in the case of using a material containing lithium ions as a positive electrode material, the composite nitride of lithium and a transition metal can be used as the negative electrode material by extracting the lithium ions contained in the positive electrode material in advance.

A material that causes a conversion reaction can be used for the negative electrode active material. For example, a transition metal oxide that does not cause an alloying reaction with lithium, such as cobalt oxide (CoO), nickel oxide (NiO), or iron oxide (FeO), may be used for the negative electrode active material. Other examples of the material that causes a conversion reaction include oxides such as $Fe_2O_3$, CuO, $Cu_2O$, $RuO_2$, and $Cr_2O_3$, sulfides such as $CoS_{0.89}$, NiS, and CuS, nitrides such as $Zn_3N_2$, $Cu_3N$, and $Ge_3N_4$, phosphides such as $NiP_2$, $FeP_2$, and $CoP_3$, and fluorides such as $FeF_3$ and $BiF_3$. Note that any of the fluorides may be used as a positive electrode material because of its high potential.

Lithium can also be used as the negative electrode active material. In the case of using lithium as the negative electrode active material, lithium foil can be provided over the negative electrode current collector. Lithium may also be provided over the negative electrode current collector by a gas phase method such as an evaporation method or a sputtering method. In a solution containing lithium ions, lithium may be precipitated on the negative electrode current collector by an electrochemical method.

For the conductive material and the binder that can be included in the negative electrode active material layer, materials similar to those for the conductive material and the binder that can be included in the positive electrode active material layer can be used.

For the current collector, copper or the like can be used in addition to a material similar to that for the positive electrode current collector. Note that a material that is not alloyed with carrier ions of lithium or the like is preferably used for the negative electrode current collector.

As another form of the negative electrode of the present invention, a negative electrode that does not include a negative electrode active material can be used. In a secondary battery including the negative electrode that does not include a negative electrode active material, lithium can be precipitated on a negative electrode current collector at the time of charging, and lithium on the negative electrode current collector can be dissolved at the time of discharging. Thus, lithium is on the negative electrode current collector in the states except for the completely discharged state.

When the negative electrode that does not include a negative electrode active material is used, a film may be included over a negative electrode current collector for uniforming lithium deposition. For the film for uniforming lithium deposition, for example, a solid electrolyte having lithium ion conductivity can be used. As the solid electrolyte, a sulfide-particle-based solid electrolyte, an oxide-based solid electrolyte, or a polymer-based solid electrolyte can be used, for example. In particular, the polymer-based solid electrolyte can be uniformly formed as a film over a negative electrode current collector relatively easily, and thus is suitable as the film for uniforming lithium deposition.

When the negative electrode that does not include a negative electrode active material is used, a negative electrode current collector having unevenness can be used. When the negative electrode current collector having unevenness is used, a depression of the negative electrode current collector becomes a cavity in which lithium contained in the negative electrode current collector is easily deposited, so that the lithium can be prevented from having a dendrite-like shape when being deposited.

<Example of Positive Electrode Active Material>

Examples of a positive electrode active material include a lithium-containing composite oxide with an olivine crystal structure, a lithium-containing composite oxide with a layered rock-salt crystal structure, and a lithium-containing composite oxide with a spinel crystal structure.

As the positive electrode active material of one embodiment of the present invention, a positive electrode active material with a layered crystal structure is preferably used.

As a layered crystal structure, for example, a layered rock-salt crystal structure is given. As a composite oxide containing lithium with a layered rock-salt crystal structure, for example, it is possible to use a composite oxide containing lithium represented by $LiM_xO_y$ (x>0 and y>0, specifically y=2 and 0.8<x<1.2, for example). Here, M represents a metal element, which is preferably one or more selected from cobalt, manganese, nickel, and iron. Alternatively, M represents two or more selected from cobalt, manganese, nickel, iron, aluminum, titanium, zirconium, lanthanum, copper, and zinc, for example.

Examples of the composite oxide containing lithium represented by $LiM_xO_y$ include $LiCoO_2$, $LiNiO_2$, and $LiMnO_2$. In addition, a NiCo-based material represented by $LiNi_xCo_{1-x}O_2$ (0<x<1) is given and a NiMn-based material represented by $LiNi_xMn_{1-x}O_2$ (0<x<1) is given as an example of the composite oxide containing lithium represented by $LiM_xO_y$.

As a composite oxide containing lithium represented by $LiMO_2$, for example, a NiCoMn-based material (also referred to as NCM) represented by $LiNi_xCo_yMn_zO_2$ (x>0, y>0, and 0.8<x+y+z<1.2) is given. Specifically, 0.1x<y<8x and 0.1x<z<8x are preferably satisfied, for example. For example, x, y, and z preferably satisfy x:y:z=1:1:1 or the neighborhood thereof. Alternatively, for example, x, y, and z preferably satisfy x:y:z=5:2:3 or the neighborhood thereof. Alternatively, for example, x, y, and z preferably satisfy x:y:z=8:1:1 or the neighborhood thereof. Alternatively, for example, x, y, and z preferably satisfy x:y:z=9:0.5:0.5 or the neighborhood thereof. Alternatively, for example, x, y, and z preferably satisfy x:y:z=6:2:2 or the neighborhood thereof. Alternatively, for example, x, y, and z preferably satisfy x:y:z=1:4:1 or the neighborhood thereof.

The above-described NiCoMn-based material preferably contains one or more selected from aluminum, magnesium, titanium, and boron at higher than or equal to 0.1 mol % and lower than or equal to 3 mol %.

As a composite oxide containing lithium with a layered rock-salt crystal structure, $Li_2MnO_3$ and $Li_2MnO_3$—$LiMeO_2$ (Me represents Co, Ni, or Mn) are given, for example.

With the use of a positive electrode active material with a layered crystal structure typified by the above-described composite oxide containing lithium, a secondary battery with a high lithium content per volume and high capacity per volume can be provided in some cases. In such a positive electrode active material, the amount of lithium extracted during charging per volume is large; thus, in order to perform stable charging and discharging, the crystal structure after the extraction needs to be stabilized. Collapse of the crystal structure in charging and discharging may hinder fast charging and fast discharging.

As the positive electrode active material, it is preferable to mix lithium nickel oxide ($LiNiO_2$ or $LiNi_{1-x}M_xO_2$ (0<x<1) (M=Co, Al, or the like)) with a lithium-containing material that has a spinel crystal structure and contains manganese, such as $LiMn_2O_4$. This composition can improve the characteristics of the secondary battery.

As the positive electrode active material, a lithium-manganese composite oxide represented by a composition formula $Li_aMn_bM_cO_d$ can be used. Here, the element M is preferably silicon, phosphorus, or a metal element other than lithium and manganese, further preferably nickel. In the case where the whole particle of a lithium-manganese composite oxide is measured, it is preferable to satisfy the following at the time of discharging: 0<a/(b+c)<2; c>0; and 0.26≤(b+c)/d<0.5. Note that the proportions of metals, silicon, phosphorus, and the like in the whole particle of a lithium-manganese composite oxide can be measured with, for example, an ICP-MS (inductively coupled plasma mass spectrometer). The proportion of oxygen in the whole particle of a lithium-manganese composite oxide can be measured by, for example, EDX (energy dispersive X-ray spectroscopy). Alternatively, the proportion of oxygen can be measured by ICPMS combined with fusion gas analysis and valence evaluation of XAFS (X-ray absorption fine structure) analysis. Note that the lithium-manganese composite oxide is an oxide containing at least lithium and manganese, and may contain at least one selected from chromium, cobalt, aluminum, nickel, iron, magnesium, molybdenum, zinc, indium, gallium, copper, titanium, niobium, silicon, phosphorus, and the like.

[Structure of Positive Electrode Active Material]

A positive electrode active material of one embodiment of the present invention is described with reference to FIG. 6 to FIG. 10.

Figure 6A:
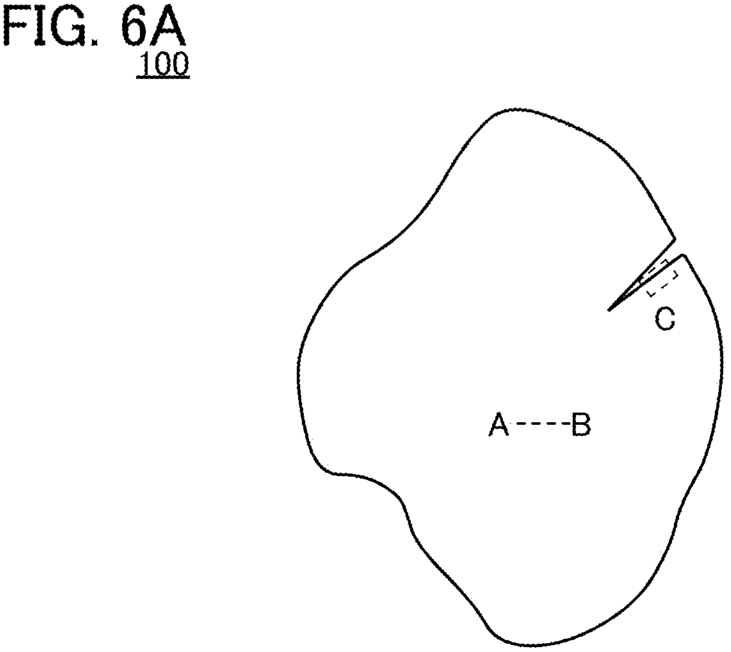
FIG. 6A is a top view of a positive electrode active material of one embodiment of the present invention.
Figure 6B:
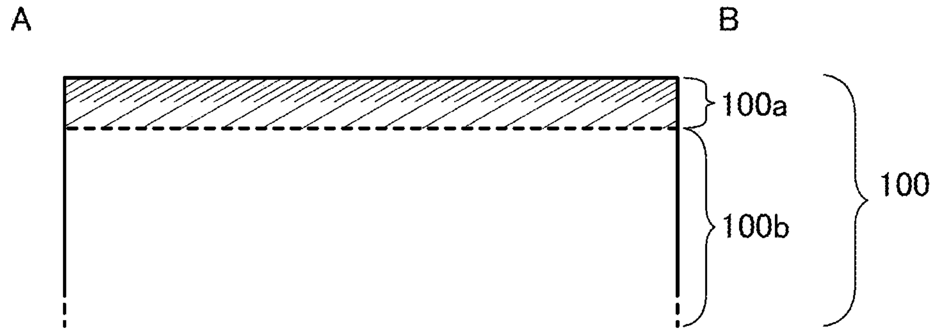
FIG. 6B and FIG. 6C are cross-sectional views of the positive electrode active material of one embodiment of the present invention.
Figure 6C:
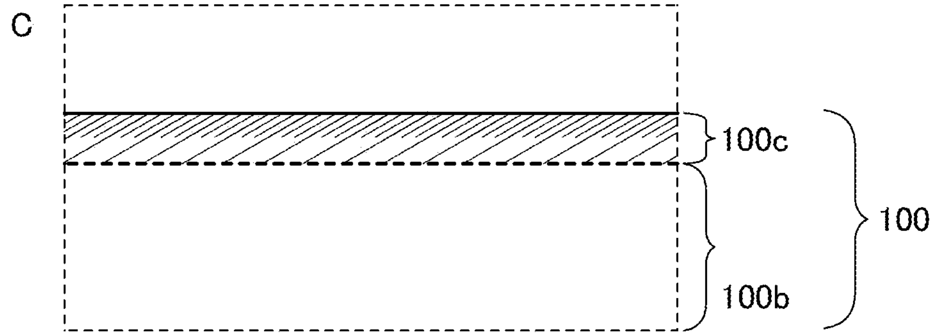

FIG. 6A is a schematic top view of a positive electrode active material 100 which is one embodiment of the present invention. FIG. 6B is a schematic cross-sectional view taken along A-B in FIG. 6A. FIG. 6C is a schematic cross-sectional view of a region C in FIG. 6A.

<Contained Elements and Distribution>

The positive electrode active material 100 contains lithium, a transition metal M1, oxygen, and an additive element X. The positive electrode active material 100 can be regarded as a composite oxide represented by $LiM1O_2$ (M1 is one or more selected from Fe, Ni, Co, and Mn) to which the additive element X is added.

As the transition metal M1 contained in the positive electrode active material 100, a metal that can form, together with lithium, a composite oxide having the layered rock-salt structure belonging to the space group R-3m is preferably used. For example, at least one of manganese, cobalt, and nickel can be used as the transition metal M1. That is, as the transition metal contained in the positive electrode active material 100, only cobalt may be used, only nickel may be used, two metals of cobalt and manganese may be used or two metals of cobalt and nickel may be used, or three metals of cobalt, manganese, and nickel may be used. In other words, the positive electrode active material 100 can include a composite oxide containing lithium and the transition metal, such as lithium cobalt oxide, lithium nickel oxide, lithium cobalt oxide in which manganese is substituted for part of cobalt, lithium cobalt oxide in which nickel is substituted for part of cobalt, or lithium nickel-manganese-cobalt oxide. Nickel is preferably contained as the transition metal in addition to cobalt, in which case a crystal structure may be more stable in a charged state at a deep charge depth of 0.8 or more (x=less than 0.2).

As the additive element X contained in the positive electrode active material 100, one or more selected from nickel, cobalt, magnesium, calcium, chlorine, fluorine, aluminum, manganese, titanium, zirconium, yttrium, vanadium, iron, chromium, niobium, lanthanum, hafnium, zinc, silicon, sulfur, phosphorus, boron, and arsenic are preferably used. These elements further stabilize the crystal structure of the positive electrode active material 100 in some cases. The positive electrode active material 100 can contain lithium cobalt oxide containing magnesium and fluorine; lithium cobalt oxide containing magnesium, fluorine, and titanium; lithium nickel-cobalt oxide containing magnesium and fluorine; lithium cobalt-aluminum oxide containing magnesium and fluorine; lithium nickel-cobalt-aluminum oxide; lithium nickel-cobalt-aluminum oxide containing magnesium and fluorine; lithium nickel-manganese-cobalt oxide containing magnesium and fluorine; or the like. In this specification and the like, the additive element X may be rephrased as a constituent of a mixture or a raw material or the like.

As illustrated in FIG. 6B, the positive electrode active material 100 includes a surface portion 100*a* and an inner portion 100*b*. The surface portion 100*a* preferably has a higher concentration of the additive element X than the inner portion 100*b*. The concentration of the additive element X preferably has a gradient as illustrated in FIG. 6B by gradation, in which the concentration increases from the inner portion toward the surface. In this specification and the like, the surface portion 100*a* refers to a region within approximately 10 nm from a surface of the positive electrode active material 100. A plane generated by a split and/or a crack may also be referred to as a surface, and a region within approximately 10 nm from the surface is referred to as a surface portion 100*c* as illustrated in FIG. 6C. A region which is deeper than the surface portion 100*a* and the surface portion 100*c* of the positive electrode active material 100 is referred to as the inner portion 100*b*.

In order to prevent the breakage of a layered structure formed of octahedrons of cobalt and oxygen even when lithium is extracted from the positive electrode active material 100 of one embodiment of the present invention by charging, the surface portion 100*a* having a high concentration of the additive element X, i.e., the outer portion of a particle, is reinforced.

The concentration gradient of the additive element X preferably exists uniformly in the entire surface portion 100*a* of the positive electrode active material 100. A situation where only part of the surface portion 100*a* has reinforcement is not preferable because stress might be concentrated on parts that do not have reinforcement. The concentration of stress on part of a particle might cause defects such as cracks from that part, leading to breakage of the positive electrode active material and a decrease in charge and discharge capacity.

Magnesium is divalent and is more stable in lithium sites than in transition metal sites in the layered rock-salt crystal structure; thus, magnesium is likely to enter the lithium sites. An appropriate concentration of magnesium in the lithium sites of the surface portion 100*a* facilitates maintenance of the layered rock-salt crystal structure. The bonding strength of magnesium with oxygen is high, thereby inhibiting extraction of oxygen around magnesium. An appropriate concentration of magnesium does not have an adverse effect on insertion and extraction of lithium in charging and discharging, and is thus preferable. However, excess magnesium might adversely affect insertion and extraction of lithium.

Aluminum is trivalent and can exist at a transition metal site in the layered rock-salt crystal structure. Aluminum can inhibit dissolution of surrounding cobalt. The bonding strength of aluminum with oxygen is high, thereby inhibiting extraction of oxygen around aluminum. Hence, aluminum contained as the additive element X enables the positive electrode active material 100 to have the crystal structure that is unlikely to be broken by repetitive charging and discharging.

When fluorine, which is a monovalent anion, is substituted for part of oxygen in the surface portion 100*a*, the lithium extraction energy is lowered. This is because the change in the valence of cobalt ions associated with lithium extraction differs depending on the presence or absence of fluorine. For example, the change in the valence of cobalt ions is trivalent to tetravalent in the case of not containing fluorine and divalent to trivalent in the case of containing fluorine, and the oxidation-reduction potential of cobalt ions differs therebetween. It can thus be said that when fluorine is substituted for part of oxygen in the surface portion 100*a* of the positive electrode active material 100, lithium ions near fluorine are likely to be extracted and inserted smoothly. Thus, using such a positive electrode active material 100 in a secondary battery is preferable because the charge and discharge characteristics, rate performance, and the like are improved.

A titanium oxide is known to have superhydrophilicity. Accordingly, the positive electrode active material 100 including an oxide of titanium in the surface portion 100*a* presumably has good wettability with respect to a high-polarity solvent. Such the positive electrode active material 100 and a high-polarity electrolyte solution can have favorable contact at the interface therebetween and presumably inhibit a resistance increase when a secondary battery is formed using the positive electrode active material 100. Note that in this specification and the like, an electrolyte solution corresponds to a liquid electrolyte.

The voltage of a positive electrode generally increases with increasing charge voltage of a secondary battery. The positive electrode active material of one embodiment of the present invention has a stable crystal structure even at high voltage. The stable crystal structure of the positive electrode active material in a charged state can inhibit a capacity decrease due to repetitive charging and discharging.

A short circuit of a secondary battery might cause not only malfunction in charge operation and/or discharge operation of the secondary battery but also heat generation and firing. In order to obtain a safe secondary battery, a short-circuit current is preferably inhibited even at high charge voltage. In the positive electrode active material 100 of one embodiment of the present invention, a short-circuit current is inhibited even at high charge voltage. Thus, a secondary battery with high capacity and safety can be obtained.

It is preferable that a secondary battery using the positive electrode active material 100 of one embodiment of the present invention have high capacity, excellent charge and discharge cycle performance, and safety simultaneously.

The gradient of the concentration of the additive element X can be evaluated using energy dispersive X-ray spectroscopy (EDX). In the EDX measurement, to measure a region while scanning the region and evaluate the region two-dimensionally is referred to as EDX planar analysis in some cases. In addition, to extract data of a linear region from EDX planar analysis and evaluate the atomic concentration distribution in a positive electrode active material particle is referred to as linear analysis in some cases.

By EDX planar analysis (e.g., element mapping), the concentrations of the additive element X in the surface portion 100*a*, the inner portion 100*b*, the vicinity of the crystal grain boundary, and the like of the positive electrode active material 100 can be quantitatively analyzed. By EDX linear analysis, the concentration distribution of the additive element X can be analyzed.

When the positive electrode active material 100 is analyzed with the EDX linear analysis, a peak of the magnesium concentration (the position where the concentration is the highest) in the surface portion 100*a* preferably exists in a region from the surface of the positive electrode active material 100 to a depth of 3 nm toward the center, further preferably to a depth of 1 nm, and still further preferably to a depth of 0.5 nm.

In addition, the distribution of fluorine contained in the positive electrode active material 100 preferably overlaps with the distribution of magnesium. Thus, when the EDX linear analysis is performed, a peak of the fluorine concentration (the position where the concentration is the highest) in the surface portion 100*a* preferably exists in a region from the surface of the positive electrode active material 100 to a depth of 3 nm toward the center, further preferably to a depth of 1 nm, and still further preferably to a depth of 0.5 nm.

Note that the concentration distribution may differ between the additive elements X. For example, in the case where the positive electrode active material 100 contains aluminum as the additive element X, the distribution of aluminum is preferably slightly different from that of magnesium and that of fluorine. For example, in the EDX linear analysis, the peak of the magnesium concentration is preferably closer to the surface than the peak of the aluminum concentration is in the surface portion 100*a*. For example, the peak of the aluminum concentration preferably exists in a region from the surface of the positive electrode active material 100 to a depth of 0.5 nm or more and 20 nm or less toward the center, and further preferably to a depth of 1 nm or more and 5 nm or less.

When the EDX linear analysis or the EDX planar analysis is performed on the positive electrode active material 100, the proportion of the number of atoms of the additive element X to the number of atoms of the transition metal M1 (X/M1) in the vicinity of the grain boundary is preferably greater than or equal to 0.020 and less than or equal to 0.50. It is further preferably greater than or equal to 0.025 and less than or equal to 0.30. It is still further preferably greater than or equal to 0.030 and less than or equal to 0.20. For example, when the additive element X is magnesium and the transition metal M1 is cobalt, the proportion of the number of magnesium atoms to the number of cobalt atoms (Mg/Co) in the vicinity of the grain boundary is preferably greater than or equal to 0.020 and less than or equal to 0.50. It is further preferably greater than or equal to 0.025 and less than or equal to 0.30. It is still further preferably greater than or equal to 0.030 and less than or equal to 0.20.

As described above, an excess amount of the additive element in the positive electrode active material 100 might adversely affect insertion and extraction of lithium. The use of such a positive electrode active material 100 for a secondary battery might cause a resistance increase, a capacity decrease, and the like. Meanwhile, when the amount of additive is insufficient, the additive element is not distributed over the whole surface portion 100*a*, which might reduce the effect of maintaining the crystal structure. In this manner, the additive element X is adjusted so as to obtain an appropriate concentration in the positive electrode active material 100.

For this reason, the positive electrode active material 100 may include a region where excess additive element X is unevenly distributed, for example. With such a region, the excess additive element X is removed from the other region, and the additive element X concentration in most of the inner portion and the surface portion of the positive electrode active material 100 can be appropriate. An appropriate additive element X concentration in most of the inner portion and the surface portion of the positive electrode active material 100 can inhibit a resistance increase, a capacity decrease, and the like when the positive electrode active material 100 is used for a secondary battery. A feature of inhibiting a resistance increase of a secondary battery is extremely preferable especially in charging and discharging at a high rate.

In the positive electrode active material 100 including the region where the excess additive element X is unevenly distributed, mixing of the excess additive element X to some extent in the formation process is acceptable. This is preferable because the margin of production can be increased.

Note that in this specification and the like, uneven distribution means that the concentration of an element differs between a region A and a region B. It may be rephrased as segregation, precipitation, unevenness, deviation, high concentration, low concentration, or the like.

<Crystal Structure>

A material with the layered rock-salt crystal structure, such as lithium cobalt oxide ($LiCoO_2$), is known to have a high discharge capacity and excel as a positive electrode active material of a secondary battery. As an example of the material with the layered rock-salt crystal structure, a composite oxide represented by $LiM1O_2$ (M1 is one or more selected from Fe, Ni, Co, and Mn) is given.

It is known that the Jahn-Teller effect in a transition metal compound varies in degree according to the number of electrons in the d orbital of the transition metal.

In a compound containing nickel, distortion is likely to be caused because of the Jahn-Teller effect in some cases. Accordingly, when deep-depth charging at a charge depth of 0.8 or more (x=less than 0.2) and discharging are repeatedly performed on $LiNiO_2$, the crystal structure might be broken because of the distortion. The influence of the Jahn-Teller effect is suggested to be small in $LiCoO_2$; hence, $LiCoO_2$ is preferable because the resistance to the repetition of deep-depth charging at a charge depth of 0.8 or more (x=less than 0.2) and discharging is higher in some cases.

Positive electrode active materials are described with reference to FIG. 7 to FIG. 10. In FIG. 7 to FIG. 10, the case where cobalt is used as the transition metal contained in the positive electrode active material is described.

<Conventional Positive Electrode Active Material>

Figure 9:
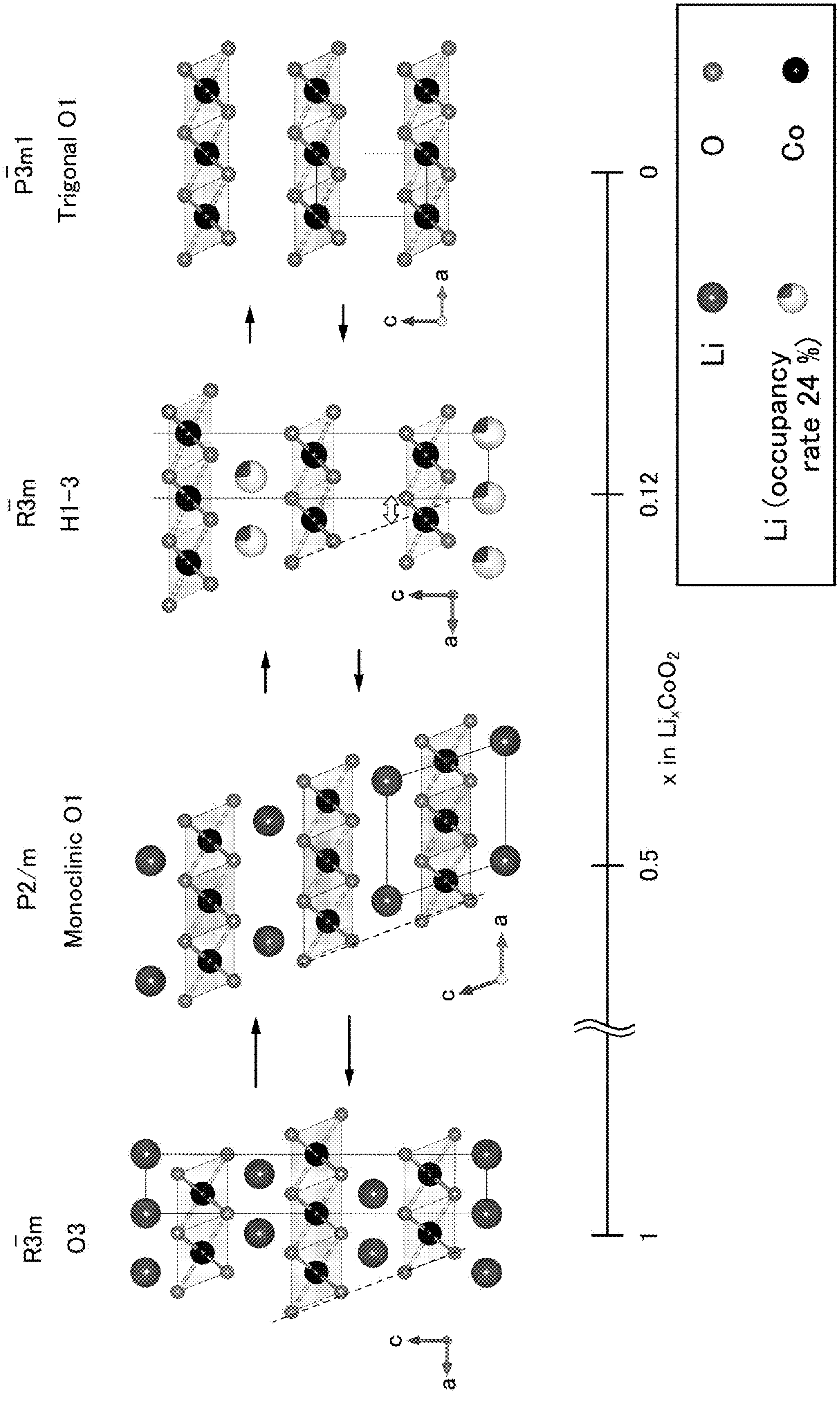
FIG. 9 is a diagram illustrating crystal structures of a positive electrode active material of a comparative example.

A positive electrode active material illustrated in FIG. 9 is lithium cobalt oxide ($LiCoO_2$ or LCO) to which halogen and magnesium are not added. The crystal structure of the lithium cobalt oxide illustrated in FIG. 9 changes depending on the charge depth. In other words, the crystal structure changes depending on the occupancy rate x of lithium in the lithium sites when the lithium cobalt oxide is referred to as $Li_xCoO_2$.

As illustrated in FIG. 9, lithium cobalt oxide in a state with x of 1 (discharged state) includes a region having the crystal structure belonging to the space group R-3m, and includes three $CoO_2$ layers in a unit cell. Thus, this crystal structure is referred to as an O3 type crystal structure in some cases. Note that the $CoO_2$ layer has a structure in which an octahedral structure with cobalt coordinated to six oxygen atoms continues in a plane direction in an edge-shared state.

Conventional lithium cobalt oxide with x of approximately 0.5 is known to have an improved symmetry of lithium and have a monoclinic crystal structure belonging to the space group P2/m. This structure includes one $CoO_2$ layer in a unit cell. Thus, this crystal structure is referred to as a monoclinic O1 type structure in some cases. Lithium cobalt oxide with x of 0 has a trigonal crystal structure belonging to the space group P-3 m1 and includes one $CoO_2$ layer in a unit cell. Thus, this crystal structure is referred to as a trigonal O1 type crystal structure in some cases.

Lithium cobalt oxide with x of approximately 0.12 has the crystal structure belonging to the space group R-3m. This structure can also be regarded as a structure in which $CoO_2$ structures such as P-3m1 (O1) and $LiCoO_2$ structures such as R-3m (O3) are alternately stacked. Thus, this crystal structure is referred to as an H1-3 type crystal structure in some cases. Since insertion and extraction of lithium do not necessarily uniformly occur, the H1-3 type crystal structure is started to be observed when x is approximately 0.25 in practice. The number of cobalt atoms per unit cell in the actual H1-3 type crystal structure is twice that in other structures. However, in this specification including FIG. 9, the c-axis of the H1-3 type crystal structure is half that of the unit cell for easy comparison with the other crystal structures.

For the H1-3 type crystal structure, the coordinates of cobalt and oxygen in the unit cell can be expressed as follows, for example: Co (0, 0, 0.42150±0.00016), O1(0, 0, 0.27671±0.00045), and O2 (0, 0, 0.11535±0.00045). Note that O1 and O2 are each an oxygen atom. In this manner, the H1-3 type crystal structure is represented by a unit cell including one cobalt atom and two oxygen atoms. Meanwhile, the O3' type crystal structure of embodiments of the present invention are preferably represented by a unit cell including one cobalt atom and one oxygen atom, as described later. This means that the symmetry of cobalt and oxygen differs between the O3' type crystal structure and the H1-3 type structure, and the amount of change from the O3 structure is smaller in the O3' type crystal structure than in the H1-3 type structure. A preferred unit cell for representing a crystal structure in a positive electrode active material is selected such that the value of GOF (goodness of fit) is smaller in Rietveld analysis of XRD patterns, for example.

When charging at a high charge voltage of 4.6 V or more with reference to the redox potential of a lithium metal or charging with a large depth with x of 0.24 or less and discharging are repeated, the crystal structure of lithium cobalt oxide changes (i.e., an unbalanced phase change occurs) repeatedly between the H1-3 type crystal structure and the structure belonging to R-3m (O3) in a discharged state.

However, there is a large shift in the $CoO_2$ layers between these two crystal structures. As denoted by the dotted lines and the arrow in FIG. 9, the $CoO_2$ layer in the H1-3 type crystal structure largely shifts from R-3m (O3). Such a dynamic structural change can adversely affect the stability of the crystal structure.

A difference in volume is also large. The O3 type crystal structure in a discharged state and the H1-3 type crystal structure which contain the same number of cobalt atoms have a difference in volume of more than or equal to 3.0%.

In addition, a structure in which $CoO_2$ layers are arranged continuously, such as P-3 m1 (O1), included in the H1-3 type crystal structure is highly likely to be unstable.

Thus, the repetition of deep-depth charging at a charge depth of 0.8 or more (x=less than 0.2) and discharging causes loss of the crystal structure of lithium cobalt oxide. The broken crystal structure triggers deterioration of the cycle performance. This is probably because the loss of the crystal structure reduces sites where lithium can stably exist and makes it difficult to insert and extract lithium.

<Positive Electrode Active Material of One Embodiment of the Present Invention>

<Inner Portion>

In the positive electrode active material 100 of one embodiment of the present invention, the shift in $CoO_2$ layers can be small in repeated deep-depth charging at a charge depth of 0.8 or more and discharging. Furthermore, the change in the volume can be small. Accordingly, the positive electrode active material of one embodiment of the present invention can enable excellent cycle performance. In addition, the positive electrode active material of one embodiment of the present invention can have a stable crystal structure in a charged state with a deep charge depth of 0.8 or more. Thus, the positive electrode active material of one embodiment of the present invention inhibits a short circuit in some cases while the charged state with a deep charge depth of 0.8 or more is maintained. This is preferable because the safety is further improved.

The positive electrode active material of one embodiment of the present invention has a small crystal-structure change and a small volume difference per the same number of atoms of the transition metal between a sufficiently discharged state and a state charged to a deep charge depth of 0.8 or more.

Figure 7:
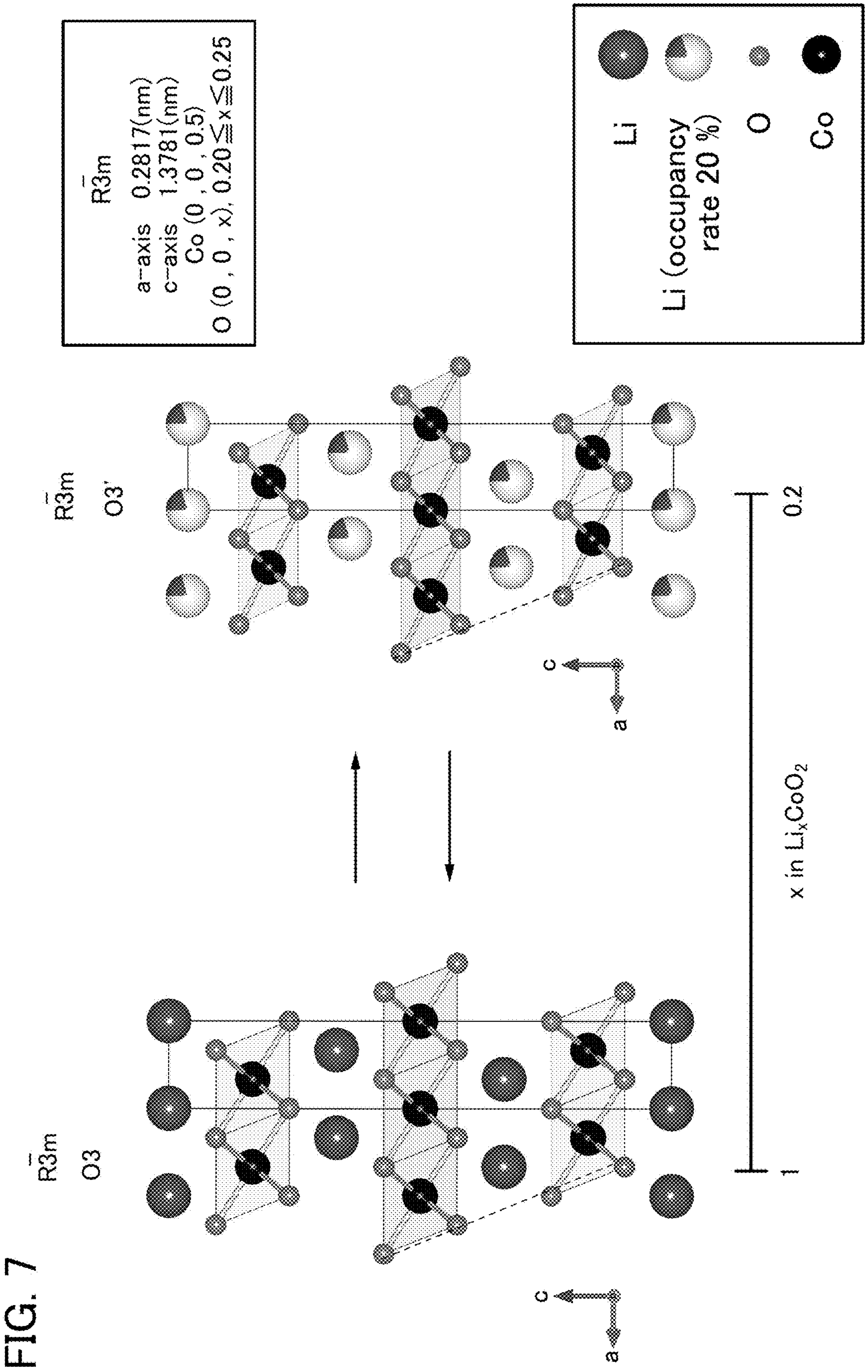
FIG. 7 is a diagram illustrating crystal structures of a positive electrode active material of one embodiment of the present invention.

FIG. 7 illustrates the crystal structures of the positive electrode active material 100 before and after being charged and discharged. The positive electrode active material 100 is a composite oxide containing lithium, cobalt as the transition metal, and oxygen. In addition to the above, the positive electrode active material 100 preferably contains magnesium as the additive element X. Furthermore, the positive electrode active material 100 preferably contains halogen such as fluorine or chlorine as the additive element X.

The crystal structure with x of 1 (discharged state) in FIG. 7 is R-3m (O3), which is the same as that in FIG. 9. Meanwhile, the positive electrode active material 100 of one embodiment of the present invention in a sufficiently charged state includes a crystal whose structure is different from the H1-3 type crystal structure. This structure belongs to the space group R-3m and is a structure in which an ion of cobalt, magnesium, or the like occupies a site coordinated to six oxygen atoms. Furthermore, the symmetry of $CoO_2$ layers of this structure is the same as that in an O3 type crystal structure. This structure is thus referred to as the O3' type crystal structure in this specification and the like. Note that although the indication of lithium is omitted in the diagram of the O3' type crystal structure illustrated in FIG. 7 to explain the symmetry of cobalt atoms and the symmetry of oxygen atoms, a lithium of 20 atomic % or less, for example, with respect to cobalt practically exists between the $CoO_2$ layers. In addition, in both the O3 type crystal structure and the O3' type crystal structure, a slight amount of magnesium preferably exists between the $CoO_2$ layers, i.e., in lithium sites. In addition, a slight amount of halogen such as fluorine preferably exists at random in oxygen sites.

Note that in the O3' type crystal structure, a light element such as lithium sometimes occupies a site coordinated to four oxygen atoms.

The O3' type crystal structure can be regarded as a crystal structure that contains lithium between layers randomly and is similar to a CdCl2 crystal structure. The crystal structure similar to the $CdCl_2$ crystal structure is close to a crystal structure of lithium nickel oxide when charged until x becomes 0.06 ($Li_{0.06}NiO_2$); however, pure lithium cobalt oxide or a layered rock-salt positive electrode active material containing a large amount of cobalt is known not to have this crystal structure in general.

In the positive electrode active material 100 of one embodiment of the present invention, a change in the crystal structure caused when a large amount of lithium is extracted by charging to a deep charge depth of 0.8 or more is smaller than that in a conventional positive electrode active material. As indicated by dotted lines in FIG. 7, for example, $CoO_2$ layers hardly shift between the crystal structures.

Specifically, the crystal structure of the positive electrode active material 100 of one embodiment of the present invention is highly stable even when charge voltage is high. For example, at a charge voltage that makes a conventional positive electrode active material have the H1-3 type crystal structure, for example, at a voltage of approximately 4.6 V with reference to the potential of a lithium metal, the crystal structure belonging to R-3m (O3) can be maintained. Moreover, in a higher charge voltage range, for example, at voltages of approximately 4.65 V to 4.7 V with reference to the potential of a lithium metal, the O3' type crystal structure can be obtained. At a much higher charge voltage, a H1-3 type crystal is eventually observed in some cases. In the case where graphite, for instance, is used as a negative electrode active material in a secondary battery, a charge voltage region where the R-3m (O3) crystal structure can be maintained exists when the voltage of the secondary battery is, for example, higher than or equal to 4.3 V and lower than or equal to 4.5 V. In a higher charge voltage region, for example, at a voltage higher than or equal to 4.35 V and lower than or equal to 4.55 V with reference to the potential of a lithium metal, there is a region within which the O3' type crystal structure can be obtained.

Thus, in the positive electrode active material 100 of one embodiment of the present invention, the crystal structure is unlikely to be broken even when deep-depth charging at a charge depth of 0.8 or more and discharging are repeated.

In addition, in the positive electrode active material 100, a difference in the volume per unit cell between the O3 type crystal structure with x of 1 and the O3' type crystal structure with x of 0.2 is less than or equal to 2.5%, specifically, less than or equal to 2.2%.

Note that in the unit cell of the O3' type crystal structure, the coordinates of cobalt and oxygen can be represented by Co (0, 0, 0.5) and O (0, 0, x) within the range of $0.20 \leq x \leq 0.25$.

A slight amount of the additive element X such as magnesium randomly existing between the CoO2 layers, i.e., in lithium sites, can inhibit a shift in the CoO2 layers. Thus, magnesium between the $CoO_2$ layers makes it easier to obtain the O3' type crystal structure. Therefore, magnesium is distributed in at least part of the surface portion of the particle of the positive electrode active material 100 of one embodiment of the present invention, preferably distributed throughout the surface portion of the particle of the positive electrode active material 100. To distribute magnesium throughout the surface portion of the particle of the positive electrode active material 100, heat treatment is preferably performed in the formation process of the positive electrode active material 100 of one embodiment of the present invention.

However, cation mixing occurs when the heat treatment temperature is excessively high, so that the additive element X, e.g., magnesium, is highly likely to enter the cobalt sites. Magnesium existing in the cobalt sites does not have the effect of maintaining the R-3m structure in a high-voltage charged state. Furthermore, heat treatment at an excessively high temperature might have an adverse effect; for example, cobalt might be reduced to have a valence of two or lithium might be evaporated or sublimated.

In view of the above, a halogen compound such as a fluorine compound is preferably added to lithium cobalt oxide before the heat treatment for distributing magnesium throughout the surface portion of the particle of the positive electrode active material 100. The addition of the halogen compound decreases the melting point of lithium cobalt oxide. The decreased melting point makes it easier to distribute magnesium throughout the surface portion of the particle of the positive electrode active material 100 at a temperature at which the cation mixing is unlikely to occur. Furthermore, the fluorine compound probably increases corrosion resistance to hydrofluoric acid generated by decomposition of an electrolyte solution.

When the magnesium concentration is higher than or equal to a desired value, the effect of stabilizing a crystal structure becomes small in some cases. This is probably because magnesium enters the cobalt sites in addition to the lithium sites. The number of magnesium atoms in the positive electrode active material of one embodiment of the present invention is preferably larger than or equal to 0.001 times and less than or equal to 0.1 times, further preferably larger than 0.01 times and less than 0.04 times, still further preferably approximately 0.02 times the number of transition metal atoms such as cobalt atoms. The magnesium concentration described here may be a value obtained by element analysis on the whole of the positive electrode active material using ICP-MS or the like, or may be a value based on the ratio of the raw materials mixed in the process of forming the positive electrode active material 100, for example.

As a metal other than cobalt (hereinafter, the additive element X), one or more metals selected from nickel, aluminum, manganese, titanium, vanadium, and chromium may be added to lithium cobalt oxide, for example, and in particular, at least one of nickel and aluminum is preferably added. In some cases, manganese, titanium, vanadium, and chromium are stable when having a valence of four, and thus highly contribute to structure stability. The addition of the additive element X may enable the crystal structure to be more stable in a high-voltage charged state. The addition of the additive element X may enable the crystal structure to be more stable in a charged state with a deep charge depth of 0.8 or more. Here, in the positive electrode active material of one embodiment of the present invention, the additive element X is preferably added at a concentration that does not greatly change the crystallinity of the lithium cobalt oxide. For example, the additive element is preferably added at an amount with which the aforementioned Jahn-Teller effect is not exhibited.

Aluminum and the transition metal typified by nickel and manganese preferably exist in cobalt sites, but part of them may exist in lithium sites. Magnesium preferably exists in lithium sites. Fluorine may be substituted for part of oxygen.

As the magnesium concentration in the positive electrode active material of one embodiment of the present invention increases, the capacity of the positive electrode active material decreases in some cases. As an example, one possible reason is that the amount of lithium that contributes to charging and discharging decreases when magnesium enters the lithium sites. When the positive electrode active material of one embodiment of the present invention contains nickel as the additive element Xin addition to magnesium, the charge and discharge cycle performance can be improved in some cases. When the positive electrode active material of one embodiment of the present invention contains aluminum as the additive element X in addition to magnesium, the charge and discharge cycle performance can be improved in some cases. When the positive electrode active material of one embodiment of the present invention contains magnesium, nickel, and aluminum as the additive element X, the charge and discharge cycle performance can be improved in some cases.

The concentrations of the elements of the positive electrode active material containing magnesium, nickel, and aluminum as the additive element X are described below.

The number of nickel atoms in the positive electrode active material of one embodiment of the present invention is preferably less than or equal to 10%, further preferably less than or equal to 7.5%, and still further preferably greater than or equal to 0.05% and less than or equal to 4%, and especially preferably greater than or equal to 0.1% and less than or equal to 2% of the number of cobalt atoms. The nickel concentration described here may be a value obtained by element analysis on the whole of the positive electrode active material using ICP-MS or the like, or may be a value based on the ratio of the raw materials mixed in the process of forming the positive electrode active material, for example.

When a state being charged to a deep charge depth of 0.8 or more is held for a long time, the constitution element of the positive electrode active material dissolves in an electrolyte solution, and the crystal structure might be broken. However, when nickel is contained at the above-described proportion, dissolution of the constitution element from the positive electrode active material 100 can be inhibited in some cases.

The number of aluminum atoms in the positive electrode active material of one embodiment of the present invention is preferably greater than or equal to 0.05% and less than or equal to 4%, and further preferably greater than or equal to 0.1% and less than or equal to 2% of the number of cobalt atoms. The aluminum concentration described here may be a value obtained by element analysis on the whole of the positive electrode active material using ICP-MS or the like, or may be a value based on the ratio of the raw materials mixed in the process of forming the positive electrode active material, for example.

It is preferable that the positive electrode active material containing the additive element X of one embodiment of the present invention use phosphorus as the additive element X. The positive electrode active material of one embodiment of the present invention further preferably contains a compound containing phosphorus and oxygen.

When the positive electrode active material of one embodiment of the present invention contains a compound containing phosphorus as the additive element X, a short circuit is unlikely to occur in some cases while a charged state at high temperature and a deep charge depth of 0.8 or more is maintained for a long time.

When the positive electrode active material of one embodiment of the present invention contains phosphorus as the additive element X, phosphorus may react with hydrogen fluoride generated by the decomposition of the electrolyte solution, which might decrease the hydrogen fluoride concentration in the electrolyte solution.

In the case where the electrolyte solution contains $LiPF_6$ as a lithium salt, hydrogen fluoride might be generated by hydrolysis. In some cases, hydrogen fluoride is generated by the reaction of PVDF used as a component of the positive electrode and alkali. The decrease in hydrogen fluoride concentration in the electrolyte solution can inhibit corrosion of a current collector and/or separation of a coating film in some cases. Furthermore, the decrease in hydrogen fluoride concentration in the electrolyte solution can inhibit a reduction in adhesion properties due to gelling and/or insolubilization of PVDF in some cases.

When containing phosphorus and magnesium as the additive element X, the positive electrode active material 100 of one embodiment of the present invention is extremely stable in a charged state with a deep charge depth of 0.8 or more. When phosphorus and magnesium are contained as the additive element X, the number of phosphorus atoms is preferably greater than or equal to 1% and less than or equal to 20%, further preferably greater than or equal to 2% and less than or equal to 10%, and still further preferably greater than or equal to 3% and less than or equal to 8% of the number of cobalt atoms. In addition, the number of magnesium atoms is preferably greater than or equal to 0.1% and less than or equal to 10%, further preferably greater than or equal to 0.5% and less than or equal to 5%, and still further preferably greater than or equal to 0.7% and less than or equal to 4% of the number of cobalt atoms. The phosphorus concentration and the magnesium concentration described here may each be a value obtained by element analysis on the whole of the positive electrode active material 100 using ICP-MS or the like, or may be a value based on the ratio of the raw materials mixed in the process of forming the positive electrode active material 100, for example.

In the case where the positive electrode active material 100 has a crack, phosphorus, more specifically, a compound containing phosphorus and oxygen, in the inner portion of the positive electrode active material with the crack may inhibit crack development, for example.

As illustrated in FIG. 7, the symmetry of the oxygen atoms slightly differs between the O3 type crystal structure and the O3' type crystal structure. Specifically, the oxygen atoms in the O3 type crystal structure are aligned with the dotted line, whereas strict alignment of the oxygen atoms is not observed in the O3' type crystal structure. This is caused by an increase in the amount of tetravalent cobalt along with a decrease in the amount of lithium in the O3' type crystal structure, resulting in an increase in the Jahn-Teller distortion. Consequently, the octahedral structure of $CoO_6$ is distorted. In addition, repelling of oxygen atoms in the $CoO_2$ layer becomes stronger along with a decrease in the amount of lithium, which also affects the difference in symmetry of oxygen atoms.

<Surface Portion 100*a*>

It is preferable that magnesium be distributed throughout the surface portion 100*a* of the particle of the positive electrode active material 100 of one embodiment of the present invention, and it is further preferable that the magnesium concentration in the surface portion 100*a* be higher than the average magnesium concentration in the whole. For example, the magnesium concentration in the surface portion 100*a* measured by XPS or the like is preferably higher than the average magnesium concentration in the whole measured by ICP-MS or the like.

In the case where the positive electrode active material 100 of one embodiment of the present invention contains an element other than cobalt, for example, one or more metals selected from nickel, aluminum, manganese, iron, and chromium, the concentration of the metal in the vicinity of the surface of the particle is preferably higher than the average concentration in the whole. For example, the concentration of the element other than cobalt in the surface portion 100*a* measured by XPS or the like is preferably higher than the concentration of the element in the whole particles measured by ICP-MS or the like.

The surface portion 100*a* of the positive electrode active material 100 is a kind of crystal defects and lithium is extracted from the surface during charging; thus, the lithium concentration in the surface portion tends to be lower than that in the inner portion. Therefore, the surface tends to be unstable and its crystal structure is likely to be broken. The higher the magnesium concentration in the surface portion 100*a* is, the more effectively the change in the crystal structure can be reduced. In addition, a high magnesium concentration in the surface portion 100*a* probably increases the corrosion resistance to hydrofluoric acid generated by the decomposition of the electrolyte solution.

The concentration of halogen such as fluorine in the surface portion 100*a* of the positive electrode active material 100 of one embodiment of the present invention is preferably higher than the average concentration in the whole. When halogen exists in the surface portion 100*a*, which is in contact with the electrolyte solution, the corrosion resistance to hydrofluoric acid can be effectively increased.

As described above, the surface portion 100*a* of the positive electrode active material 100 of one embodiment of the present invention preferably has a composition different from that in the inner portion 100*b*, i.e., the concentrations of the additive elements such as magnesium and fluorine are preferably higher than those in the inner portion 100*b*. The surface portion 100*a* having such a composition preferably has a crystal structure stable at room temperature. Accordingly, the surface portion 100*a* may have a crystal structure different from that of the inner portion 100*b*. For example, at least part of the surface portion 100*a* of the positive electrode active material 100 of one embodiment of the present invention may have the rock-salt crystal structure. When the surface portion 100*a* and the inner portion 100*b* have different crystal structures, the orientations of crystals in the surface portion 100*a* and the inner portion 100*b* are preferably substantially aligned with each other.

Anions of a layered rock-salt crystal and anions of a rock-salt crystal form a cubic close-packed structure (face-centered cubic lattice structure). Anions of an O3' type crystal are presumed to form a cubic close-packed structure. Note that in this specification and the like, a structure where three layers of anions are shifted and stacked like "ABCABC" is referred to as a cubic close-packed structure. Accordingly, anions do not necessarily form a cubic lattice structure. At the same time, actual crystals always have a defect and thus, analysis results are not necessarily consistent with the theory. For example, in electron diffraction or FFT (fast Fourier transform) of a TEM image or the like, a spot may appear in a position slightly different from a theoretical position. For example, anions may be regarded as forming a cubic close-packed structure when a difference in orientation from a theoretical position is 5° or less or 2.5° or less.

When a layered rock-salt crystal and a rock-salt crystal are in contact with each other, there is a crystal plane at which orientations of cubic close-packed structures composed of anions are aligned with each other.

The description can also be made as follows. Anions on the (111) plane of a cubic crystal structure has a triangular arrangement. A layered rock-salt structure, which belongs to the space group R-3m and is a rhombohedral structure, is generally represented by a composite hexagonal lattice for easy understanding of the structure, and the (0001) plane of the layered rock-salt structure has a hexagonal lattice. The triangular lattice on the (111) plane of the cubic crystal has atomic arrangement similar to that of the hexagonal lattice on the (0001) plane of the layered rock-salt structure. These lattices being consistent with each other can be expressed as "orientations of the cubic close-packed structures are aligned with each other".

Note that a space group of the layered rock-salt crystal and the O3' type crystal is R-3m, which is different from the space group Fm-3m of a rock-salt crystal (a space group of a general rock-salt crystal) and the space group Fd-3m of a rock-salt crystal (a space group of a rock-salt crystal having the simplest symmetry); thus, the Miller index of the crystal plane satisfying the above conditions in the layered rock-salt crystal and the O3' type crystal is different from that in the rock-salt crystal. In this specification, in the layered rock-salt crystal, the O3' type crystal, and the rock-salt crystal, a state where the orientations of the cubic close-packed structures formed of anions are aligned with each other may be referred to as a state where crystal orientations are substantially aligned with each other.

The orientations of crystals in two regions being substantially aligned with each other can be judged, for example, from a TEM (transmission electron microscope) image, a STEM (scanning transmission electron microscope) image, a HAADF-STEM (high-angle annular dark-field scanning TEM) image, an ABF-STEM (annular bright-field scanning transmission electron microscope) image, electron diffraction, and FFT of a TEM image or the like. X-ray diffraction (XRD), electron diffraction, neutron diffraction, and the like can also be used for judging.

<Grain Boundary>

The additive element X contained in the positive electrode active material 100 of one embodiment of the present invention may randomly exist in the inner portion at a slight concentration, but part of the additive element is preferably segregated in a grain boundary.

In other words, the concentration of the additive element Xin the crystal grain boundary and its vicinity of the positive electrode active material 100 of one embodiment of the present invention is preferably higher than that in the other regions in the inner portion.

The crystal grain boundary can be regarded as a plane defect. Thus, the crystal grain boundary tends to be unstable and the crystal structure easily starts to change like the surface of the particle. Therefore, when the concentration of the added element X in the crystal grain boundary and its vicinity is higher, the change in the crystal structure can be inhibited more effectively.

In the case where the concentration of the additive element X is high in the crystal grain boundary and its vicinity, even when a crack is generated along the crystal grain boundary of the particle of the positive electrode active material 100 of one embodiment of the present invention, the concentration of the additive element X is increased in the vicinity of the surface generated by the crack. Thus, the positive electrode active material can have an increased corrosion resistance to hydrofluoric acid even after a crack is generated.

Note that in this specification and the like, the vicinity of the crystal grain boundary refers to a region within approximately 10 nm from the grain boundary.

<Particle Diameter>

When the particle diameter of the positive electrode active material 100 of one embodiment of the present invention is too large, there are problems such as difficulty in lithium diffusion and large surface roughness of an active material layer at the time when the material is applied to a current collector. By contrast, when the particle diameter is too small, there are problems such as difficulty in loading of the active material layer at the time when the material is applied to the current collector and overreaction with an electrolyte solution. Therefore, an average particle diameter D50 is preferably greater than or equal to 1 m and less than or equal to 100 μm, further preferably greater than or equal to 2 m and less than or equal to 40 μm, still further preferably greater than or equal to 5 m and less than or equal to 30 m.

<Analysis Method>

Whether or not a positive electrode active material is the positive electrode active material 100 of one embodiment of the present invention that has an O3' type crystal structure when charged to a deep charge depth of 0.8 or more can be determined by analyzing a positive electrode charged to a deep charge depth of 0.8 or more using XRD, electron diffraction, neutron diffraction, electron spin resonance (ESR), nuclear magnetic resonance (NMR), or the like. XRD is particularly preferable because the symmetry of a transition metal such as cobalt contained in the positive electrode active material can be analyzed with high resolution, the degrees of crystallinity and the crystal orientations can be compared, the distortion of lattice periodicity and the crystallite size can be analyzed, and a positive electrode itself obtained by disassembling a secondary battery can be measured with sufficient accuracy, for example.

As described above, the positive electrode active material 100 of one embodiment of the present invention features in a small change in the crystal structure between a state charged to a deep charge depth of 0.8 or more and a discharged state. A material 50 wt % or more of which has the crystal structure that largely changes between a state charged to a deep charge depth of 0.8 or more and a discharged state is not preferable because the material cannot withstand deep-depth charging at a charge depth of 0.8 or more and discharging. In addition, it should be noted that an objective crystal structure is not obtained in some cases only by addition of additive elements. For example, although the positive electrode active material that is lithium cobalt oxide containing magnesium and fluorine is a commonality, the positive electrode active material has the O3' type crystal structure at 60 wt % or more in some cases, and has the H1-3 type crystal structure at 50 wt % or more in other cases, when charged to a deep charge depth of 0.8 or more. In some cases, lithium cobalt oxide containing magnesium and fluorine may have the O3' type crystal structure at almost 100 wt % at a predetermined voltage, and increasing the voltage to be higher than the predetermined voltage may cause the H1-3 type crystal structure. Thus, to determine whether or not a positive electrode active material is the positive electrode active material 100 of one embodiment of the present invention, the crystal structure should be analyzed by XRD or other methods.

However, the crystal structure of a positive electrode active material in a state charged to a deep charge depth of 0.8 or more or a discharged state may be changed with exposure to the air. For example, the O3' type crystal structure changes into the H1-3 type crystal structure in some cases. For that reason, all samples are preferably handled in an inert atmosphere such as an argon atmosphere.

<Charging Method>

Deep-depth charging at a charge depth of 0.8 or more for determining whether or not a composite oxide is the positive electrode active material 100 of one embodiment of the present invention can be performed on a coin cell (CR2032 type with a diameter of 20 mm and a height of 3.2 mm) with a lithium counter electrode, for example.

More specifically, a positive electrode can be formed by application of a slurry in which the positive electrode active material, a conductive material, and a binder are mixed to a positive electrode current collector made of aluminum foil.

A lithium metal can be used for a counter electrode. Note that when the counter electrode is formed using a material other than the lithium metal, the potential of a secondary battery differs from the potential of the positive electrode. Unless otherwise specified, the voltage and the potential in this specification and the like refer to the potential of a positive electrode.

As an electrolyte contained in an electrolyte solution, 1 mol/L lithium hexafluorophosphate (LiPF6) can be used. As the electrolyte solution, an electrolyte solution in which ethylene carbonate (EC) and diethyl carbonate (DEC) at EC:DEC=3:7 (volume ratio) and vinylene carbonate (VC) at 2 wt % are mixed can be used.

As a separator, 25-μm-thick polypropylene can be used.

Stainless steel (SUS) can be used for a positive electrode can and a negative electrode can.

The coin cell fabricated with the above conditions is charged with constant current at 4.6 V and 0.5 C and then charged with constant voltage until the current value reaches 0.01 C. Note that here, 1 C is set to 137 mA/g. The temperature is set to 25° C. After the charging is performed in this manner, the coin cell is disassembled in a glove box with an argon atmosphere to take out the positive electrode, whereby the positive electrode active material charged to a deep charge depth of 0.8 or more can be obtained. In order to inhibit a reaction with components in the external environment, the taken positive electrode is preferably enclosed in an argon atmosphere in performing various analyses later. For example, XRD can be performed on the positive electrode active material enclosed in an airtight container with an argon atmosphere.

<XRD>

Figure 8:
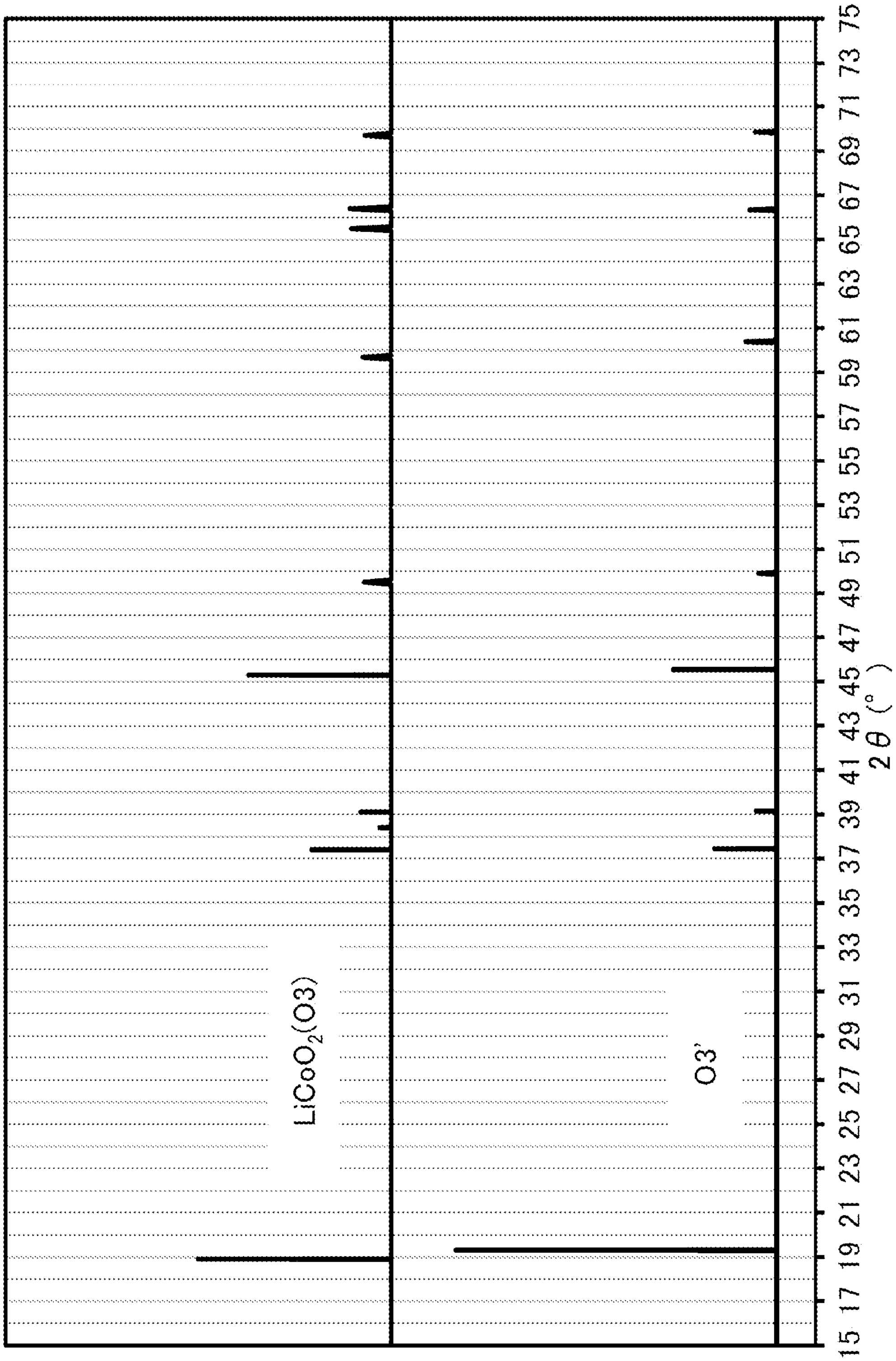
FIG. 8 shows XRD patterns calculated from crystal structures.
Figure 10:
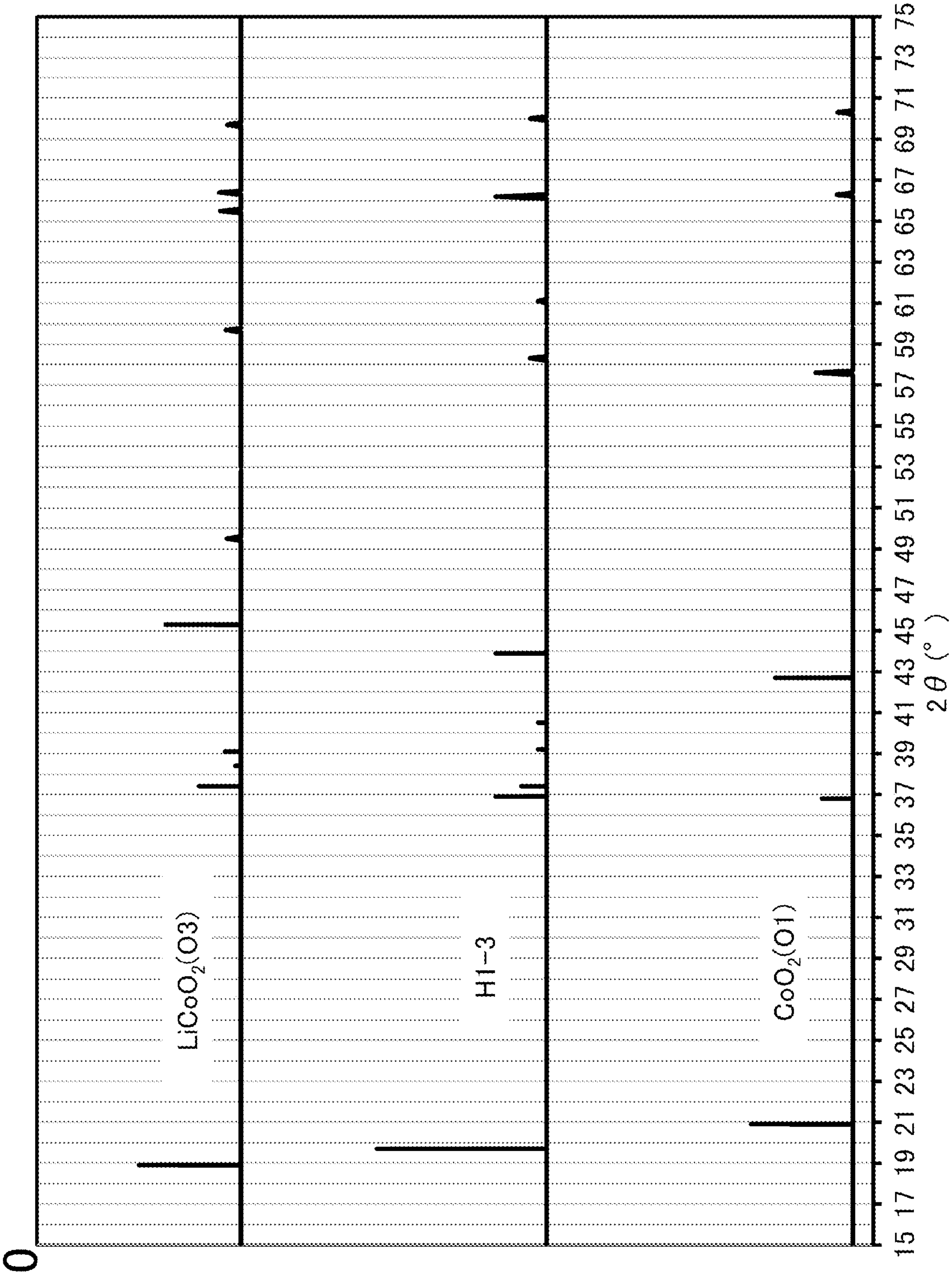
FIG. 10 shows XRD patterns calculated from crystal structures.

FIG. 8 shows an ideal powder XRD pattern with CuKα1 radiation that is calculated from a model of the O3' type crystal structure. For comparison, an ideal XRD pattern calculated from the crystal structure of $LiCoO_2$ (O3) with x of 1 is also shown. FIG. 10 illustrates an ideal powder XRD pattern with CuKα1 radiation that is calculated from a model of the H1-3 type crystal structure. For comparison, ideal XRD patterns calculated from the crystal structure of $LiCoO_2$ (O3) with x of 1 and the crystal structure of $CoO_2$ (O1) with x of 0 are also shown. Note that the patterns of $LiCoO_2$ (O3) and $CoO_2$ (O1) are made from crystal structure data obtained from ICSD (Inorganic Crystal Structure Database) using Reflex Powder Diffraction, which is a module of Materials Studio (BIOVIA). The range of 2θ was from 15° to 75°, the step size was 0.01, the wavelength λ1 was 1.540562×10-10 μm, the wavelength λ2 was not set, and a single monochromator was used. The pattern of the O3' type crystal structure was estimated from the XRD pattern of the positive electrode active material of one embodiment of the present invention, the crystal structure was fitted with TOPAS ver. 3 (crystal structure analysis software manufactured by Bruker Corporation), and XRD patterns were made in a manner similar to those of other structures.

As shown in FIG. 8, the O3' type crystal structure exhibits diffraction peaks at 2θ of 19.30±0.20° (greater than or equal to 19.100 and less than or equal to 19.50°) and 2θ of 45.55±0.100 (greater than or equal to 45.450 and less than or equal to 45.65°). More specifically, sharp diffraction peaks appear at 2θ of 19.30±0.10° (greater than or equal to 19.200 and less than or equal to 19.40°) and 2θ of 45.55±0.05° (greater than or equal to 45.50° and less than or equal to 45.60°). By contrast, as shown in FIG. 10, the H1-3 type crystal structure and $CoO_2$ (P-3 m1, O1) do not exhibit peaks at these positions. Thus, the peaks at 2θ of 19.30±0.20° and 2θ of 45.55±0.10° in a state charged to a deep charge depth of 0.8 or more can be the features of the positive electrode active material 100 of one embodiment of the present invention.

It can be said that the positions of the XRD diffraction peaks exhibited by the crystal structure with x of 1 are close to those of the XRD diffraction peaks exhibited by the crystal structure in a high-voltage charged state. More specifically, it can be said that a difference in the positions of two or more, preferably three or more of the main diffraction peaks between the crystal structures is 2θ=0.70 or less, preferably 2θ=0.50 or less.

Although the positive electrode active material 100 of one embodiment of the present invention has the O3' type crystal structure when charged to a deep charge depth of 0.8 or more, the entire crystal structure of the positive electrode active material 100 is not necessarily the O3' type crystal structure. The positive electrode active material 100 may have another crystal structure or be partly amorphous. Note that when the XRD patterns are subjected to the Rietveld analysis, the O3' type crystal structure preferably accounts for greater than or equal to 50 wt %, further preferably greater than or equal to 60 wt %, still further preferably greater than or equal to 66 wt %. The positive electrode active material in which the O3' type crystal structure accounts for greater than or equal to 50 wt %, preferably greater than or equal to 60 wt %, further preferably greater than or equal to 66 wt % can have sufficiently good cycle performance.

Furthermore, even after 100 or more cycles of charging and discharging after the measurement starts, the O3' type crystal structure preferably accounts for greater than or equal to 35 wt %, further preferably greater than or equal to 40 wt %, still further preferably greater than or equal to 43 wt %, in the Rietveld analysis.

The crystallite size of the O3' type crystal structure of the positive electrode active material particle is only decreased to approximately one-tenth that of $LiCoO_2$ (O3) in a discharged state. Thus, a clear peak of the O3' type crystal structure can be observed in a high-voltage charged state, even under the same XRD measurement conditions as those of a positive electrode before the charging and discharging. By contrast, simple $LiCoO_2$ has a small crystallite size and exhibits a broad and small peak although it can partly have a structure similar to the O3' type crystal structure. The crystallite size can be calculated from the half width of the XRD peak.

As described above, the influence of the Jahn-Teller effect is preferably small in the positive electrode active material of one embodiment of the present invention. It is preferable that the positive electrode active material of one embodiment of the present invention have a layered rock-salt crystal structure and mainly contain cobalt as a transition metal. The positive electrode active material of one embodiment of the present invention may contain the above-described additive element Xin addition to cobalt as long as the influence of the Jahn-Teller effect is small.

Preferable ranges of the lattice constants of the positive electrode active material of one embodiment of the present invention are examined. In the layered rock-salt crystal structure of the particle of the positive electrode active material in a discharged state or a state where charging and discharging are not performed, which can be estimated from the XRD patterns, the a-axis lattice constant is preferably greater than $2.814\times10^{-10}$ m and less than $2.817\times10^{-10}$ m, and the c-axis lattice constant is preferably greater than $14.05\times10^{-10}$ m and less than $14.07\times10^{-10}$ m. The state where charging and discharging are not performed may be the state of a powder before the formation of a positive electrode of a secondary battery.

Alternatively, in the layered rock-salt crystal structure of the particle of the positive electrode active material in the discharged state or the state where charging and discharging are not performed, the value obtained by dividing the a-axis lattice constant by the c-axis lattice constant (a-axis/c-axis) is preferably greater than 0.20000 and less than 0.20049.

Alternatively, when the layered rock-salt crystal structure of the particle of the positive electrode active material in the discharged state or the state where charging and discharging are not performed is subjected to XRD analysis, a first peak is observed at 2θ of greater than or equal to 18.50° and less than or equal to 19.30°, and a second peak is observed at 2θ of greater than or equal to 38.00° and less than or equal to 38.80°, in some cases.

Note that the peaks appearing in the powder XRD patterns reflect the crystal structure of the inner portion 100*b* of the positive electrode active material 100, which accounts for the majority of the volume of the positive electrode active material 100. The crystal structure of the surface portion 100*a* or the like can be analyzed by electron diffraction of a cross section of the positive electrode active material 100, for example.

<XPS>

A region that is approximately 2 to 8 nm (normally, approximately 5 nm) in depth from a surface can be analyzed by X-ray photoelectron spectroscopy (XPS); thus, the concentration of each element in approximately half of the surface portion 100*a* can be quantitatively analyzed. The bonding states of the elements can be analyzed by narrow scanning. Note that the quantitative accuracy of XPS is approximately ±1 atomic % in many cases, and the lower detection limit is approximately 1 atomic % but depends on the element.

When the positive electrode active material 100 of one embodiment of the present invention is subjected to XPS analysis, the number of atoms of the additive element X is preferably greater than or equal to 1.6 times and less than or equal to 6.0 times, further preferably greater than or equal to 1.8 times and less than 4.0 times the number of atoms of the transition metal. When the additive element X is magnesium and the transition metal M1 is cobalt, the number of magnesium atoms is preferably greater than or equal to 1.6 times and less than or equal to 6.0 times, further preferably greater than or equal to 1.8 times and less than 4.0 times the number of cobalt atoms. The number of atoms of a halogen such as fluorine is preferably greater than or equal to 0.2 times and less than or equal to 6.0 times, further preferably greater than or equal to 1.2 times and less than or equal to 4.0 times the number of atoms of the transition metal.

In the XPS analysis, monochromatic aluminum can be used as an X-ray source, for example. An extraction angle is, for example, 45°.

In addition, when the positive electrode active material 100 of one embodiment of the present invention is analyzed by XPS, a peak indicating the bonding energy of fluorine with another element is preferably at greater than or equal to 682 eV and less than 685 eV, further preferably approximately 684.3 eV. The above value is different from both the bonding energy of lithium fluoride, which is 685 eV, and the bonding energy of magnesium fluoride, which is 686 eV. That is, in the case where the positive electrode active material 100 of one embodiment of the present invention contains fluorine, the fluorine is preferably in a bonding state other than lithium fluoride and magnesium fluoride.

Furthermore, when the positive electrode active material 100 of one embodiment of the present invention is analyzed by XPS, a peak indicating the bonding energy of magnesium with another element is preferably at greater than or equal to 1302 eV and less than 1304 eV, further preferably approximately 1303 eV. This value is different from the bonding energy of magnesium fluoride, which is 1305 eV, and close to the bonding energy of magnesium oxide. That is, in the case where the positive electrode active material 100 of one embodiment of the present invention contains magnesium, the magnesium is preferably in a bonding state other than magnesium fluoride.

The concentration of the additive element X that preferably exists in the surface portion 100*a* in a large amount, such as magnesium or aluminum, measured by XPS or the like is preferably higher than the concentration measured by ICP-MS (inductively coupled plasma mass spectrometry), GD-MS (glow discharge mass spectrometry), or the like.

When a cross section is exposed by processing and analyzed by TEM-EDX, the concentrations of magnesium and aluminum in the surface portion 100*a* are preferably higher than that in the inner portion 100*b*. An FIB can be used for the processing, for example.

In the XPS (X-ray photoelectron spectroscopy) analysis, the number of magnesium atoms is preferably greater than or equal to 0.4 times and less than or equal to 1.5 times the number of cobalt atoms. In the ICP-MS analysis, the atomic ratio of magnesium (Mg/Co) is preferably greater than or equal to 0.001 and less than or equal to 0.06.

By contrast, it is preferable that nickel, which is one of the transition metals, not be unevenly distributed in the surface portion 100*a* but be distributed in the entire positive electrode active material 100. Note that one embodiment of the present invention is not limited thereto in the case where the above-described region where the excess additive element X is unevenly distributed exists.

<Surface Roughness and Specific Surface Area>

The positive electrode active material 100 of one embodiment of the present invention preferably has a smooth surface with little unevenness. A smooth surface with little unevenness indicates favorable distribution of the additive element X in the surface portion 100*a*. For the positive electrode active material 100, it is particularly preferable to perform initial heating on lithium cobalt oxide or lithium nickel-cobalt-manganese oxide before the addition of the additive element X in the formation process of the positive electrode active material 100, in which case remarkably excellent cycle performance under repetition of deep-depth charging at a charge depth of 0.8 or more and discharging is exhibited.

When the positive electrode active material 100 has a smooth surface with little unevenness, the surface of the positive electrode active material 100 can be more stable and generation of a pit can be inhibited.

A smooth surface with little unevenness can be recognized from, for example, a cross-sectional SEM image or a cross-sectional TEM image of the positive electrode active material 100 or the specific surface area of the positive electrode active material 100.

The level of the surface smoothness of the positive electrode active material 100 can be quantified from its cross-sectional SEM image, as described below, for example.

First, the positive electrode active material 100 is processed with an FIB or the like such that its cross section is exposed. At this time, the positive electrode active material 100 is preferably covered with a protective film, a protective agent, or the like. Next, a SEM image of the interface between the positive electrode active material 100 and the protective film or the like is taken. The SEM image is subjected to noise processing using image processing software. For example, the Gaussian Blur ($\sigma$=2) is performed, followed by binarization. In addition, interface extraction is performed using image processing software. Moreover, an interface line between the positive electrode active material 100 and the protective film or the like is selected with a magic hand tool or the like, and data is extracted to spreadsheet software or the like. With the use of the function of the spreadsheet software or the like, correction is performed using regression curves (quadratic regression), parameters for calculating roughness are obtained from data subjected to slope correction, and root-mean-square (RMS) surface roughness is obtained by calculating standard deviation. This surface roughness refers to the surface roughness in at least 400 nm of the particle periphery of the positive electrode active material.

On the particle surface of the positive electrode active material 100 of this embodiment, root-mean-square surface roughness (RMS), which is an index of roughness, is less than or equal to 10 nm, less than 3 nm, preferably less than 1 nm, further preferably less than 0.5 nm.

Note that the image processing software used for the noise processing, the interface extraction, or the like is not particularly limited, and for example, "ImageJ" can be used. In addition, the spreadsheet software or the like is not particularly limited, and Microsoft Office Excel can be used, for example.

For example, the level of surface smoothness of the positive electrode active material 100 can also be quantified from the ratio of an actual specific surface area AR measured by a constant-volume gas adsorption method to an ideal specific surface area Ai.

The ideal specific surface area Ai is calculated on the assumption that all the particles have the same diameter as D50, have the same weight, and have ideal spherical shapes.

The median diameter D50 can be measured with a particle size distribution analyzer or the like using a laser diffraction and scattering method. The specific surface area can be measured with a specific surface area analyzer or the like by a constant-volume gas adsorption method, for example.

In the positive electrode active material 100 of one embodiment of the present invention, the ratio of the actual specific surface area AR to the ideal specific surface area Ai obtained from the median diameter D50 (AR/Ai) is preferably less than or equal to 2.

[Positive Electrode Active Material Composite]

The positive electrode active material 100 of one embodiment of the present invention may be a positive electrode active material composite including a coating layer that covers at least part of the positive electrode active material 100. As the coating layer, for example, one or more of glass, an oxide, and $LiM2PO_4$ (M2 is one or more selected from Fe, Ni, Co, and Mn) can be used.

As glass contained in the coating layer of the positive electrode active material composite, a material including an amorphous part can be used. Examples of the material including an amorphous part include a material containing one or more selected from $SiO_2$, SiO, $Al_2O_3$, $TiO_2$, $Li_4SiO_4$, $Li_3PO_4$, $Li_2S$, $SiS_2$, $B_2S_3$, $GeS_4$, AgI, $Ag_2O$, $Li_2O$, $P_2O_5$, $B_2O_3$, $V_2O_5$, and the like; $Li_7P_3S_{11}$; and $Li_{1+x+y}Al_xTi_{2-x}Si_yP_{3-y}O_{12}$ (0<x<2 and 0<y<3). The material including an amorphous part can be used in the state where the entire part is amorphous or in the state of crystallized glass part of which is crystallized (also referred to as glass ceramic). Glass desirably has lithium-ion conductivity. Having the lithium-ion conductivity can also be regarded as having a diffusion property of lithium ions and a penetration property of lithium ions. The melting point of glass is preferably 800° C. or lower, further preferably 500° C. or lower. Glass preferably has electron conductivity. Furthermore, glass preferably has a softening point of 800° C. or lower, and $Li_2O$—$B_2O_3$—$SiO_2$ based glass can be used, for example.

Examples of the oxide included in the coating layer of the positive electrode active material composite include aluminum oxide, zirconium oxide, hafnium oxide, and niobium oxide. Examples of $LiM2PO_4$ (M2 is one or more selected from Fe, Ni, Co, and Mn) included in the coating layer of the positive electrode active material composite include $LiFePO_4$, $LiNiPO_4$, $LiCoPO_4$, $LiMnPO_4$, $LiFe_aNi_bPO_4$, $LiFe_aCo_bPO_4$, $LiFe_aMn_bPO_4$, $LiNi_aCO_bPO_4$, $LiNi_aMn_bPO_4$ (a+b is 1 or less, $0<a<1$, and $0<b<1$), $LiFe_cNi_dCO_ePO_4$, $LiFe_cNi_dMn_ePO_4$, $LiNi_cCo_dMn_ePO_4$ (c+d+e is 1 or less, $0<c<1$, $0<d<1$, and $0<e<1$), and $LiFe_fNi_gCo_hMn_iPO_4$ (f+g+h+i is 1 or less, $0<f<1$, $0<g<1$, $0<h<1$, and $0<i<1$)

Composite-making process can be performed to form the coating layer of the positive electrode active material composite. As the composite-making process, any one or more of composite-making processes utilizing mechanical energy such as a mechanochemical method, a mechanofusion method, and a ball mill method; composite-making processes utilizing a liquid phase reaction such as a coprecipitation method, a hydrothermal method, and a sol-gel method; and composite-making processes utilizing a gas phase reaction such as a barrel sputtering method, an ALD (Atomic Layer Deposition) method, an evaporation method, and a CVD (Chemical Vapor Deposition) method can be used, for example. For example, for the composite-making process using mechanical energy, Picobond by Hosokawa Micron Ltd. can be used. Heat treatment is preferably performed once or more times in the composite-making process.

Owing to the positive electrode active material composite, the positive electrode active material is inhibited from being in contact with the electrolyte solution or the like, which can inhibit deterioration of a secondary battery.

The contents in this embodiment can be freely combined with the contents in the other embodiments.

Embodiment 3

This embodiment describes examples of shapes of several types of secondary batteries including a positive electrode or a negative electrode formed by the formation method described in the foregoing embodiment.

[Coin-Type Secondary Battery]

Figure 11A:
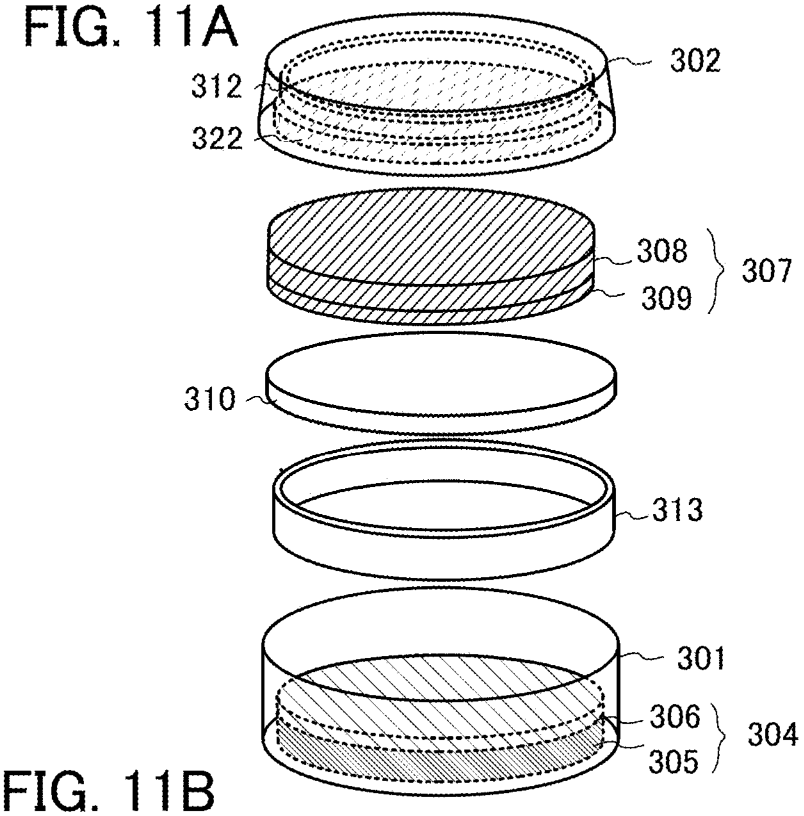
FIG. 11A is an exploded perspective view of a coin-type secondary battery.
Figure 11B:
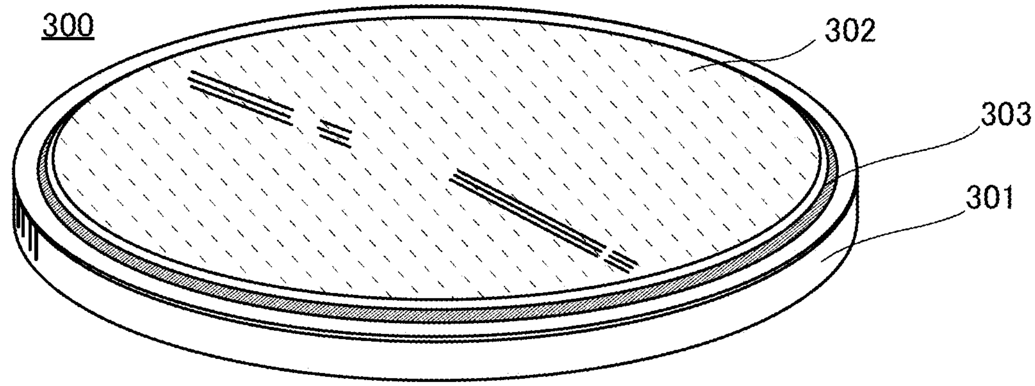
FIG. 11B is a perspective view of the coin-type secondary battery.
Figure 11C:
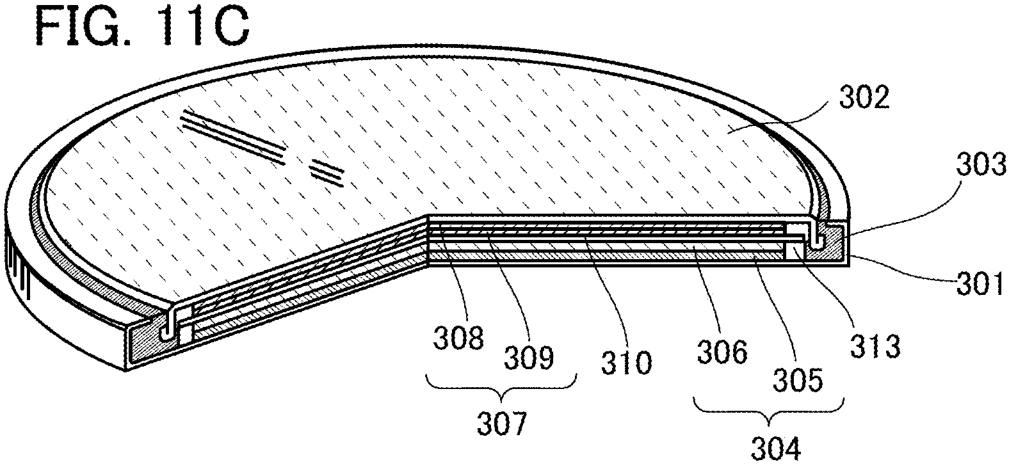
FIG. 11C is a cross-sectional perspective view thereof.

An example of a coin-type secondary battery is described. FIG. 11A is an exploded perspective view of a coin-type (single-layer flat type) secondary battery, FIG. 11B is an external view thereof, and FIG. 11C is a cross-sectional view thereof. Coin-type secondary batteries are mainly used in small electronic devices. In this specification and the like, coin-type batteries include button-type batteries.

For easy understanding, FIG. 11A is a schematic view showing overlap (a vertical relation and a positional relation) between components. Thus, FIG. 11A and FIG. 11B do not completely correspond with each other.

In FIG. 11A, a positive electrode 304, a separator 310, a negative electrode 307, a spacer 322, and a washer 312 are overlaid. They are sealed with a negative electrode can 302 and a positive electrode can 301. Note that a gasket for sealing is not illustrated in FIG. 11A. The spacer 322 and the washer 312 are used to protect the inside or fix the position inside the cans at the time when the positive electrode can 301 and the negative electrode can 302 are bonded with pressure. For the spacer 322 and the washer 312, stainless steel or an insulating material is used.

The positive electrode 304 has a stacked-layer structure in which a positive electrode active material layer 306 is formed over a positive electrode current collector 305.

To prevent a short circuit between the positive electrode and the negative electrode, the separator 310 and a ring-shaped insulator 313 are placed to cover the side surface and top surface of the positive electrode 304. The separator 310 has a larger flat surface area than the positive electrode 304.

FIG. 11B is a perspective view of a completed coin-type secondary battery.

In a coin-type secondary battery 300, the positive electrode can 301 doubling as a positive electrode terminal and the negative electrode can 302 doubling as a negative electrode terminal are insulated from each other and sealed by a gasket 303 made of polypropylene or the like. The positive electrode 304 includes the positive electrode current collector 305 and the positive electrode active material layer 306 provided in contact with the positive electrode current collector 305. The negative electrode 307 includes a negative electrode current collector 308 and a negative electrode active material layer 309 provided in contact with the negative electrode current collector 308. The negative electrode 307 is not limited to having a stacked-layer structure, and lithium metal foil or lithium-aluminum alloy foil may be used.

Note that only one surface of each of the positive electrode 304 and the negative electrode 307 used for the coin-type secondary battery 300 is provided with an active material layer.

For the positive electrode can 301 and the negative electrode can 302, a metal having corrosion resistance to an electrolyte, such as nickel, aluminum, or titanium, an alloy of such a metal, or an alloy of such a metal and another metal (e.g., stainless steel) can be used. The positive electrode can 301 and the negative electrode can 302 are preferably covered with nickel, aluminum, and the like in order to prevent corrosion due to the electrolyte, for example. The positive electrode can 301 and the negative electrode can 302 are electrically connected to the positive electrode 304 and the negative electrode 307, respectively.

The coin-type secondary battery 300 is manufactured in the following manner: the negative electrode 307, the positive electrode 304, and the separator 310 are immersed in the electrolyte solution; as illustrated in FIG. 11C, the positive electrode 304, the separator 310, the negative electrode 307, and the negative electrode can 302 are stacked in this order with the positive electrode can 301 positioned at the bottom; and then the positive electrode can 301 and the negative electrode can 302 are subjected to pressure bonding with the gasket 303 therebetween.

With the above structure, the coin-type secondary battery 300 can have high capacity, high charge and discharge capacity, and excellent cycle performance. Note that in the case where a solid electrolyte layer is provided between the negative electrode 307 and the positive electrode 304, the separator 310 can be unnecessary.

[Cylindrical Secondary Battery]

Figure 12A:
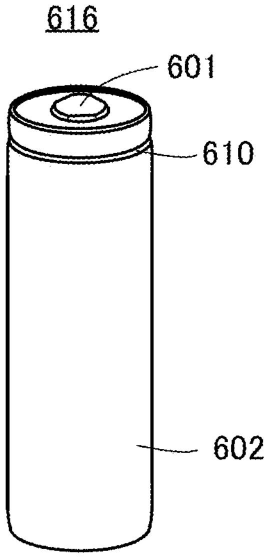
FIG. 12A illustrates an example of a cylindrical secondary battery.

An example of a cylindrical secondary battery is described with reference to FIG. 12A. As illustrated in FIG.

12A, a cylindrical secondary battery 616 includes a positive electrode cap (battery cap) 601 on the top surface and a battery can (outer can) 602 on the side surface and bottom surface. The positive electrode cap 601 and the battery can (outer can) 602 are insulated from each other by a gasket (insulating gasket) 610.

Figure 12B:
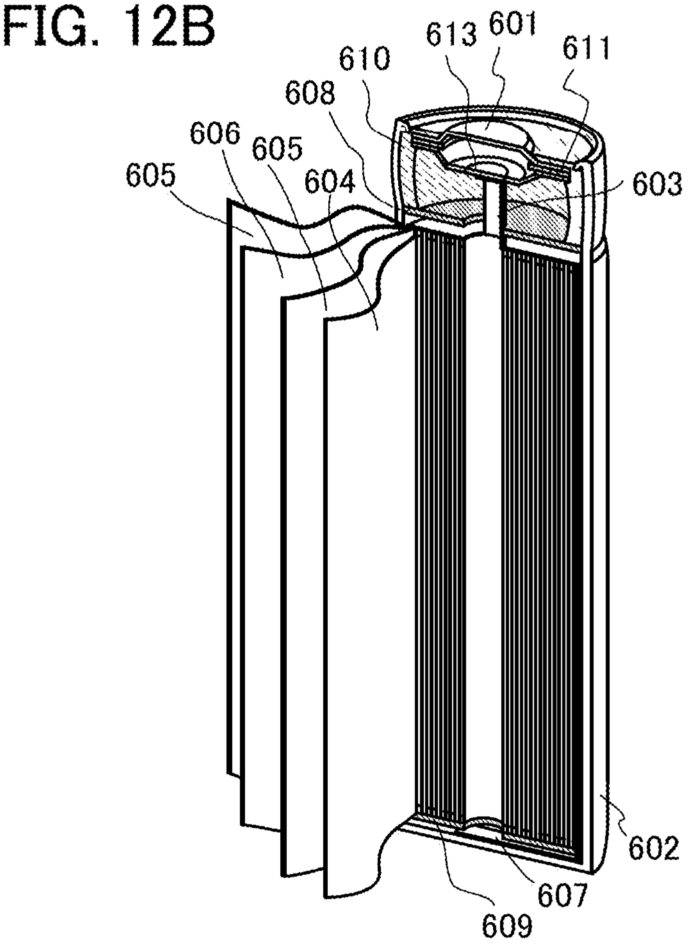
FIG. 12B illustrates the example of the cylindrical secondary battery.

FIG. 12B schematically illustrates a cross section of a cylindrical secondary battery. The cylindrical secondary battery illustrated in FIG. 12B includes the positive electrode cap (battery cap) 601 on the top surface and the battery can (outer can) 602 on the side surface and bottom surface. The positive electrode cap and the battery can (outer can) 602 are insulated from each other by the gasket (insulating gasket) 610.

Inside the battery can 602 having a hollow cylindrical shape, a battery element in which a belt-like positive electrode 604 and a belt-like negative electrode 606 are wound with a belt-like separator 605 located therebetween is provided. Although not illustrated, the battery element is wound around a central axis. One end of the battery can 602 is close and the other end thereof is open. For the battery can 602, a metal having corrosion resistance to an electrolyte solution, such as nickel, aluminum, or titanium, an alloy of such a metal, and an alloy of such a metal and another metal (e.g., stainless steel) can be used. The battery can 602 is preferably covered with nickel, aluminum, and the like in order to prevent corrosion due to the electrolyte solution. Inside the battery can 602, the battery element in which the positive electrode, the negative electrode, and the separator are wound is provided between a pair of insulating plates 608 and 609 that face each other. A nonaqueous electrolyte solution (not illustrated) is injected inside the battery can 602 provided with the battery element. A nonaqueous electrolyte solution similar to that for the coin-type secondary battery can be used.

Since a positive electrode and a negative electrode that are used for a cylindrical storage battery are wound, active materials are preferably formed on both surfaces of a current collector. Note that although FIG. 12A to FIG. 12D each illustrate the secondary battery 616 in which the height of the cylinder is larger than the diameter of the cylinder, one embodiment of the present invention is not limited thereto. In a secondary battery, the diameter of the cylinder may be larger than the height of the cylinder. Such a structure can reduce the size of a secondary battery, for example.

The positive electrode active material 100 obtained in the above embodiment is used for the positive electrode 604, whereby the cylindrical secondary battery 616 can have high capacity, high charge and discharge capacity, and excellent cycle performance.

A positive electrode terminal (positive electrode current collecting lead) 603 is connected to the positive electrode 604, and a negative electrode terminal (negative electrode current collecting lead) 607 is connected to the negative electrode 606. Both the positive electrode terminal 603 and the negative electrode terminal 607 can be formed using a metal material such as aluminum. The positive electrode terminal 603 and the negative electrode terminal 607 are resistance-welded to a safety valve mechanism 613 and the bottom of the battery can 602, respectively. The safety valve mechanism 613 is electrically connected to the positive electrode cap 601 through a PTC element (Positive Temperature Coefficient) 611. The safety valve mechanism 613 cuts off electrical connection between the positive electrode cap 601 and the positive electrode 604 when the internal pressure of the battery exceeds a predetermined threshold. The PTC element 611, which is a thermally sensitive resistor whose resistance increases as temperature rises, limits the amount of current by increasing the resistance, in order to prevent abnormal heat generation. Barium titanate ($BaTiO3$)-based semiconductor ceramic or the like can be used for the PTC element.

Figure 12C:
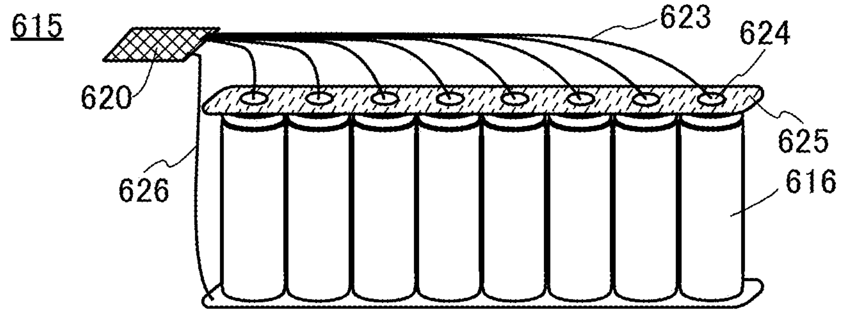
FIG. 12C illustrates an example of a plurality of cylindrical secondary batteries.

FIG. 12C illustrates an example of a power storage system 615. The power storage system 615 includes a plurality of the secondary batteries 616. The positive electrodes of the secondary batteries are in contact with and electrically connected to conductors 624 isolated by an insulator 625. The conductor 624 is electrically connected to a control circuit 620 through a wiring 623. The negative electrodes of the secondary batteries are electrically connected to the control circuit 620 through a wiring 626. As the control circuit 620, a protection circuit for preventing overcharging or overdischarging can be used, for example.

Figure 12D:
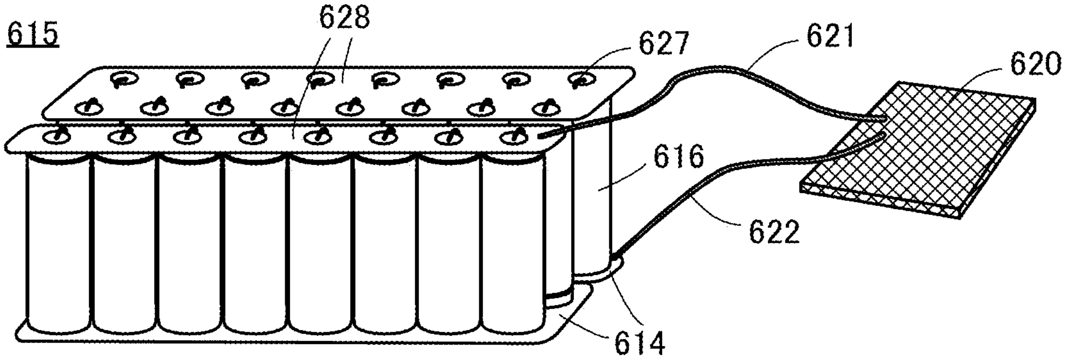
FIG. 12D illustrates an example of a power storage system including a plurality of cylindrical secondary batteries.

FIG. 12D illustrates an example of the power storage system 615. The power storage system 615 includes the plurality of secondary batteries 616, and the plurality of secondary batteries 616 are sandwiched between a conductive plate 628 and a conductive plate 614. The plurality of secondary batteries 616 are electrically connected to the conductive plate 628 and the conductive plate 614 through a wiring 627. The plurality of secondary batteries 616 may be connected in parallel or connected in series. With the power storage system 615 including the plurality of secondary batteries 616, large electric power can be extracted.

The plurality of secondary batteries 616 may be connected in series after being connected in parallel.

A temperature control device may be provided between the plurality of secondary batteries 616. The secondary batteries 616 can be cooled with the temperature control device when overheated, whereas the secondary batteries 616 can be heated with the temperature control device when cooled too much. Thus, the performance of the power storage system 615 is less likely to be influenced by the outside temperature.

In FIG. 12D, the power storage system 615 is electrically connected to the control circuit 620 through a wiring 621 and a wiring 622. The wiring 621 is electrically connected to the positive electrodes of the plurality of secondary batteries 616 through the conductive plate 628, and the wiring 622 is electrically connected to the negative electrodes of the plurality of secondary batteries 616 through the conductive plate 614.

The control circuit 620 preferably includes the second algorithm and the fourth algorithm described in Embodiment 1.

[Other Structure Examples of Secondary Battery]

Structure examples of secondary batteries are described with reference to FIG. 13 and FIG. 14.

Figure 13A:
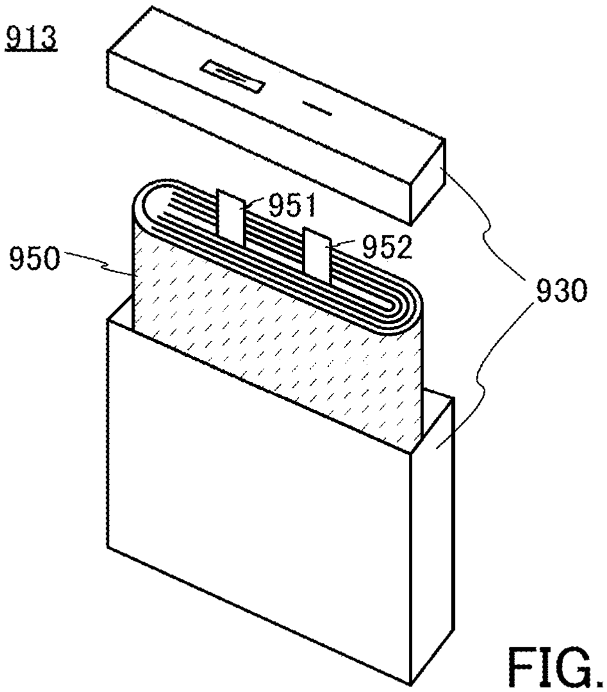
FIG. 13A and FIG. 13B are diagrams illustrating examples of a secondary battery.

A secondary battery 913 illustrated in FIG. 13A includes a wound body 950 provided with a terminal 951 and a terminal 952 inside a housing 930. The wound body 950 is immersed in an electrolyte solution inside the housing 930. The terminal 952 is in contact with the housing 930. The use of an insulator or the like inhibits contact between the terminal 951 and the housing 930. Note that in FIG. 13A, the housing 930 divided into pieces is illustrated for convenience; however, in the actual structure, the wound body 950 is covered with the housing 930, and the terminal 951 and the terminal 952 extend to the outside of the housing 930. For the housing 930, a metal material (e.g., aluminum) or a resin material can be used.

Figure 13B:
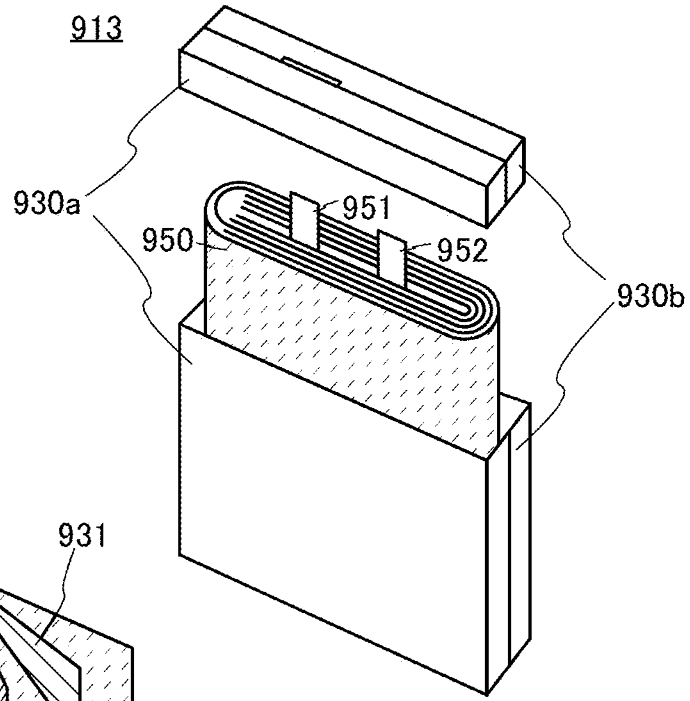

Note that as illustrated in FIG. 13B, the housing 930 illustrated in FIG. 13A may be formed using a plurality of materials. For example, in the secondary battery 913 illustrated in FIG. 13B, a housing 930*a* and a housing 930*b* are attached to each other, and the wound body 950 is provided in a region surrounded by the housing 930*a* and the housing 930*b*.

For the housing 930*a*, an insulating material such as an organic resin can be used. In particular, when a material such as an organic resin is used for the side on which an antenna is formed, blocking of an electric field by the secondary battery 913 can be inhibited. When an electric field is not significantly blocked by the housing 930*a*, an antenna may be provided inside the housing 930*a*. For the housing 930*b*, a metal material can be used, for example.

Figure 13C:
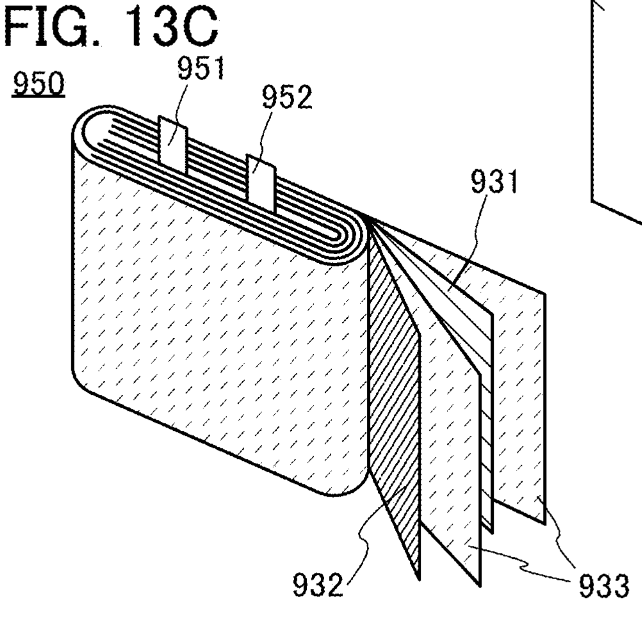
FIG. 13C is a diagram illustrating the internal state of the secondary battery.

FIG. 13C illustrates the structure of the wound body 950. The wound body 950 includes a negative electrode 931, a positive electrode 932, and separators 933. The wound body 950 is obtained by rolling a sheet of a stack in which the negative electrode 931 and the positive electrode 932 overlap with each other with the separator 933 therebetween. Note that a plurality of stacks each including the negative electrode 931, the positive electrode 932, and the separators 933 may be further stacked.

Figure 14A:
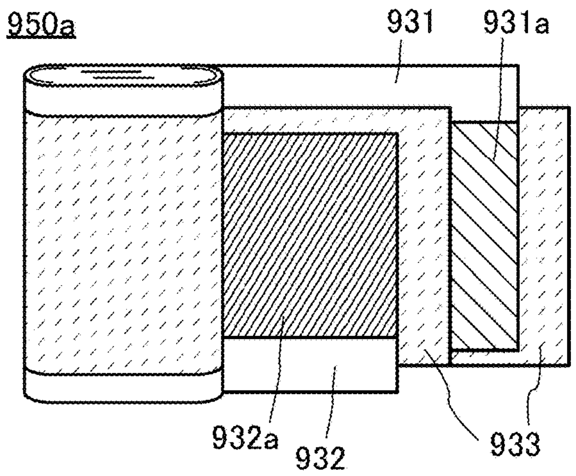
FIG. 14A to FIG. 14C are diagrams illustrating an example of a secondary battery.
Figure 14B:
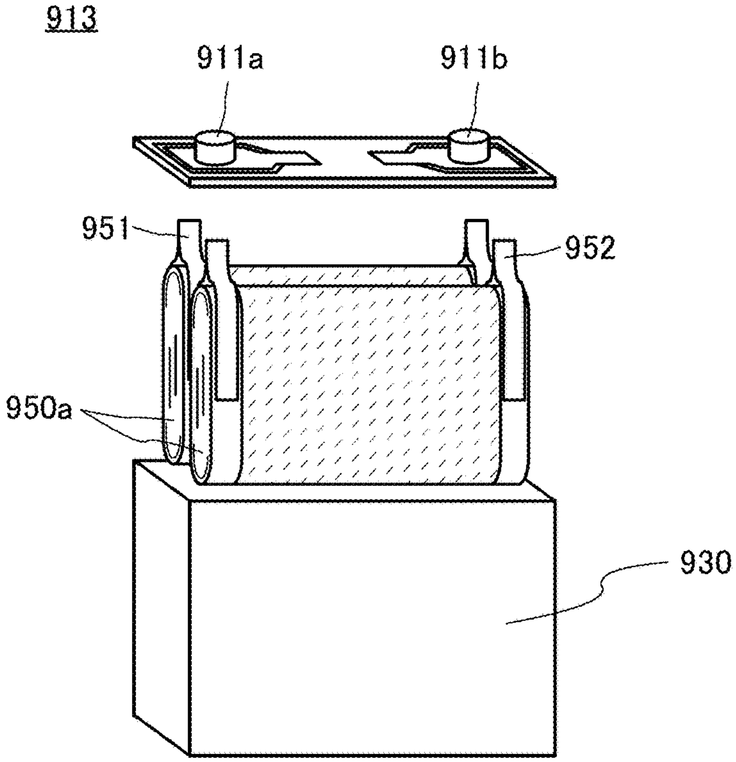
Figure 14C:
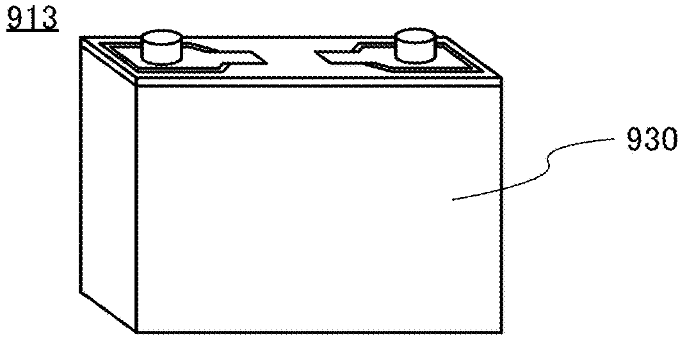

As illustrated in FIG. 14A to FIG. 14C, the secondary battery 913 may include a wound body 950*a*. The wound body 950*a* illustrated in FIG. 14A includes the negative electrode 931, the positive electrode 932, and the separators 933. The negative electrode 931 includes a negative electrode active material layer 931*a*. The positive electrode 932 includes a positive electrode active material layer 932*a*.

The positive electrode active material 100 obtained in the above embodiment is used for the positive electrode 932, whereby the secondary battery 913 can have high capacity, high charge and discharge capacity, and excellent cycle performance.

The separator 933 has a larger width than the negative electrode active material layer 931*a* and the positive electrode active material layer 932*a*, and is wound to overlap with the negative electrode active material layer 931*a* and the positive electrode active material layer 932*a*. In terms of safety, the width of the negative electrode active material layer 931*a* is preferably larger than that of the positive electrode active material layer 932*a*. The wound body 950*a* having such a shape is preferable because of its high level of safety and high productivity.

As illustrated in FIG. 14B, the negative electrode 931 is electrically connected to the terminal 951. The terminal 951 is electrically connected to a terminal 911*a*. The positive electrode 932 is electrically connected to the terminal 952. The terminal 952 is electrically connected to a terminal 911*b*.

As illustrated in FIG. 14C, the wound body 950*a* and an electrolyte solution are covered with the housing 930, whereby the secondary battery 913 is completed. The housing 930 is preferably provided with a safety valve, an overcurrent protection element, and the like. In order to prevent the battery from exploding, a safety valve is a valve to be released when the internal pressure of the housing 930 reaches a predetermined pressure.

As illustrated in FIG. 14B, the secondary battery 913 may include a plurality of the wound bodies 950*a*. The use of the plurality of wound bodies 950*a* enables the secondary battery 913 to have higher charge and discharge capacity. The description of the secondary battery 913 illustrated in FIG. 13A to FIG. 13C can be referred to for the other components of the secondary battery 913 illustrated in FIG. 14A and FIG. 14B.

<Laminated Secondary Battery>

Figure 15A:
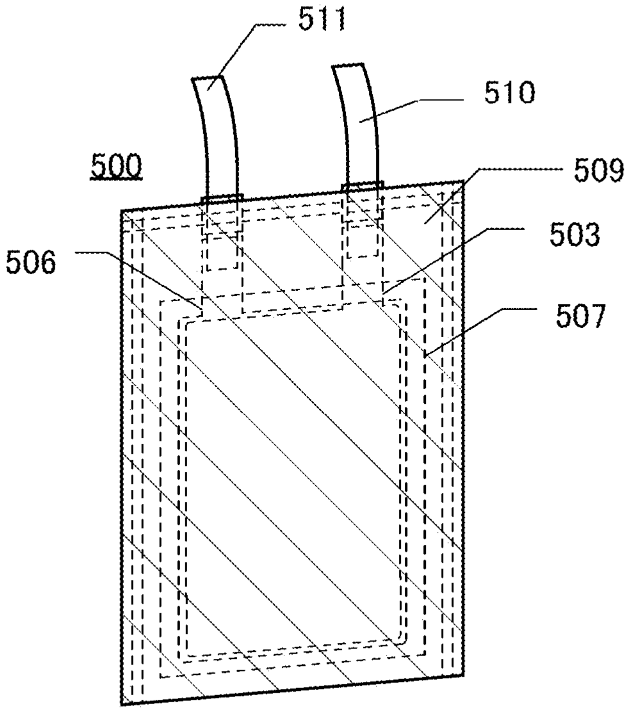
FIG. 15A and FIG. 15B are diagrams illustrating external views of secondary batteries.
Figure 15B:
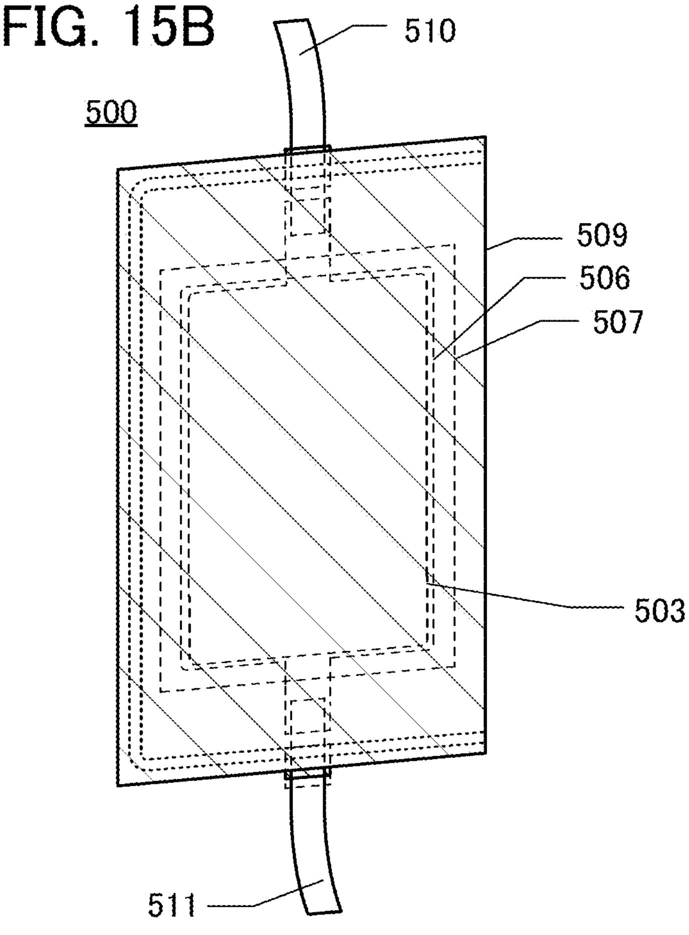

Next, examples of the appearance of a laminated secondary battery are illustrated in FIG. 15A and FIG. 15B. In FIG. 15A and FIG. 15B, a positive electrode 503, a negative electrode 506, a separator 507, an exterior body 509, a positive electrode lead electrode 510, and a negative electrode lead electrode 511 are included.

Figure 16A:
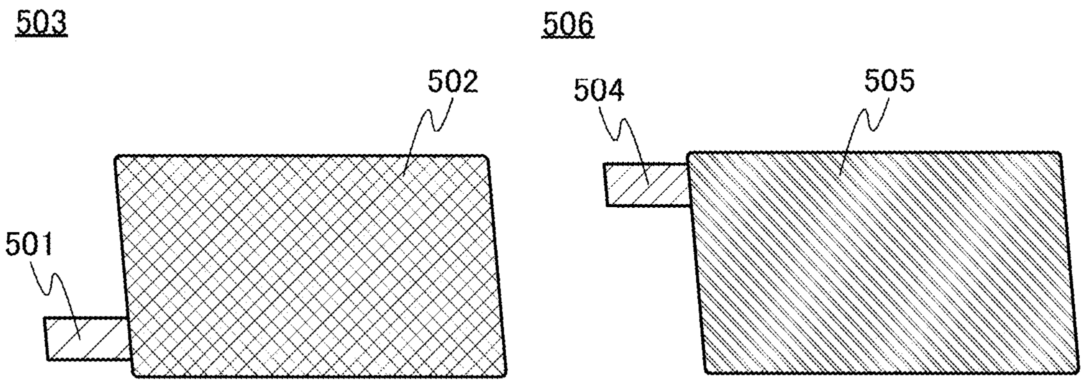
FIG. 16A to FIG. 16C are diagrams illustrating a method for manufacturing a secondary battery.

FIG. 16A illustrates the appearance of the positive electrode 503 and the negative electrode 506. The positive electrode 503 includes a positive electrode current collector 501, and a positive electrode active material layer 502 is formed on a surface of the positive electrode current collector 501. The positive electrode 503 also includes a region where the positive electrode current collector 501 is partly exposed (hereinafter, referred to as a tab region). The negative electrode 506 includes a negative electrode current collector 504, and a negative electrode active material layer 505 is formed on a surface of the negative electrode current collector 504. The negative electrode 506 also includes a region where the negative electrode current collector 504 is partly exposed, that is, a tab region. The areas and the shapes of the tab regions included in the positive electrode and the negative electrode are not limited to the examples illustrated in FIG. 16A.

<Method of Fabricating Laminated Secondary Battery>

Figure 16B:
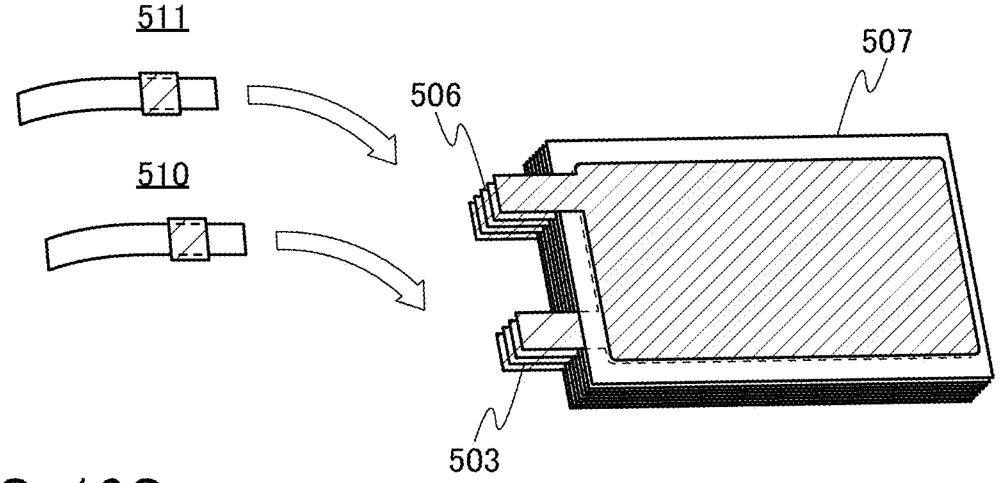

Here, an example of a method of fabricating the laminated secondary battery whose external view is illustrated in FIG. 15A will be described with reference to FIG. 16B and FIG. 16C.

First, the negative electrode 506, the separator 507, and the positive electrode 503 are stacked. FIG. 16B illustrates the negative electrodes 506, the separators 507, and the positive electrodes 503 that are stacked. Here, an example in which five negative electrodes and four positive electrodes are used is shown. This is also be referred to as a stack including the negative electrodes, the separators, and the positive electrodes. Next, the tab regions of the positive electrodes 503 are bonded to each other, and the positive electrode lead electrode 510 is bonded to the tab region of the positive electrode on the outermost surface. The bonding can be performed by ultrasonic welding, for example. In a similar manner, the tab regions of the negative electrodes 506 are bonded to each other, and the negative electrode lead electrode 511 is bonded to the tab region of the negative electrode on the outermost surface.

After that, the negative electrodes 506, the separators 507, and the positive electrodes 503 are placed over the exterior body 509.

Figure 16C:
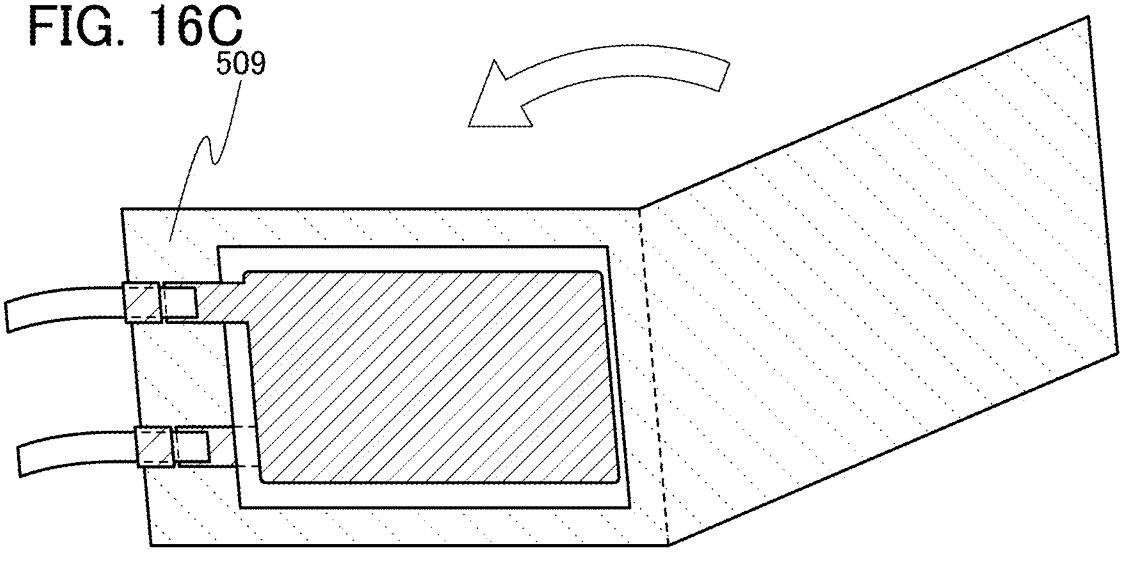

Subsequently, the exterior body 509 is folded along a portion shown by a dashed line, as illustrated in FIG. 16C. Then, the outer edges of the exterior body 509 are bonded to each other. The bonding can be performed by thermocompression, for example. At this time, an unbonded region (hereinafter, referred to as an inlet) is provided for part (or one side) of the exterior body 509 so that an electrolyte solution can be introduced later.

Next, the electrolyte solution is introduced into the exterior body 509 from the inlet of the exterior body 509. The electrolyte solution is preferably introduced in a reduced pressure atmosphere or in an inert atmosphere. Lastly, the inlet is sealed by bonding. In this manner, a laminated secondary battery 500 can be fabricated.

The positive electrode active material 100 described in the above embodiment is used for the positive electrode 503, whereby the secondary battery 500 can have high capacity, high charge and discharge capacity, and excellent cycle performance.

[Examples of Battery Pack]

Examples of a secondary battery pack of one embodiment of the present invention that is capable of wireless charging using an antenna will be described with reference to FIG. 17A to FIG. 17C.

Figure 17A:
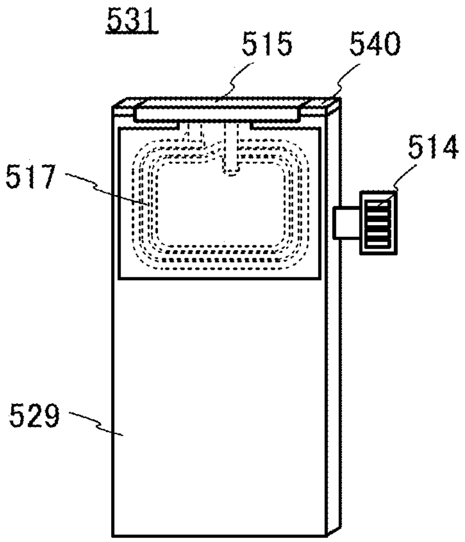
FIG. 17A to FIG. 17C are diagrams illustrating structure examples of a battery pack.

FIG. 17A is a diagram illustrating the appearance of a secondary battery pack 531 that has a rectangular solid shape with a small thickness (also referred to as a flat plate shape with a certain thickness). FIG. 17B is a diagram illustrating a structure of the secondary battery pack 531. The secondary battery pack 531 includes a circuit board 540 and a secondary battery 513. A label 529 is attached to the secondary battery 513. The circuit board 540 is fixed by a sealant 515. The secondary battery pack 531 also includes an antenna 517.

A wound body or a stack may be included inside the secondary battery 513.

Figure 17B:
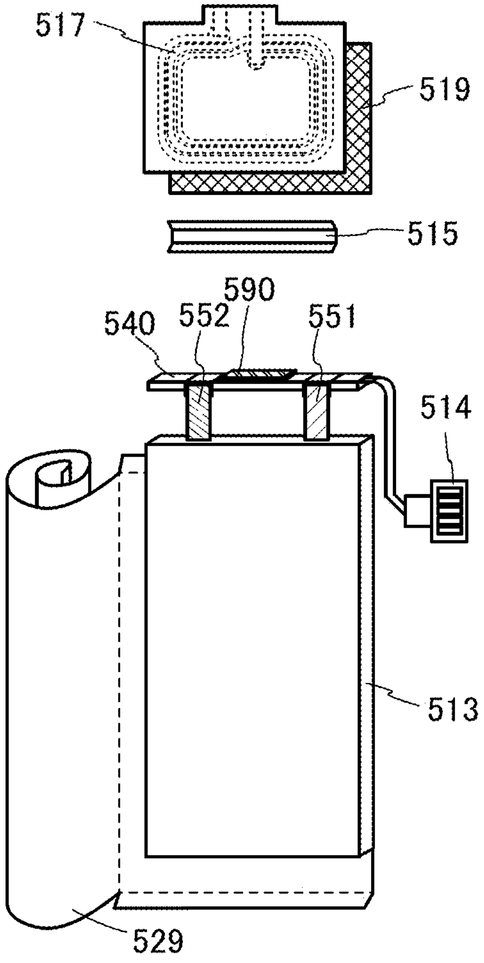

In the secondary battery pack 531, a control circuit 590 is provided over the circuit board 540 as illustrated in FIG. 17B, for example. The circuit board 540 is electrically connected to a terminal 514. The circuit board 540 is electrically connected to the antenna 517, one 551 of a positive electrode lead and a negative electrode lead of the secondary battery 513, and the other 552 of the positive electrode lead and the negative electrode lead.

Figure 17C:
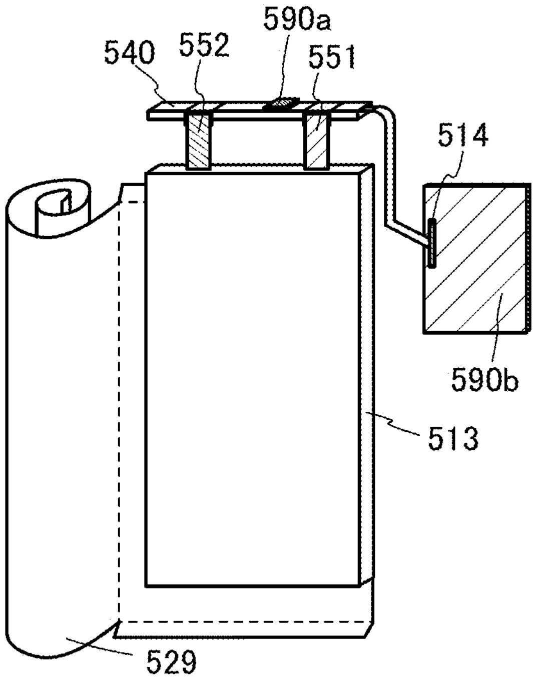

Alternatively, as illustrated in FIG. 17C, a circuit system 590*a* provided over the circuit board 540 and a circuit system 590*b* electrically connected to the circuit board 540 through the terminal 514 may be included.

The circuit board 540 or the circuit system 590*b* preferably includes the second algorithm and the fourth algorithm described in Embodiment 1.

Note that the shape of the antenna 517 is not limited to a coil shape and may be a linear shape or a plate shape, for example. Furthermore, a planar antenna, an aperture antenna, a traveling-wave antenna, an EH antenna, a magnetic-field antenna, a dielectric antenna, or the like may be used. Alternatively, the antenna 517 may be a flat-plate conductor. The flat-plate conductor can serve as one of conductors for electric field coupling. That is, the antenna 517 can function as one of two conductors of a capacitor. Thus, electric power can be transmitted and received not only by an electromagnetic field or a magnetic field but also by an electric field.

The secondary battery pack 531 includes a layer 519 between the antenna 517 and the secondary battery 513. The layer 519 has a function of blocking an electromagnetic field from the secondary battery 513, for example. As the layer 519, a magnetic material can be used, for example.

The contents in this embodiment can be freely combined with the contents in the other embodiments.

Embodiment 4

In this embodiment, an example in which an all-solid-state battery is fabricated using the positive electrode active material 100 obtained in the above embodiment will be described.

Figure 18A:
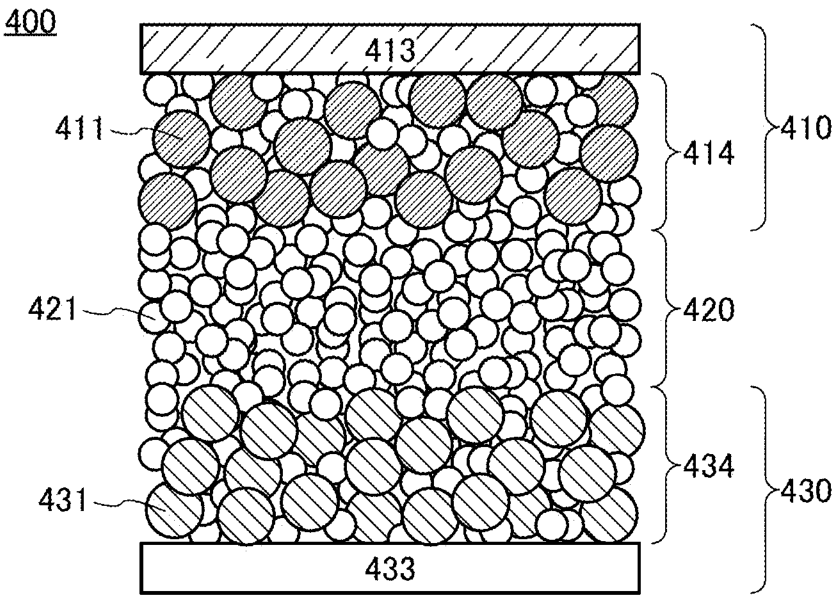
FIG. 18A and FIG. 18B are diagrams illustrating examples of a secondary battery.

As illustrated in FIG. 18A, a secondary battery 400 of one embodiment of the present invention includes a positive electrode 410, a solid electrolyte layer 420, and a negative electrode 430.

The positive electrode 410 includes a positive electrode current collector 413 and a positive electrode active material layer 414. The positive electrode active material layer 414 includes a positive electrode active material 411 and a solid electrolyte 421. The positive electrode active material 100 obtained in the above embodiment is used as the positive electrode active material 411. The positive electrode active material layer 414 may include a conductive material and a binder.

The solid electrolyte layer 420 includes the solid electrolyte 421. The solid electrolyte layer 420 is positioned between the positive electrode 410 and the negative electrode 430 and is a region that includes neither the positive electrode active material 411 nor a negative electrode active material 431.

Figure 18B:
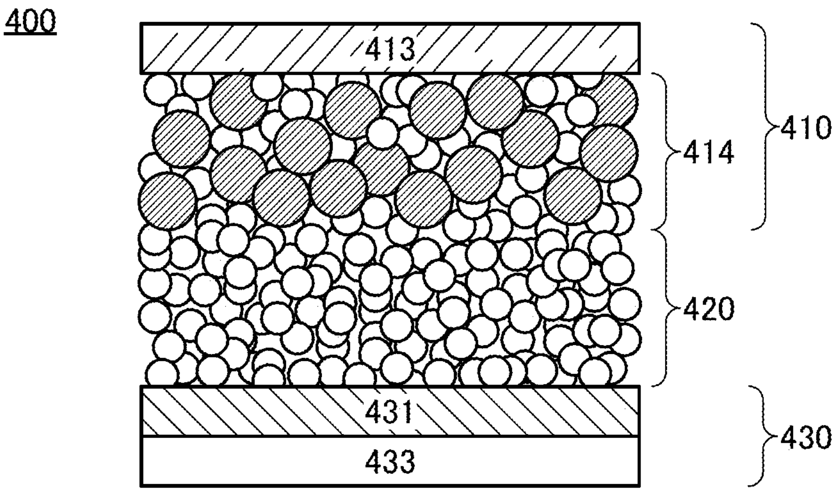

The negative electrode 430 includes a negative electrode current collector 433 and a negative electrode active material layer 434. The negative electrode active material layer 434 includes the negative electrode active material 431 and the solid electrolyte 421. The negative electrode active material layer 434 may include a conductive material and a binder. Note that when metal lithium is used as the negative electrode active material 431, metal lithium does not need to be processed into particles; thus, the negative electrode 430 that does not include the solid electrolyte 421 can be formed, as illustrated in FIG. 18B. The use of metal lithium for the negative electrode 430 is preferable because the energy density of the secondary battery 400 can be increased.

As the solid electrolyte 421 included in the solid electrolyte layer 420, a sulfide-based solid electrolyte, an oxide-based solid electrolyte, or a halide-based solid electrolyte can be used, for example.

The sulfide-based solid electrolyte includes a thio-LISICON-based material (e.g., $Li_{10}GeP_2S_{12}$ or $Li_{3.25}Ge_{0.25}P_{0.75}S_4$), sulfide glass (e.g., $70Li_2S \cdot 30P_2S_5$, $30Li_2S \cdot 26B_2S_3 \cdot 44LiI$, $63Li_2S \cdot 36SiS_2 \cdot 1Li_3PO_4$, $57Li_2S \cdot 38SiS_2 \cdot 5Li_4SiO_4$, or $50Li_2S \cdot 50GeS_2$), or sulfide-based crystallized glass (e.g., $Li_7P_3S_{11}$ or $Li_{3.25}P_{0.95}S_4$). The sulfide-based solid electrolyte has advantages such as high conductivity of some materials, low-temperature synthesis, and ease of maintaining a path for electrical conduction after charging and discharging because of its relative softness.

The oxide-based solid electrolyte includes a material with a perovskite crystal structure (e.g., $La_{2/3-x}Li_{3x}TiO_3$), a material with a NASICON crystal structure (e.g., $Li_{1-Y}Al_YTi_{2-Y}(PO_4)_3$), a material with a garnet crystal structure (e.g., $Li_7La_3Zr_2O_{12}$), a material with a LISICON crystal structure (e.g., $Li_{14}ZnGe_4O_{16}$), LLZO ($Li_7La_3Zr_2O_{12}$), oxide glass (e.g., $Li_3PO_4$—$Li_4SiO_4$ or $50Li_4SiO_4 \cdot 50Li_3BO_3$), or oxide-based crystallized glass (e.g., $Li_{1.07}Al_{0.69}Ti_{1.46}(PO_4)_3$ or $Li_{1.5}Al_{0.5}Ge_{1.5}(PO_4)_3$). The oxide-based solid electrolyte has an advantage of stability in the air.

Examples of the halide-based solid electrolyte include $LiAlCl_4$, $Li_3InBr_6$, LiF, LiCl, LiBr, and LiI. Moreover, a composite material in which pores of porous aluminum oxide or porous silica are filled with such a halide-based solid electrolyte can be used as the solid electrolyte.

Alternatively, different solid electrolytes may be mixed and used.

In particular, $Li_{1+x}Al_xTi_{2-x}(PO_4)_3$ ($0<x<1$) having a NASICON crystal structure (hereinafter, LATP) is preferable because it contains aluminum and titanium, each of which is the element the positive electrode active material used in the secondary battery 400 of one embodiment of the present invention is allowed to contain, and thus synergy of improving the cycle performance is expected. Moreover, higher productivity due to the reduction in the number of steps is expected. Note that in this specification and the like, aNASICON crystal structure refers to a compound that is represented by $M_2(XO_4)_3$ (M: transition metal; X: S, P, As, Mo, W, or the like) and has a structure in which $MO_6$ octahedrons and $XO_4$ tetrahedrons that share common corners are arranged three-dimensionally.

[Exterior Body and Shape of Secondary Battery]

An exterior body of the secondary battery 400 of one embodiment of the present invention can be formed using a variety of materials and have a variety of shapes, and preferably has a function of applying pressure to the positive electrode, the solid electrolyte layer, and the negative electrode.

FIG. 19 illustrates an example of a cell for evaluating materials of an all-solid-state battery, for example.

Figure 19A:
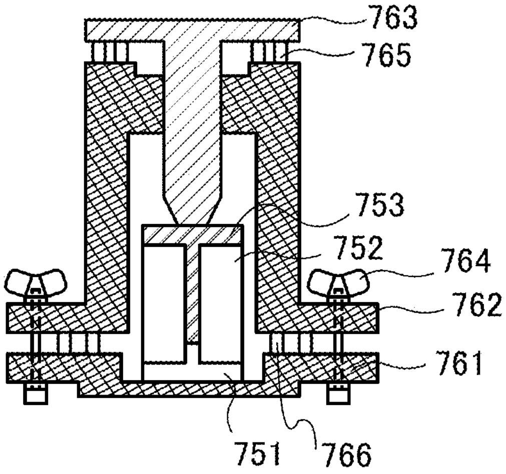
FIG. 19A to FIG. 19C are diagrams illustrating an example of a secondary battery.

FIG. 19A is a cross-sectional schematic view of the evaluation cell, and the evaluation cell includes a lower component 761, an upper component 762, and a fixation screw or a butterfly nut 764 for fixing these components; by rotating a pressure screw 763, an electrode plate 753 is pressed to fix an evaluation material. An insulator 766 is provided between the lower component 761 and the upper component 762 that are made of a stainless steel material. An 0 ring 765 for hermetic sealing is provided between the upper component 762 and the pressure screw 763.

Figure 19B:
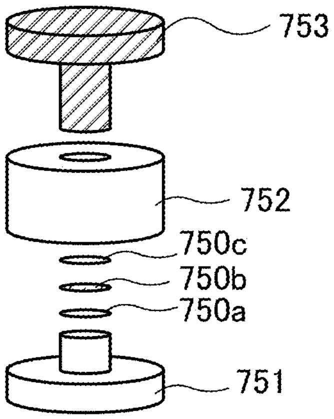

The evaluation material is placed on an electrode plate 751, surrounded by an insulating tube 752, and pressed from above by the electrode plate 753. FIG. 19B is an enlarged perspective view of the evaluation material and its vicinity.

Figure 19C:
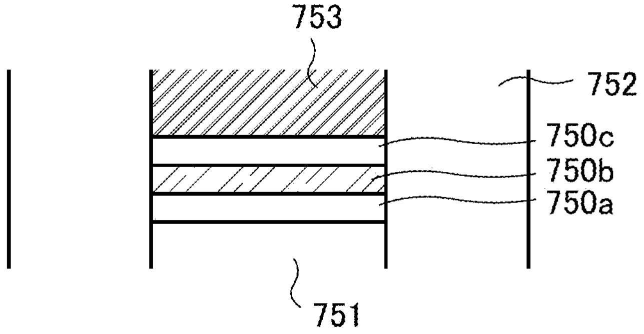

A stack of a positive electrode 750*a*, a solid electrolyte layer 750*b*, and a negative electrode 750*c* is illustrated here as an example of the evaluation material, and its cross-sectional view is illustrated in FIG. 19C. Note that the same portions in FIG. 19A to FIG. 19C are denoted by the same reference numerals.

The electrode plate 751 and the lower component 761 that are electrically connected to the positive electrode 750*a* correspond to a positive electrode terminal. The electrode plate 753 and the upper component 762 that are electrically connected to the negative electrode 750*c* correspond to a negative electrode terminal. The electric resistance or the like can be measured while pressure is applied to the evaluation material through the electrode plate 751 and the electrode plate 753.

A package having excellent airtightness is preferably used as the exterior body of the secondary battery of one embodiment of the present invention. For example, a ceramic package or a resin package can be used. The exterior body is sealed preferably in a closed atmosphere where the outside air is blocked, for example, in a glove box.

Figure 20A:
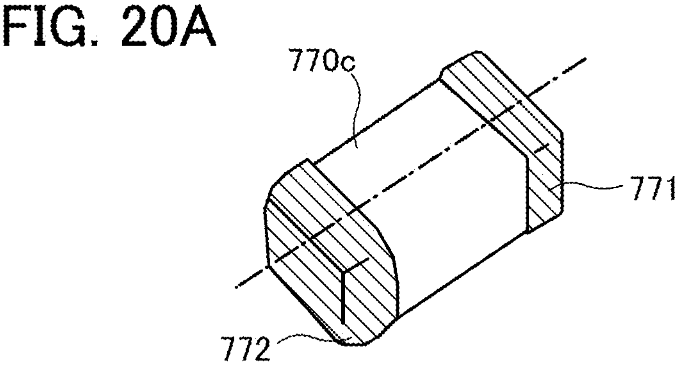
FIG. 20A and FIG. 20B are diagrams illustrating an example of a secondary battery.

FIG. 20A illustrates a perspective view of a secondary battery of one embodiment of the present invention that has an exterior body and a shape different from those in FIG. 19. The secondary battery in FIG. 20A includes external electrodes 771 and 772 and is sealed with an exterior body including a plurality of package components.

Figure 20B:
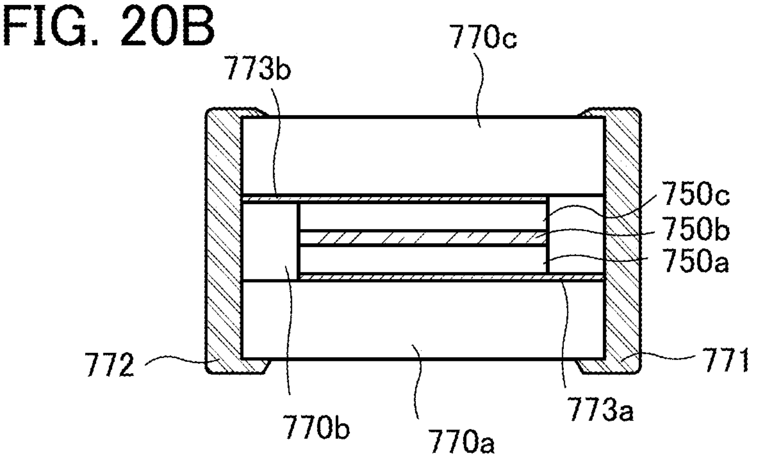

FIG. 20B illustrates an example of a cross section along the dashed-dotted line in FIG. 20A. A stack including the positive electrode 750*a*, the solid electrolyte layer 750*b*, and the negative electrode 750*c* has a structure of being surrounded and sealed by a package component 770*a* including an electrode layer 773*a* on a flat plate, a frame-like package component 770*b*, and a package component 770*c* including an electrode layer 773*b* on a flat plate. For the package components 770*a*, 770*b*, and 770*c*, an insulating material, e.g., a resin material and ceramic, can be used.

The external electrode 771 is electrically connected to the positive electrode 750*a* through the electrode layer 773*a* and functions as a positive electrode terminal. The external electrode 772 is electrically connected to the negative electrode 750*c* through the electrode layer 773*b* and functions as a negative electrode terminal.

The use of the positive electrode active material 100 obtained in the above embodiment can achieve an all-solid-state secondary battery having a high energy density and favorable output characteristics.

The contents in this embodiment can be combined with the contents in the other embodiments as appropriate.

Embodiment 5

In this embodiment, an example in which a secondary battery different from the cylindrical secondary battery in FIG. 12D is used in an electric vehicle (EV) is described with reference to FIG. 21C.

The electric vehicle is provided with first batteries 1301*a* and 1301*b* as main secondary batteries for driving and a second battery 1311 that supplies electric power to an inverter 1312 for starting a motor 1304. The second battery 1311 is also referred to as a cranking battery (also referred to as a starter battery). The second battery 1311 only needs high output and high capacity is not so much needed; the capacity of the second battery 1311 is lower than that of the first batteries 1301*a* and 1301*b*.

The internal structure of the first battery 1301*a* may be the wound structure illustrated in FIG. 13A or FIG. 14C or the stacked-layer structure illustrated in FIG. 15A or FIG. 15B. Alternatively, the first battery 1301*a* may be an all-solid-state battery in Embodiment 4. The use of the all-solid-state battery in Embodiment 4 as the first battery 1301*a* can achieve high capacity, improvement in safety, and reduction in size and weight.

Although this embodiment describes an example in which the two first batteries 1301*a* and 1301*b* are connected in parallel, three or more batteries may be connected in parallel. In the case where the first battery 1301*a* can store sufficient electric power, the first battery 1301*b* may be omitted. By constituting a battery pack including a plurality of secondary batteries, large electric power can be extracted. The plurality of secondary batteries may be connected in parallel, connected in series, or connected in series after being connected in parallel. The plurality of secondary batteries are also referred to as an assembled battery.

In order to cut off electric power from the plurality of secondary batteries, the secondary batteries in the vehicle include a service plug or a circuit breaker that can cut off high voltage without the use of equipment. The first battery 1301*a* is provided with such a service plug or a circuit breaker.

Electric power from the first batteries 1301*a* and 1301*b* is mainly used to rotate the motor 1304 and is supplied to in-vehicle parts for 42 V (such as an electric power steering 1307, a heater 1308, and a defogger 1309) through a DCDC circuit 1306. Even in the case where there is a rear motor 1317 for rear wheels, the first battery 1301*a* is used to rotate the rear motor 1317.

The second battery 1311 supplies electric power to in-vehicle parts for 14 V (such as a stereo 1313, a power window 1314, and lamps 1315) through a DCDC circuit 1310.

The first battery 1301*a* will be described with reference to FIG. 21A.

Figure 21A:
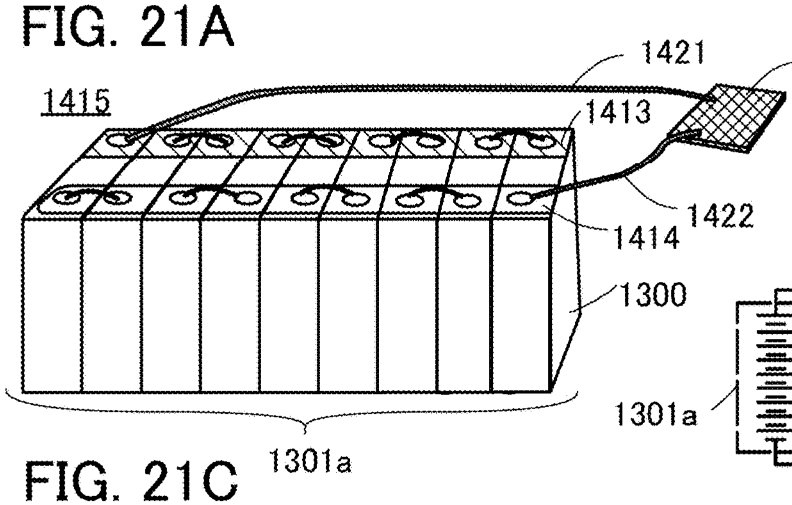
FIG. 21A is a perspective view of a battery pack of one embodiment of the present invention.

FIG. 21A illustrates an example in which nine rectangular secondary batteries 1300 form one battery pack 1415. The nine rectangular secondary batteries 1300 are connected in series; one electrode of each battery is fixed by a fixing portion 1413 made of an insulator, and the other electrode thereof is fixed by a fixing portion 1414 made of an insulator. Although this embodiment describes an example in which the secondary batteries are fixed by the fixing portions 1413 and 1414, they may be stored in a battery container box (also referred to as a housing). Since a vibration or a jolt is assumed to be given to the vehicle from the outside (e.g., a road surface), the plurality of secondary batteries are preferably fixed by the fixing portions 1413 and 1414 and a battery container box, for example. Furthermore, the one electrode is electrically connected to a control circuit portion 1320 through a wiring 1421. The other electrode is electrically connected to the control circuit portion 1320 through a wiring 1422.

The control circuit portion 1320 preferably includes the second algorithm and the fourth algorithm described in Embodiment 1.

The control circuit portion 1320 may include a memory circuit including a transistor using an oxide semiconductor. A charge control circuit or a battery control system that includes a memory circuit including a transistor using an oxide semiconductor is referred to as a BTOS (Battery operating system or Battery oxide semiconductor) in some cases.

A metal oxide functioning as an oxide semiconductor is preferably used. For example, as the oxide, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) or the like is preferably used. In particular, the In-M-Zn oxide that can be used as the oxide is preferably a CAAC-OS (C-Axis Aligned Crystal Oxide Semiconductor) or a CAC-OS (Cloud-Aligned Composite Oxide Semiconductor). Alternatively, an In—Ga oxide or an In—Zn oxide may be used as the oxide. The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. Note that when an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the orientation of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction. The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide is a region having [In] higher than [In] in the composition of the CAC-OS film. Moreover, the second region is a region having [Ga] higher than [Ga] in the composition of the CAC-OS film. Alternatively, for example, the first region is a region having [In] higher than [In] in the second region and [Ga] lower than [Ga] in the second region. Moreover, the second region is a region having [Ga] higher than [Ga] in the first region and [In] lower than [In] in the first region.

Specifically, the first region is a region containing an indium oxide, an indium zinc oxide, or the like as its main component. The second region is a region containing a gallium oxide, a gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide can be found to have a structure in which the region containing In as its main component (the first region) and the region containing Ga as its main component (the second region) are unevenly distributed and mixed.

In the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

An oxide semiconductor has various structures with different properties. Two or more kinds among an amorphous oxide semiconductor, a polycrystalline oxide semiconductor, an a-like OS, a CAC-OS, an nc-OS, and a CAAC-OS may be included in an oxide semiconductor of one embodiment of the present invention.

The control circuit portion 1320 preferably includes a transistor using an oxide semiconductor because it can be used in a high-temperature environment. For the process simplicity, the control circuit portion 1320 may be formed using transistors of the same conductivity type. A transistor using an oxide semiconductor in its semiconductor layer has an operating ambient temperature range of −40° C. to 150° C. inclusive, which is wider than that of a single crystal Si transistor, and thus shows a smaller change in characteristics than the single crystal Si transistor when the secondary battery is overheated. The off-state current of the transistor using an oxide semiconductor is lower than or equal to the lower measurement limit even at 150° C.; meanwhile, the off-state current characteristics of the single crystal Si transistor largely depend on the temperature. For example, at 150° C., the off-state current of the single crystal Si transistor increases, and a sufficiently high current on/off ratio cannot be obtained. The control circuit portion 1320 can improve the safety. When the control circuit portion 1320 is used in combination with a secondary battery including a positive electrode using the positive electrode active material 100 obtained in the above embodiment, the synergy on safety can be obtained.

The control circuit portion 1320 that includes a memory circuit including a transistor using an oxide semiconductor can also function as an automatic control device for the secondary battery to resolve causes of instability, such as a micro-short circuit. Examples of functions of resolving the causes of instability of a secondary battery include prevention of overcharging, prevention of overcurrent, control of overheating during charging, cell balance of an assembled battery, prevention of overdischarging, a battery indicator, automatic control of charge voltage and current amount according to temperature, control of the amount of charge current according to the degree of deterioration, abnormal behavior detection for a micro-short circuit, and anomaly prediction regarding a micro-short circuit; the control circuit portion 1320 has at least one of these functions. Furthermore, the automatic control device for the secondary battery can be extremely small in size.

A micro-short circuit refers to a minute short circuit caused in a secondary battery and refers not to a state where the positive electrode and the negative electrode of a secondary battery are short-circuited so that charging and discharging are impossible, but to a phenomenon in which a slight short-circuit current flows through a minute short-circuit portion. Since a large voltage change is caused even when a micro-short circuit occurs in a relatively short time in a minute area, the abnormal voltage value might adversely affect estimation to be performed subsequently.

One of the causes of a micro-short circuit is as follows: a plurality of charging and discharging cause an uneven distribution of positive electrode active materials, which leads to local concentration of current in part of the positive electrode and part of the negative electrode, whereby part of a separator stops functioning or a by-product is generated by a side reaction, which is thought to generate a micro short-circuit.

It can be said that the control circuit portion 1320 not only detects a micro-short circuit but also senses terminal voltage of the secondary battery and controls the charge and discharge state of the secondary battery. For example, to prevent overcharging, an output transistor of a charge circuit and an interruption switch can be turned off substantially at the same time.

Figure 21B:
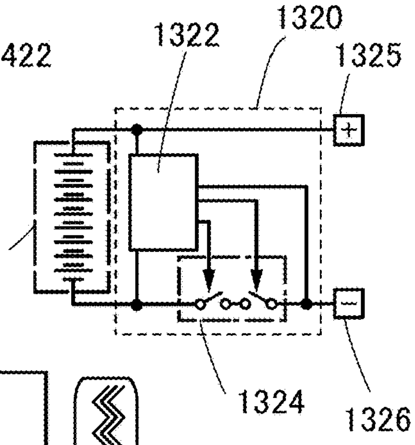
FIG. 21B is a block diagram of the battery pack.
Figure 21C:
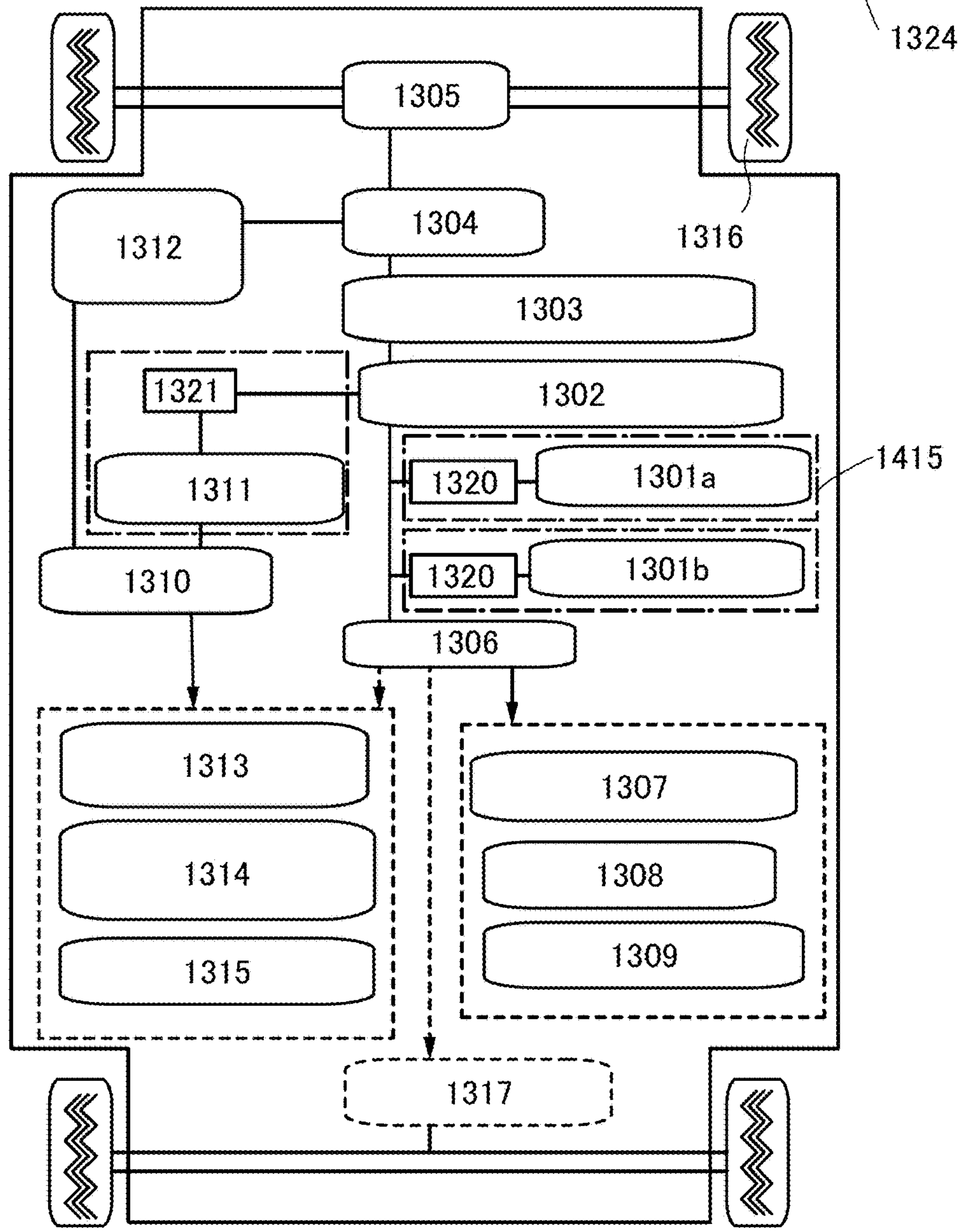
FIG. 21C is a block diagram of a vehicle having a motor.

FIG. 21B illustrates an example of a block diagram of the battery pack 1415 illustrated in FIG. 21A.

The control circuit portion 1320 includes a switch portion 1324 that includes at least a switch for preventing overcharging and a switch for preventing overdischarging, a control circuit 1322 for controlling the switch portion 1324, and a portion for measuring the voltage of the first battery 1301*a*. The control circuit portion 1320 is set to have the upper limit voltage and the lower limit voltage of the secondary battery to be used, and imposes the upper limit of current from the outside, the upper limit of output current to the outside, and the like. The range from the lower limit voltage to the upper limit voltage of the secondary battery falls within the recommended voltage range; when a voltage falls outside the range, the switch portion 1324 operates and functions as a protection circuit. The control circuit portion 1320 can also be referred to as a protection circuit because it controls the switch portion 1324 to prevent overdischarging and overcharging. For example, when the control circuit 1322 detects a voltage that is likely to cause overcharging, current is interrupted by turning off the switch in the switch portion 1324. Furthermore, a function of interrupting current in accordance with a temperature rise may be set by providing a PTC element in the charge and discharge path. The control circuit portion 1320 includes an external terminal 1325 (+IN) and an external terminal 1326 (−IN).

The switch portion 1324 can be formed by a combination of an n-channel transistor and a p-channel transistor. The switch portion 1324 is not limited to a switch including a Si transistor using single crystal silicon; the switch portion 1324 may be formed using, for example, a power transistor containing Ge (germanium), SiGe (silicon germanium), GaAs (gallium arsenide), GaAlAs (gallium aluminum arsenide), InP (indium phosphide), SiC (silicon carbide), ZnSe (zinc selenide), GaN (gallium nitride), GaOx (gallium oxide, where x is a real number greater than 0), or the like. A memory element using an OS transistor can be freely placed by being stacked over a circuit using a Si transistor, for example; hence, integration can be easy. Furthermore, an OS transistor can be fabricated with a manufacturing apparatus similar to that for a Si transistor and thus can be fabricated at low cost. That is, the control circuit portion 1320 using an OS transistor can be stacked over the switch portion 1324 so that they can be integrated into one chip. Since the volume occupied by the control circuit portion 1320 can be reduced, a reduction in size is possible.

The first batteries 1301*a* and 1301*b* mainly supply electric power to in-vehicle devices for 42 V (for a high-voltage system), and the second battery 1311 supplies electric power to in-vehicle devices for 14 V (for a low-voltage system).

In this embodiment, an example in which a lithium-ion secondary battery is used as both the first battery 1301*a* and the second battery 1311 is described. As the second battery 1311, a lead storage battery, an all-solid-state battery, or an electric double layer capacitor may be used. For example, the all-solid-state battery in Embodiment 4 may be used. The use of the all-solid-state battery in Embodiment 4 as the second battery 1311 can achieve high capacity and reduction in size and weight.

Regenerative energy generated by rolling of tires 1316 is transmitted to the motor 1304 through a gear 1305, and is stored in the second battery 1311 from a motor controller 1303 and a battery controller 1302 through a control circuit portion 1321. Alternatively, the regenerative energy is stored in the first battery 1301*a* from the battery controller 1302 through the control circuit portion 1320. Alternatively, the regenerative energy is stored in the first battery 1301*b* from the battery controller 1302 through the control circuit portion 1320. For efficient charging with regenerative energy, the first batteries 1301*a* and 1301*b* are desirably capable of fast charging.

The battery controller 1302 can set the charge voltage, charge current, and the like of the first batteries 1301*a* and 1301*b*. The battery controller 1302 can set charge conditions in accordance with charge characteristics of a secondary battery to be used, so that fast charging can be performed.

Although not illustrated, in the case of connection to an external charger, an outlet of the charger or a connection cable of the charger is electrically connected to the battery controller 1302. Electric power supplied from the external charger is stored in the first batteries 1301*a* and 1301*b* through the battery controller 1302. Some chargers are provided with a control circuit, in which case the function of the battery controller 1302 is not used; to prevent overcharging, the first batteries 1301*a* and 1301*b* are preferably charged through the control circuit portion 1320. In addition, the outlet of the charger or the connection cable of the charger is sometimes provided with a control circuit. The control circuit portion 1320 is also referred to as an ECU (Electronic Control Unit). The ECU is connected to a CAN (Controller Area Network) provided in the electric vehicle. The CAN is a type of a serial communication standard used as an in-vehicle LAN. The ECU includes a microcomputer. Moreover, the ECU uses a CPU or a GPU.

External chargers installed at charge stations and the like have a 100 V outlet, a 200 V outlet, and a three-phase 200 V outlet with 50 kW, for example. Furthermore, charging can be performed with electric power supplied from external charge equipment by a contactless power feeding method or the like.

For fast charging, secondary batteries that can withstand high-voltage charging have been desired to perform charging in a short time.

The above-described secondary battery in this embodiment uses the positive electrode active material 100 obtained in the above embodiment. Moreover, it is possible to achieve a secondary battery in which graphene is used as a conductive material, an electrode layer is formed thick to increase the loading amount while suppressing a reduction in capacity, and the electrical characteristics are significantly improved in synergy with maintenance of high capacity. This secondary battery is particularly effectively used in a vehicle; it is possible to provide a vehicle that has a long cruising range, specifically one charge mileage of 500 km or greater, without increasing the proportion of the weight of the secondary battery to the weight of the entire vehicle.

Specifically, in the above-described secondary battery in this embodiment, the use of the positive electrode active material 100 described in the above embodiment can increase the operating voltage of the secondary battery, and the increase in charge voltage can increase the available capacity. Moreover, using the positive electrode active material 100 described in the above embodiment in the positive electrode can provide an automotive secondary battery having excellent cycle performance.

Next, examples in which the secondary battery of one embodiment of the present invention is mounted on a vehicle, typically a transport vehicle, will be described.

Mounting the secondary battery illustrated in any one of FIG. 12D, FIG. 14C, and FIG. 21A on vehicles can achieve next-generation clean energy vehicles such as hybrid vehicles (HVs), electric vehicles (EVs), and plug-in hybrid vehicles (PHVs). The secondary battery can also be mounted on transport vehicles such as agricultural machines, motorized bicycles including motor-assisted bicycles, motorcycles, electric wheelchairs, electric carts, boats and ships, submarines, aircraft such as fixed-wing aircraft and rotary-wing aircraft, rockets, artificial satellites, space probes, planetary probes, and spacecraft. The secondary battery of one embodiment of the present invention can be a secondary battery with high capacity. Thus, the secondary battery of one embodiment of the present invention is suitable for reduction in size and reduction in weight and is preferably used in transport vehicles.

Figure 22A:
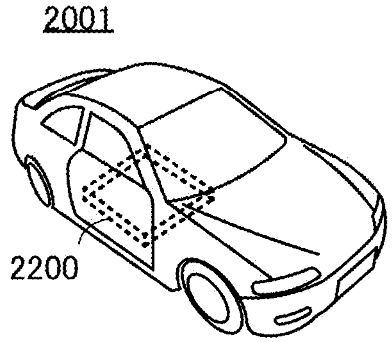
FIG. 22A to FIG. 22D are diagrams illustrating examples of transport vehicles.

FIG. 22A to FIG. 22D illustrate examples of transport vehicles as examples of vehicles using one embodiment of the present invention. A motor vehicle 2001 illustrated in FIG. 22A is an electric vehicle that runs using an electric motor as a driving power source. Alternatively, the motor vehicle 2001 is a hybrid vehicle that can appropriately select an electric motor or an engine as a driving power source. In the case where the secondary battery is mounted on the vehicle, an example of the secondary battery described in Embodiment 3 is provided at one position or several positions. The motor vehicle 2001 illustrated in FIG. 22A includes a battery pack 2200, and the battery pack includes a secondary battery module in which a plurality of secondary batteries are connected to each other. Moreover, the battery pack preferably includes a charge control device that is electrically connected to the secondary battery module. The charge control device preferably includes the second algorithm and the fourth algorithm described in Embodiment 1.

The motor vehicle 2001 can be charged when the secondary battery included in the motor vehicle 2001 is supplied with electric power from external charge equipment by a plug-in system, a contactless charge system, or the like. In charging, a given method such as CHAdeMO (registered trademark) or Combined Charging System may be employed as a charging method, the standard of a connector, and the like as appropriate. The secondary battery may be a charge station provided in a commerce facility or a household power supply. For example, with the use of the plug-in system, the power storage device mounted on the motor vehicle 2001 can be charged by being supplied with electric power from the outside. Charging can be performed by converting AC power into DC power through a converter such as an ACDC converter.

Although not illustrated, the vehicle can include a power receiving device so as to be charged by being supplied with electric power from an above-ground power transmitting device in a contactless manner. For the contactless power feeding system, by fitting a power transmitting device in a road or an exterior wall, charging can be performed not only when the vehicle is stopped but also when driven. In addition, the contactless power feeding system may be utilized to perform transmission and reception of electric power between two vehicles. Furthermore, a solar cell may be provided in the exterior of the vehicle to charge the secondary battery when the vehicle stops and moves. To supply electric power in such a contactless manner, an electromagnetic induction method or a magnetic resonance method can be used.

Figure 22B:
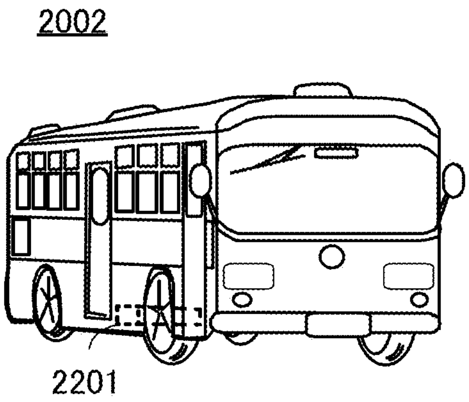

FIG. 22B illustrates a large transporter 2002 having a motor controlled by electricity, as an example of a transport vehicle. The secondary battery module of the transporter 2002 has a cell unit of four secondary batteries with a nominal voltage of 3.0 V or higher and 5.0 V or lower, and 48 cells are connected in series to have 170 V as the maximum voltage. A battery pack 2201 has the same function as that in FIG. 22A except for, for example, the number of secondary batteries configuring the secondary battery module; thus, the description is omitted.

Figure 22C:
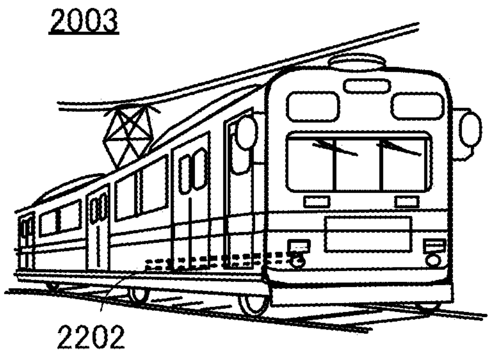

FIG. 22C illustrates a large transport vehicle 2003 having a motor controlled by electricity as an example. A secondary battery module of the transport vehicle 2003 has 100 or more secondary batteries with a nominal voltage of 3.0 V or higher and 5.0 V or lower connected in series, and the maximum voltage is 600 V, for example. When a secondary battery including the positive electrode active material 100 described in the above embodiment for a positive electrode is used, a secondary battery having favorable rate performance and charge and discharge cycle performance can be manufactured, which can contribute to higher performance and a longer lifetime of the transport vehicle 2003. A battery pack 2202 has the same function as that in FIG. 22A except for, for example, the number of secondary batteries configuring the secondary battery module; thus, the description is omitted.

Figure 22D:
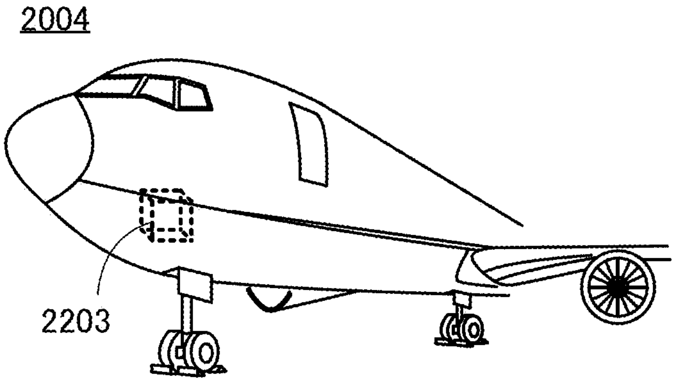

FIG. 22D illustrates an aircraft 2004 having a combustion engine as an example. The aircraft 2004 illustrated in FIG. 22D can be regarded as a kind of transport vehicles since it is provided with wheels for takeoff and landing, and has a battery pack 2203 including a secondary battery module and a charge control device; the secondary battery module includes a plurality of connected secondary batteries.

The secondary battery module of the aircraft 2004 has eight 4 V secondary batteries connected in series, which has the maximum voltage of 32 V, for example. The battery pack 2203 has the same function as that in FIG. 22A except for, for example, the number of secondary batteries configuring the secondary battery module; thus, the description is omitted.

The contents in this embodiment can be combined with the contents in the other embodiments as appropriate.

Embodiment 6

In this embodiment, examples in which the secondary battery of one embodiment of the present invention is mounted on a building will be described with reference to FIG. 23A and FIG. 23B.

Figure 23A:
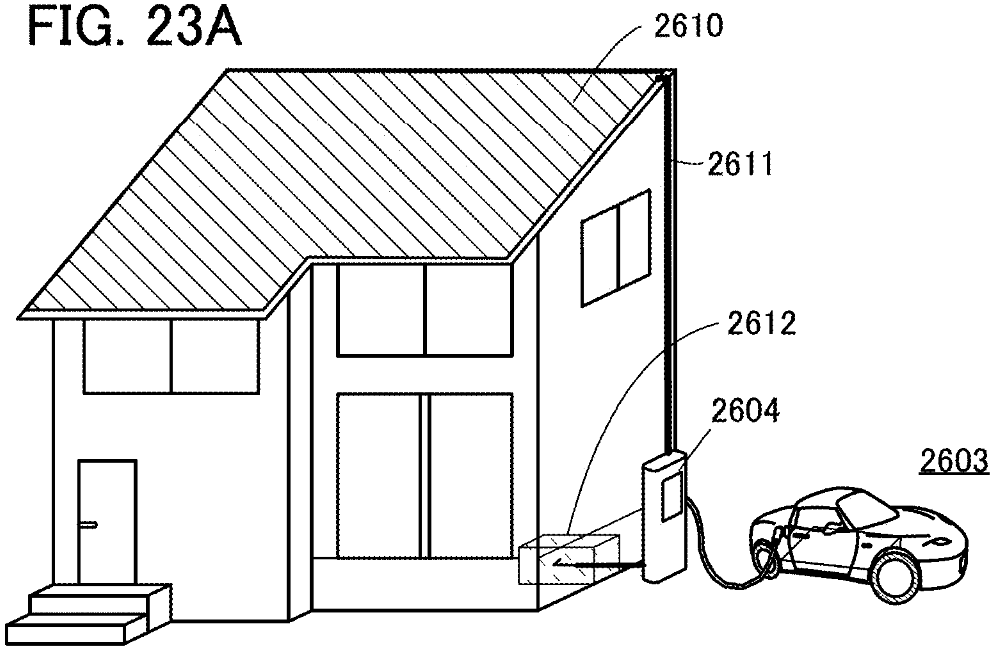
FIG. 23A and FIG. 23B are diagrams illustrating a power storage device of one embodiment of the present invention.

A house illustrated in FIG. 23A includes a power storage device 2612 including the secondary battery of one embodiment of the present invention and a solar panel 2610. The power storage device 2612 is electrically connected to the solar panel 2610 through a wiring 2611 or the like. The power storage device 2612 may be electrically connected to ground-based charge equipment 2604. The power storage device 2612 can be charged with electric power generated by the solar panel 2610. A secondary battery included in a vehicle 2603 can be charged with the electric power stored in the power storage device 2612 through the charge equipment 2604. The power storage device 2612 is preferably provided in an underfloor space. The power storage device 2612 is provided in the underfloor space, in which case the space on the floor can be effectively used. Alternatively, the power storage device 2612 may be provided on the floor.

The electric power stored in the power storage device 2612 can also be supplied to other electronic devices in the house. Thus, with the use of the power storage device 2612 of one embodiment of the present invention as an uninterruptible power source, electronic devices can be used even when electric power cannot be supplied from a commercial power source due to power failure or the like.

Figure 23B:
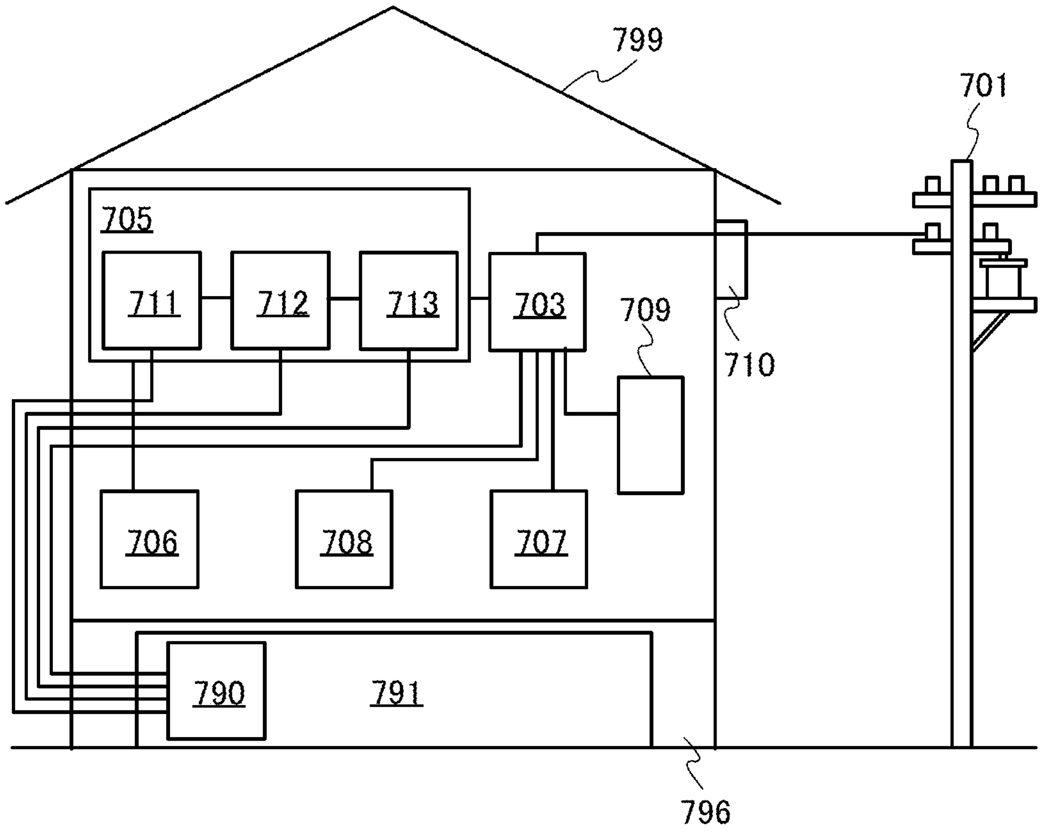

FIG. 23B illustrates an example of a power storage device of one embodiment of the present invention. As illustrated in FIG. 23B, a power storage device 791 of one embodiment of the present invention is provided in an underfloor space 796 of a building 799. The power storage device 791 may be provided with the control circuit described in Embodiment 5, and the use of a secondary battery including a positive electrode using the positive electrode active material 100 obtained in the above embodiment for the power storage device 791 enables the power storage device 791 to have a long lifetime.

The power storage device 791 is provided with a control device 790, and the control device 790 is electrically connected to a distribution board 703, a power storage controller 705 (also referred to as a control device), an indicator 706, and a router 709 through wirings. The control device 790 preferably includes the second algorithm and the fourth algorithm described in Embodiment 1.

Electric power is transmitted from a commercial power source 701 to the distribution board 703 through a service wire mounting portion 710. Moreover, electric power is transmitted to the distribution board 703 from the power storage device 791 and the commercial power source 701, and the distribution board 703 supplies the transmitted electric power to a general load 707 and a power storage load 708 through outlets (not illustrated).

The general load 707 is, for example, an electric device such as a TV or a personal computer. The power storage load 708 is, for example, an electric device such as a microwave, a refrigerator, or an air conditioner.

The power storage controller 705 includes a measuring portion 711, a predicting portion 712, and a planning portion 713. The measuring portion 711 has a function of measuring the amount of electric power consumed by the general load 707 and the power storage load 708 during a day (e.g., from midnight to midnight). The measuring portion 711 may have a function of measuring the amount of electric power of the power storage device 791 and the amount of electric power supplied from the commercial power source 701. The predicting portion 712 has a function of predicting, on the basis of the amount of electric power consumed by the general load 707 and the power storage load 708 during a given day, the demand for electric power consumed by the general load 707 and the power storage load 708 during the next day. The planning portion 713 has a function of making a charge and discharge plan of the power storage device 791 on the basis of the demand for electric power predicted by the predicting portion 712.

The amount of electric power consumed by the general load 707 and the power storage load 708 and measured by the measuring portion 711 can be checked with the indicator 706. It can be checked with an electric device such as a TV or a personal computer through the router 709. Furthermore, it can be checked with a portable electronic terminal such as a smartphone or a tablet through the router 709. With the indicator 706, the electric device, or the portable electronic terminal, for example, the demand for electric power depending on a time period (or per hour) that is predicted by the predicting portion 712 can be checked.

The contents in this embodiment can be combined with the contents in the other embodiments as appropriate.

Embodiment 7

In this embodiment, examples in which a motorcycle and a bicycle are each provided with the power storage device of one embodiment of the present invention will be described.

Figure 24A:
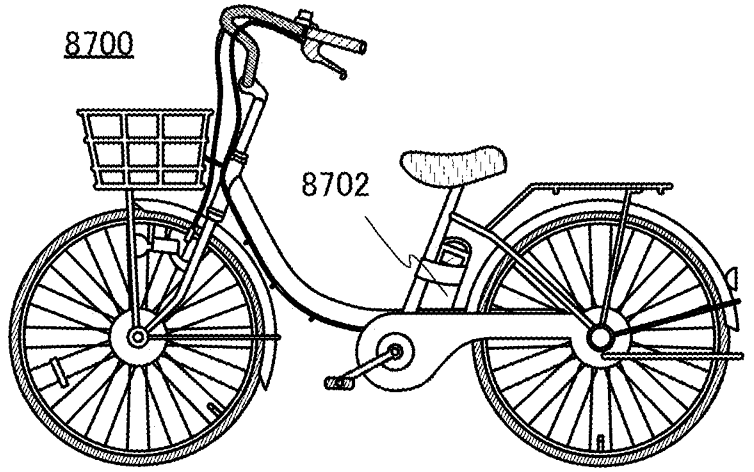
FIG. 24A is a diagram illustrating an electric bicycle.

FIG. 24A illustrates an example of an electric bicycle using the power storage device of one embodiment of the present invention. The power storage device of one embodiment of the present invention can be used for an electric bicycle 8700 illustrated in FIG. 24A. The power storage device of one embodiment of the present invention includes a plurality of storage batteries and a protection circuit, for example.

Figure 24B:
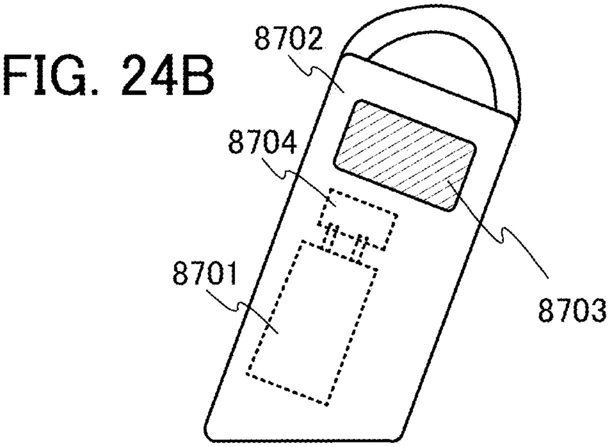
FIG. 24B is a diagram illustrating a secondary battery of an electric bicycle.

The electric bicycle 8700 includes a power storage device 8702. The power storage device 8702 can supply electricity to a motor that assists a rider. The power storage device 8702 is portable, and FIG. 24B illustrates the state where the power storage device 8702 is detached from the bicycle. A plurality of storage batteries 8701 included in the power storage device of one embodiment of the present invention are incorporated in the power storage device 8702, and the remaining battery capacity and the like can be displayed on a display portion 8703. The power storage device 8702 includes a control circuit 8704 capable of charge control or anomaly detection for the secondary battery, which is exemplified in Embodiment 5. The control circuit 8704 is electrically connected to a positive electrode and a negative electrode of the storage battery 8701. The control circuit 8704 preferably includes the second algorithm and the fourth algorithm described in Embodiment 1. The control circuit 8704 may be provided with the small solid-state secondary battery illustrated in FIG. 20A and FIG. 20B. When the small solid-state secondary battery illustrated in FIG. 20A and FIG. 20B is provided in the control circuit 8704, electric power can be supplied to store data in a memory circuit included in the control circuit 8704 for a long time. When the control circuit 8704 is used in combination with the secondary battery including the positive electrode active material 100 obtained in the above embodiment in the positive electrode, the synergy on safety can be obtained. The secondary battery including the positive electrode active material 100 obtained in the above embodiment in the positive electrode and the control circuit 8704 can greatly contribute to elimination of accidents due to secondary batteries, such as fires.

Figure 24C:
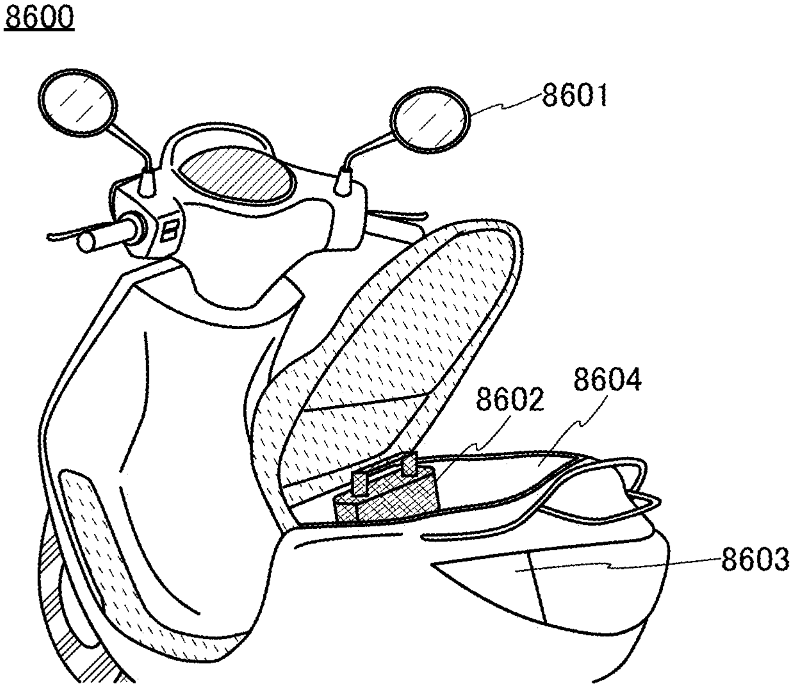
FIG. 24C is a diagram illustrating an electric motorcycle.

FIG. 24C illustrates an example of a motorcycle using the power storage device of one embodiment of the present invention. A motor scooter 8600 illustrated in FIG. 24C includes a power storage device 8602, side mirrors 8601, and indicator lights 8603. The power storage device 8602 can supply electricity to the indicator lights 8603. The power storage device 8602 including a plurality of secondary batteries including a positive electrode using the positive electrode active material 100 obtained in the above embodiment can have high capacity and contribute to a reduction in size.

In the motor scooter 8600 illustrated in FIG. 24C, the power storage device 8602 can be stored in an under-seat storage unit 8604. The power storage device 8602 can be stored in the under-seat storage unit 8604 even with a small size.

The contents in this embodiment can be combined with the contents in the other embodiments as appropriate.

Embodiment 8

In this embodiment, examples of electronic devices each including the secondary battery of one embodiment of the present invention will be described. Examples of the electronic device including the secondary battery include a television device (also referred to as a television or a television receiver), a monitor of a computer and the like, a digital camera, a digital video camera, a digital photo frame, a mobile phone (also referred to as a cellular phone or a mobile phone device), a portable game machine, a portable information terminal, an audio reproducing device, and a large-sized game machine such as a pachinko machine. Examples of the portable information terminal include a laptop personal computer, a tablet terminal, an e-book reader, and a mobile phone.

Figure 25A:
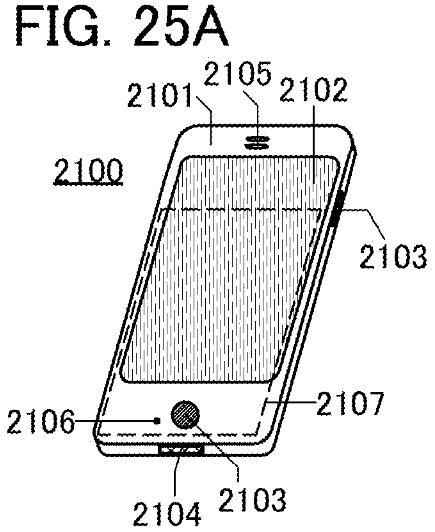
FIG. 25A to FIG. 25D are diagrams illustrating examples of electronic devices.

FIG. 25A illustrates an example of a mobile phone. A mobile phone 2100 includes a housing 2101 in which a display portion 2102 is incorporated, operation buttons 2103, an external connection port 2104, a speaker 2105, a microphone 2106, and the like. The mobile phone 2100 includes a secondary battery 2107. The use of the secondary battery 2107 including a positive electrode using the positive electrode active material 100 described in the above embodiment achieves high capacity and a structure that accommodates space saving due to a reduction in size of the housing.

The mobile phone 2100 is capable of executing a variety of applications such as mobile phone calls, e-mailing, viewing and editing texts, music reproduction, Internet communication, and a computer game.

With the operation button 2103, a variety of functions such as time setting, power on/off, on/off of wireless communication, setting and cancellation of a silent mode, and setting and cancellation of a power saving mode can be performed. For example, the functions of the operation button 2103 can be set freely by the operating system incorporated in the mobile phone 2100.

The mobile phone 2100 can employ near field communication conformable to a communication standard. For example, mutual communication between the mobile phone 2100 and a headset capable of wireless communication enables hands-free calling.

Moreover, the mobile phone 2100 includes the external connection port 2104, and data can be directly transmitted to and received from another information terminal via a connector. In addition, charging can be performed via the external connection port 2104. Note that the charge operation may be performed by wireless power feeding without using the external connection port 2104.

The mobile phone 2100 preferably includes a sensor. As the sensor, a human body sensor such as a fingerprint sensor, a pulse sensor, or a temperature sensor, a touch sensor, a pressure sensitive sensor, or an acceleration sensor is preferably mounted, for example.

Figure 25B:
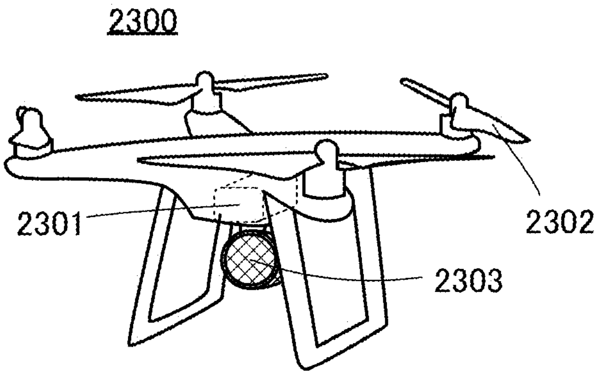

FIG. 25B illustrates an unmanned aircraft 2300 including a plurality of rotors 2302. The unmanned aircraft 2300 is sometimes also referred to as a drone. The unmanned aircraft 2300 includes a secondary battery 2301 of one embodiment of the present invention, a camera 2303, and an antenna (not illustrated). The unmanned aircraft 2300 can be remotely controlled through the antenna. A secondary battery including a positive electrode using the positive electrode active material 100 obtained in the above embodiment has high energy density and a high level of safety, and thus can be used safely for a long time over a long period of time and is preferable as the secondary battery included in the unmanned aircraft 2300.

Figure 25C:
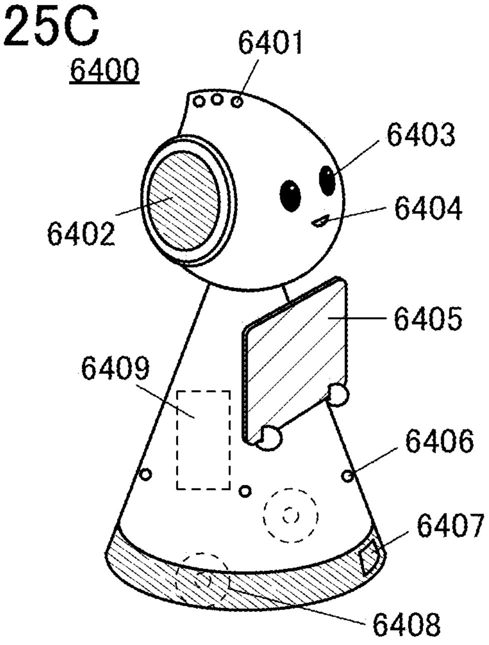

FIG. 25C illustrates an example of a robot. A robot 6400 illustrated in FIG. 25C includes a secondary battery 6409, an illuminance sensor 6401, a microphone 6402, an upper camera 6403, a speaker 6404, a display portion 6405, a lower camera 6406, an obstacle sensor 6407, a moving mechanism 6408, an arithmetic device, and the like.

The microphone 6402 has a function of detecting a speaking voice of a user, an environmental sound, and the like. The speaker 6404 has a function of outputting sound. The robot 6400 can communicate with the user using the microphone 6402 and the speaker 6404.

The display portion 6405 has a function of displaying various kinds of information. The robot 6400 can display information desired by the user on the display portion 6405. The display portion 6405 may be provided with a touch panel. Moreover, the display portion 6405 may be a detachable information terminal, in which case charging and data communication can be performed when the display portion 6405 is set at the home position of the robot 6400.

The upper camera 6403 and the lower camera 6406 each have a function of taking an image of the surroundings of the robot 6400. The obstacle sensor 6407 can detect an obstacle in the direction where the robot 6400 advances with the moving mechanism 6408. The robot 6400 can move safely by recognizing the surroundings with the upper camera 6403, the lower camera 6406, and the obstacle sensor 6407.

The robot 6400 further includes, in its inner region, the secondary battery 6409 of one embodiment of the present invention and a semiconductor device or an electronic component. A secondary battery including a positive electrode using the positive electrode active material 100 obtained in the above embodiment has high energy density and a high level of safety, and thus can be used safely for a long time over a long period of time and is preferable as the secondary battery 6409 included in the robot 6400.

Figure 25D:
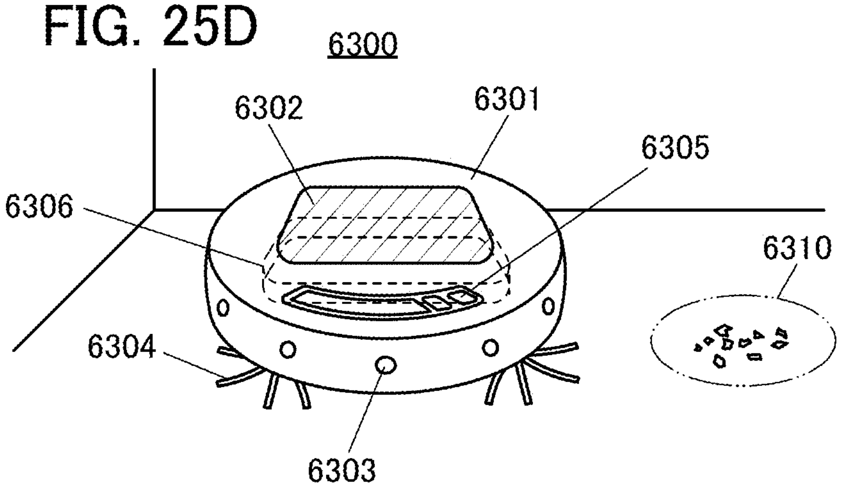

FIG. 25D illustrates an example of a cleaning robot. A cleaning robot 6300 includes a display portion 6302 placed on the top surface of a housing 6301, a plurality of cameras 6303 placed on the side surface of the housing 6301, a brush 6304, operation buttons 6305, a secondary battery 6306, a variety of sensors, and the like. Although not illustrated, the cleaning robot 6300 is provided with a tire, an inlet, and the like. The cleaning robot 6300 is self-propelled, detects dust 6310, and sucks up the dust through the inlet provided on the bottom surface.

For example, the cleaning robot 6300 can determine whether there is an obstacle such as a wall, furniture, or a step by analyzing images taken by the cameras 6303. In the case where the cleaning robot 6300 detects an object, such as a wire, that is likely to be caught in the brush 6304 by image analysis, the rotation of the brush 6304 can be stopped. The cleaning robot 6300 includes, in its inner region, the secondary battery 6306 of one embodiment of the present invention and a semiconductor device or an electronic component. A secondary battery including a positive electrode using the positive electrode active material 100 obtained in the above embodiment has high energy density and a high level of safety, and thus can be used safely for a long time over a long period of time and is preferable as the secondary battery 6306 included in the cleaning robot 6300.

Figure 26A:
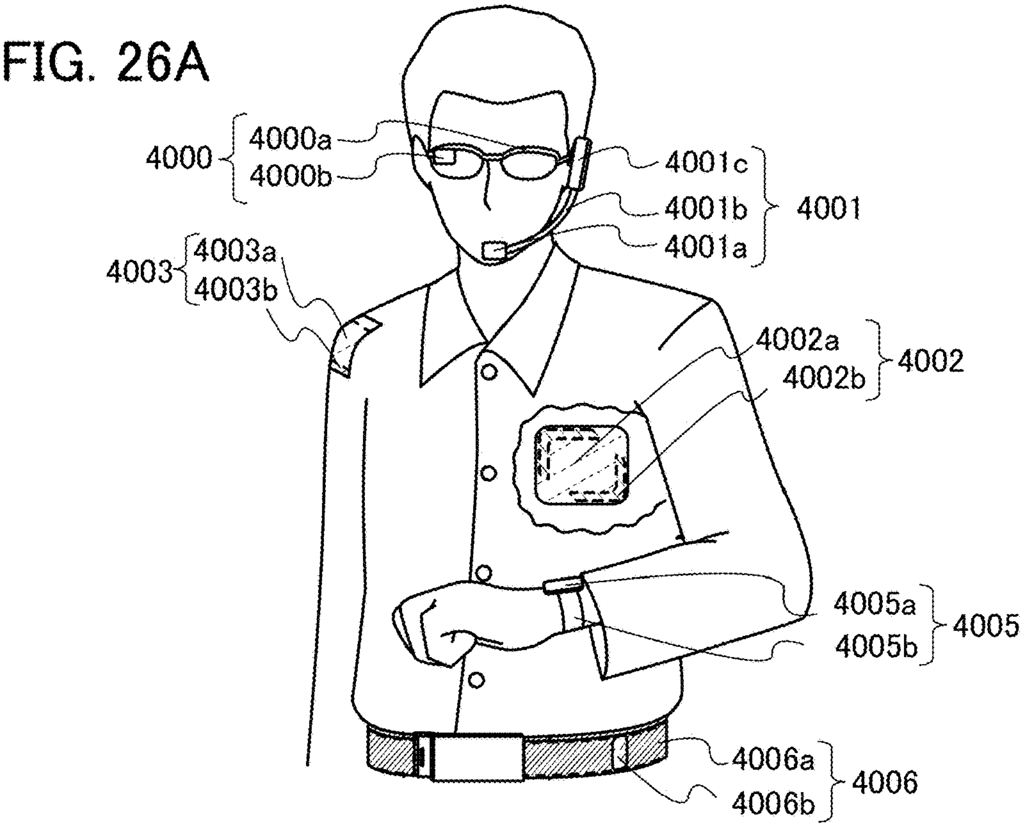
FIG. 26A illustrates examples of wearable devices.

FIG. 26A illustrates examples of wearable devices. A secondary battery is used as a power source of a wearable device. To have improved splash resistance, water resistance, or dust resistance in daily use or outdoor use by a user, a wearable device is desirably capable of being charged with and without a wire whose connector portion for connection is exposed.

For example, the secondary battery of one embodiment of the present invention can be provided in a glasses-type device 4000 illustrated in FIG. 26A. The glasses-type device 4000 includes a frame 4000*a* and a display portion 4000*b*. The secondary battery is provided in a temple portion of the frame 4000*a* having a curved shape, whereby the glasses-type device 4000 can be lightweight, can have a well-balanced weight, and can be used continuously for a long time. A secondary battery including a positive electrode using the positive electrode active material 100 obtained in the above embodiment has high energy density and achieves a structure that accommodates space saving due to a reduction in size of the housing.

The secondary battery of one embodiment of the present invention can be provided in a headset-type device 4001. The headset-type device 4001 includes at least a microphone portion 4001*a*, a flexible pipe 4001*b*, and an earphone portion 4001*c*. The secondary battery can be provided in the flexible pipe 4001*b* or the earphone portion 4001*c*. A secondary battery including a positive electrode using the positive electrode active material 100 obtained in the above embodiment has high energy density and achieves a structure that accommodates space saving due to a reduction in size of the housing.

The secondary battery of one embodiment of the present invention can be provided in a device 4002 that can be attached directly to a body. A secondary battery 4002*b* can be provided in a thin housing 4002*a* of the device 4002. A secondary battery including a positive electrode using the positive electrode active material 100 obtained in the above embodiment has high energy density and achieves a structure that accommodates space saving due to a reduction in size of the housing.

The secondary battery of one embodiment of the present invention can be provided in a device 4003 that can be attached to clothes. A secondary battery 4003*b* can be provided in a thin housing 4003*a* of the device 4003. A secondary battery including a positive electrode using the positive electrode active material 100 obtained in the above embodiment has high energy density and achieves a structure that accommodates space saving due to a reduction in size of the housing.

The secondary battery of one embodiment of the present invention can be provided in a belt-type device 4006. The belt-type device 4006 includes a belt portion 4006*a* and a wireless power feeding and receiving portion 4006*b*, and the secondary battery can be provided in the inner region of the belt portion 4006*a*. A secondary battery including a positive electrode using the positive electrode active material 100 obtained in the above embodiment has high energy density and achieves a structure that accommodates space saving due to a reduction in size of the housing.

The secondary battery of one embodiment of the present invention can be provided in a watch-type device 4005. The watch-type device 4005 includes a display portion 4005*a* and a belt portion 4005*b*, and the secondary battery can be provided in the display portion 4005*a* or the belt portion 4005*b*. A secondary battery including a positive electrode using the positive electrode active material 100 obtained in the above embodiment has high energy density and achieves a structure that accommodates space saving due to a reduction in size of the housing.

The display portion 4005*a* can display various kinds of information such as time and reception information of an e-mail and an incoming call.

The watch-type device 4005 is a wearable device that is wound around an arm directly; thus, a sensor that measures the pulse, the blood pressure, or the like of the user may be incorporated therein. Data on the exercise quantity and health of the user can be stored to be used for health maintenance.

Figure 26B:
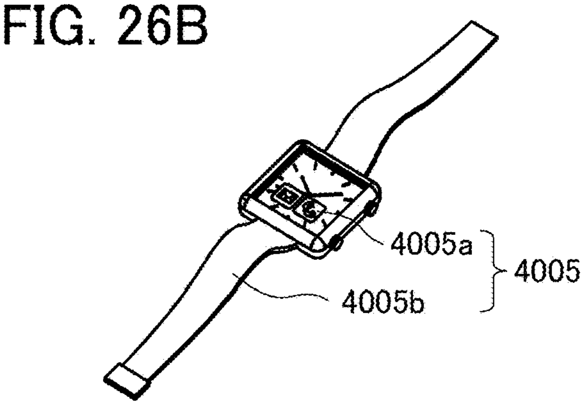
FIG. 26B is a perspective view of a watch-type device.

FIG. 26B illustrates a perspective view of the watch-type device 4005 that is detached from an arm.

Figure 26C:
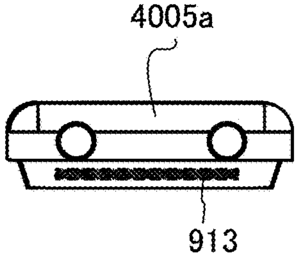
FIG. 26C is a diagram illustrating a side surface of the watch-type device.

FIG. 26C illustrates a side view. FIG. 26C illustrates a state where the secondary battery 913 is incorporated in the inner region. The secondary battery 913 is the secondary battery described in Embodiment 3. The secondary battery 913 is provided to overlap with the display portion 4005*a*, can have high density and high capacity, and is small and lightweight.

Since the secondary battery in the watch-type device 4005 is required to be small and lightweight, the use of the positive electrode active material 100 obtained in the above embodiment in the positive electrode of the secondary battery 913 enables the secondary battery 913 to have high energy density and a small size.

Figure 26D:
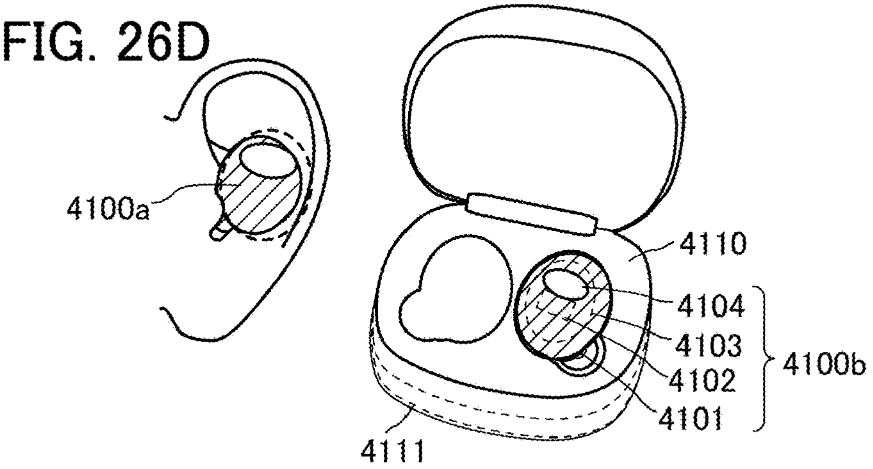
FIG. 26D is a diagram illustrating an example of wireless earphones.

FIG. 26D illustrates an example of wireless earphones. The wireless earphones illustrated here as an example consist of, but not limited to, a pair of main bodies 4100*a* and 4100*b*.

The main bodies 4100a and 4100b each include a driver unit 4101, an antenna 4102, and a secondary battery 4103. A display portion 4104 may also be included. Moreover, a substrate where a circuit such as a wireless IC is provided, a terminal for charging, and the like are preferably included. Furthermore, a microphone may be included.

A case 4110 includes a secondary battery 4111. Moreover, a substrate where a circuit such as a wireless IC or a charge control IC is provided, and a terminal for charging are preferably included. Furthermore, a display portion, a button, and the like may be included.

The main bodies 4100a and 4100b can communicate wirelessly with another electronic device such as a smartphone. Thus, sound data and the like transmitted from another electronic device can be played through the main bodies 4100a and 4100b. When the main bodies 4100a and 4100b include a microphone, sound captured by the microphone is transmitted to another electronic device, and sound data obtained by processing with the electronic device can be transmitted to and played through the main bodies 4100a and 4100b. Hence, the wireless earphones can be used as a translator, for example.

The secondary battery 4103 included in the main body 4100a can be charged by the secondary battery 4111 included in the case 4110. As the secondary battery 4111 and the secondary battery 4103, the coin-type secondary battery or the cylindrical secondary battery of the foregoing embodiment, for example, can be used. A secondary battery including a positive electrode using the positive electrode active material 100 obtained in the above embodiment has a high energy density; thus, with the use of the secondary battery as the secondary battery 4103 and the secondary battery 4111, a structure that accommodates space saving due to a reduction in size of the wireless earphones can be achieved.

The secondary batteries included in the electronic devices illustrated in FIG. 25A to FIG. 25D are each preferably provided with a control portion including the second algorithm and the fourth algorithm described in Embodiment 1. Alternatively, the electronic devices themselves may each include the second algorithm and the fourth algorithm described in Embodiment 1.

This embodiment can be implemented in appropriate combination with the other embodiments.

REFERENCE NUMERALS

1: server device, 2: electronic device, 3: power storage device, 4: control portion, 5: storage battery, 6: coulomb counter, 7: communication network, 11: first data, 12: second data, 21: first algorithm, 22: second algorithm, 23: third algorithm, 24: fourth algorithm, 31: first neural network, 32: second neural network, 33: third neural network, 34: fourth neural network, 61: SOC-OCV characteristic data list, 62: first SOC-OCV characteristic data, 63: second SOC-OCV characteristic data, 71: R value estimated by power storage device, 71a: R value estimated by power storage device one point in time before, 71b: R value estimated by power storage device, 72: FCC estimated by server device

The invention claimed is:

1. A power storage device management system comprising:

an electronic device comprising a power storage device; and a server device, wherein the power storage device comprises a control portion and a storage battery, wherein the server device is configured to create first data utilizing second data transmitted from the control portion and to transmit the first data to the control portion, wherein the control portion is configured to create the second data utilizing the first data and to transmit the second data to the server device, wherein the server device comprises a first algorithm, wherein the control portion comprises a plurality of pieces of State of Charge-Open Circuit Voltage (SOC-OCV) characteristic data of the storage battery and a second algorithm, wherein the server device is configured to create a first SOC-OCV characteristic data utilizing the second data and the first algorithm and to transmit the first data including the first SOC-OCV characteristic data to the control portion, wherein the control portion is configured to select a second SOC-OCV characteristic data that most closely shows a state of the storage battery from of the plurality of pieces of SOC-OCV characteristic data utilizing the second algorithm, and wherein the control portion comprises a coulomb counter configured to measure an accumulated charge amount of the storage battery.

2. The power storage device management system according to claim 1, wherein the electronic device is configured to create third SOC-OCV characteristic data on the basis of the second SOC-OCV characteristic data and an estimated load on the electronic device, and wherein an OCV value at an SOC value of 0% in the third SOC-OCV characteristic data is higher than an OCV value at an SOC value of 0% in the second SOC-OCV characteristic data.

3. The power storage device management system according to claim 1, wherein the first SOC-OCV characteristic data comprises first bit data corresponding to an SOC value and second bit data corresponding to an OCV value, and wherein the number of bits of the first bit data and the number of bits of the second bit data are equal to each other.

4. The power storage device management system according to claim 1, wherein the server device further comprises a third algorithm, wherein the control portion further comprises a fourth algorithm, wherein the first data further comprises a Full Charge Capacity (FCC) value of the storage battery, wherein the second data further comprises an internal resistance (R) value of the storage battery, wherein the server device is configured to estimate the FCC value utilizing the second data and the third algorithm, and wherein the control portion is configured to calculate the R value utilizing the first data and the fourth algorithm.

5. The power storage device management system according to claim 1, wherein the first data comprises a Full Charge Capacity (FCC) value of the storage battery, and wherein every time the accumulated charge amount reaches the FCC value, the accumulated charge amount is reset and the control portion transmits the second data to the server device.

6. A power storage device management system comprising:

an electronic device comprising a power storage device; and a server device, wherein the power storage device comprises a control portion and a storage battery, wherein the server device comprises a first algorithm, wherein the control portion comprises a second algorithm and a plurality of pieces of State of Charge-Open Circuit Voltage (SOC-OCV) characteristic data of the storage battery, wherein the server device is configured to create first SOC-OCV characteristic data utilizing second data transmitted from the control portion and the first algorithm and to transmit first data including the first SOC-OCV characteristic data to the control portion, wherein the control portion is configured to add the first SOC-OCV characteristic data to the plurality of pieces of SOC-OCV characteristic data and to select second SOC-OCV characteristic data that most closely shows a state of the storage battery from the plurality of pieces of SOC-OCV characteristic data utilizing the second algorithm, and wherein the control portion comprises a coulomb counter configured to measure an accumulated charge amount of the storage battery.

7. The power storage device management system according to claim 6, wherein the electronic device is configured to create third SOC-OCV characteristic data on the basis of the second SOC-OCV characteristic data and an estimated load on the electronic device, and wherein an OCV value at an SOC value of 0% in the third SOC-OCV characteristic data is higher than an OCV value at an SOC value of 0% in the second SOC-OCV characteristic data.

8. The power storage device management system according to claim 6, wherein the first SOC-OCV characteristic data comprises first bit data corresponding to an SOC value and second bit data corresponding to an OCV value, and wherein the number of bits of the first bit data and the number of bits of the second bit data are equal to each other.

9. The power storage device management system according to claim 6, wherein the server device further comprises a third algorithm, wherein the control portion further comprises a fourth algorithm, wherein the first data further comprises a Full Charge Capacity (FCC) value of the storage battery, wherein the second data further comprises an internal resistance (R) value of the storage battery, wherein the server device is configured to estimate the FCC value utilizing the second data and the third algorithm, and wherein the control portion is configured to calculate the R value utilizing the first data and the fourth algorithm.

10. The power storage device management system according to claim 6, wherein the first data comprises a Full Charge Capacity (FCC) value of the storage battery, and wherein every time the accumulated charge amount reaches the FCC value, the accumulated charge amount is reset and the control portion transmits the second data to the server device.

* * * * *